(12) United States Patent
Hama

(10) Patent No.: US 8,499,627 B2
(45) Date of Patent: Aug. 6, 2013

(54) POWER GENERATOR, FLUID SENSOR, AND FLUID SENSOR NET

(75) Inventor: Yoshinori Hama, Tokyo (JP)

(73) Assignee: NEC Corporation, Tokyo (JP)

( * ) Notice: Subject to any disclaimer, the term of this patent is extended or adjusted under 35 U.S.C. 154(b) by 247 days.

(21) Appl. No.: 13/132,481

(22) PCT Filed: Dec. 4, 2009

(86) PCT No.: PCT/JP2009/070429
§ 371 (c)(1),
(2), (4) Date: Jun. 2, 2011

(87) PCT Pub. No.: WO2010/064713
PCT Pub. Date: Jun. 10, 2010

(65) Prior Publication Data
US 2011/0252880 A1    Oct. 20, 2011

(30) Foreign Application Priority Data

Dec. 4, 2008  (JP) ................................. 2008-310209

(51) Int. Cl.
*G01F 1/00* (2006.01)
(52) U.S. Cl.
USPC ......................................... 73/170.29; 73/753
(58) Field of Classification Search
None
See application file for complete search history.

(56) References Cited

U.S. PATENT DOCUMENTS

| | | | | |
|---|---|---|---|---|
| 4,264,838 A | * | 4/1981 | Jacobson | 73/504.15 |
| 5,287,033 A | * | 2/1994 | Morton | 310/316.01 |
| 7,443,080 B2 | * | 10/2008 | Yoshioka et al. | 310/328 |
| 7,446,457 B2 | * | 11/2008 | Ikehashi | 310/330 |
| 8,117,912 B2 | * | 2/2012 | Kawakubo et al. | 73/504.03 |

FOREIGN PATENT DOCUMENTS

| | | |
|---|---|---|
| JP | 6-280732 A | 10/1994 |
| JP | 10-103215 A | 4/1998 |
| JP | 2000146641 A | 5/2000 |
| JP | 2001157433 A | 6/2001 |
| JP | 2001275370 A | 10/2001 |
| JP | 2001337173 A | 12/2001 |
| JP | 2002506171 A | 2/2002 |
| JP | 2006132397 A | 5/2006 |
| JP | 2007009833 A | 1/2007 |
| JP | 2007237823 A | 9/2007 |
| JP | 2007323391 A | 12/2007 |
| JP | 2008011669 A | 1/2008 |
| JP | 2008026167 A | 2/2008 |

OTHER PUBLICATIONS

International Search Report for PCT/JP2009/070429 mailed Mar. 9, 2010.

* cited by examiner

*Primary Examiner* — Lisa Caputo
*Assistant Examiner* — Jermaine Jenkins

(57) ABSTRACT

A pressure-receiving cylinder (11) is in a columnar shape extending in the direction of a center axis (O), and having an orthogonal cross section to the center axis (O) that defines a rotationally symmetrical contour. In a piezoelectric ceramic structure (12), piezoelectric ceramic modules are arranged in a rotationally symmetrical manner around the center axis (O), each piezoelectric ceramic module including a pair of piezoelectric ceramic and electrodes connected thereto in the polarization direction. Containers (8, 10) are connected to respective ends of the piezoelectric ceramic module (15) in the polarization direction, and apply a stress corresponding to an external force received by the pressure-receiving cylinder (11) to the pressure-receiving cylinder (11) and the piezoelectric ceramic structure (12). Respective voltages output by the plurality of piezoelectric ceramic modules are added together.

20 Claims, 49 Drawing Sheets

POWER GENERATOR, FLUID SENSOR, AND FLUID SENSOR NET

TECHNICAL FIELD

The present invention relates to a power generator, a fluid sensor, and a fluid sensor net which utilize the flow of the ocean, etc., and more specifically, a power generator, a fluid sensor, and a fluid sensor net which are developed at an ocean bottom or in the ocean in order to measure a marine environment under a fluid environment, e.g., a marine environment.

BACKGROUND ART

Marine environment measuring sensors are sensors that measure a marine environment (see, for example, Patent Literatures 1 and 2). Examples of the measurement target of such marine environment measuring sensors are a seawater temperature, an earthquake motion, and undersea sound.

In order to maintain the measurement by the marine environment measuring sensor for a long time, it is necessary to secure power needed for such measurement for a long time. Hence, it is typical that the marine environment measuring sensor is provided with a primary battery or a secondary battery like a battery. Moreover, power is supplied to the marine environment measuring sensor arranged at an ocean bottom from the station building on the land, i.e., the power equipment provided at the land station in some cases. Furthermore, with a presumption that the marine environment measuring sensor is used near the ocean surface, there is proposed a technology of obtaining power through power generation utilizing ocean waves and solar light (see, for example, Patent Literatures 3, 4, and 5).

Furthermore, various power generating systems utilizing fluid force, such as the flow of a river, an ocean stream, and a tidal stream have been proposed, and some of such systems are already in practical use.

Regarding the power generation scheme of such power generating systems, it is typical to generate power by converting the fluid force into a rotational motion through a water wheel, and by rotating a power generator by a rotary force generated by such a rotational motion. This scheme is widely used as a hydroelectric power generation on the land. Moreover, this scheme is gradually applied to power generating equipment like tidal stream power generators in the case of ocean. For example, there is proposed a configuration for a power generating system which provides a dam on the land and provides a baffle structure or a wing in the ocean, thereby causing the taken fluid to contact a water wheel efficiently (see, for example, Patent Literature 6).

Conversely, a power generating system is examined which directly converts the energy of fluid force into power with a simple construction. In particular, in recent days, there is proposed a power generating scheme of utilizing force received by a column from a fluid.

For example, a column is arranged in the flow of a fluid, the column is caused to generate a Karman vortex, and vibration received by the column itself from the Karman vortex is transferred to a piezoelectric oscillator or an electromagnetic power generating mechanism, thereby obtaining power (see, for example, Patent Literature 7).

Moreover, there is proposed a scheme of obtaining power by transferring vibration produced at a column to a piezoelectric oscillator through a plate or the like (see, for example, Patent Literature 8).

Furthermore, there is proposed a scheme of arranging a cylindrical body in the flow of a fluid, of generating a Karman vortex behind such cylindrical body, and of utilizing a phenomenon that promotes, because of the Karman vortex, vibration of another cylindrical body provided so as to cross the former cylindrical body at right angle (see, for example, Patent Literature 9). According to this scheme, it is possible to generate power efficiently in a wide fluid velocity range.

Conversely, there is proposed a scheme of letting a vibrating plate pasted on a piezoelectric oscillator directly exposed to a fluid, and of causing the vibrating plate to vibrate (see, for example, Patent Literature 10).

As explained above, various power generating systems have been proposed, but currently, under a severe environment like an ocean, a scheme of obtaining a rotational motion from, for example, a tide stream using a water wheel and of generating power by rotating a power generator by such rotational motion is still popular.

Note that there is proposed a technology of measuring a flow rate by causing a column to produce a Karman vortex although it does not generate power (see, for example, Patent Literature 11).

PRIOR ART DOCUMENTS

Patent Literatures

Patent Literature 1: Unexamined Japanese Patent Application KOKAI Publication No. 2007-323391
Patent Literature 2: Unexamined Japanese Patent Application KOKAI Publication No. 2001-337173
Patent Literature 3: National Patent Publication No. 2002-506171
Patent Literature 4: Unexamined Japanese Patent Application KOKAI Publication No. H06-280732
Patent Literature 5: Unexamined Japanese Patent Application KOKAI Publication No. 2007-237823
Patent Literature 6: Unexamined Japanese Patent Application KOKAI Publication No. 2007-9833
Patent Literature 7: Unexamined Japanese Patent Application KOKAI Publication No. 2001-157433
Patent Literature 8: Unexamined Japanese Patent Application KOKAI Publication No. 2006-132397
Patent Literature 9: Unexamined Japanese Patent Application KOKAI Publication No. 2008-11669
Patent Literature 10: Unexamined Japanese Patent Application KOKAI Publication No. 2001-275370
Patent Literature 11: Unexamined Japanese Patent Application KOKAI Publication No. 2000-146641

DISCLOSURE OF INVENTION

Problem to be Solved by the Invention

As explained above, it is typical that the power for the marine environment measuring sensor is prepared by providing a battery in the marine environment measuring sensor before used or is supplied from the land station. A typical example of the marine environment measuring sensor built with a battery is a measuring apparatus attached to a buoy or a pop-up type measuring apparatus that is landed after a predetermined time has elapsed. Such a battery is, however, short-life and is not appropriate for successive measurement for a long time. Moreover, such measuring apparatuses have poor real-time characteristic of measured data.

Power supply from a land station is necessary for a marine environment measuring sensor which is fixed to an ocean bottom and which has a good real-time characteristic. However, when power supply is discontinued because of a defect of power supplying equipment or a cable, such marine environment measuring sensor becomes unavailable. Moreover, because of the need of securing a cable for power feeding from the land station and the withstand voltage of the marine environment measuring sensor, and the increase of the weight of the whole cable because of built-in metal cables for power feeding, such a system has a complex configuration. Hence, it takes a large amount of costs for establishing such a system and maintenance thereof. Moreover, power generation by utilizing ocean waves and solar light is not suitable for the marine environment measuring sensors.

In the case of the power generating system which obtains rotary force through a water wheel and which converts rotary force to power through a power generator, a linkage mechanism is necessary which mechanically links the rotational shaft of the water wheel revealed in water with the rotational shaft of the power generator arranged in a gas in a container or in a liquid like an operation dielectric oil. According to such a linkage mechanism, it is necessary to perform a watertight treatment on respective rotating portions so that the rotational shaft is not worn out or corroded when a fluid with a high corrosivity like ocean water enters in a rotation-sliding surface between the rotational shaft and a support member supporting the rotational shaft. However, such a watertight treatment to the rotating portions is technically very difficult. Because of such a circumstance, power generating system with a linkage mechanism needs maintenance frequently in order to maintain the high reliability for a long time.

In order to perform maintenance on the marine environment measuring sensor arranged at the ocean bottom, a work using a chartered ship like an exclusive ship for a long time is necessary for landing and laying. The chartered ship results in a large amount of labor works and high expenses.

Moreover, in the case of the power generating system that generates power by causing the rotation or vibration of a mechanical structure like a rotational shaft or a vibrating plate to be transferred to a power generating mechanism through electromagnetic induction or a piezoelectric oscillator, the number of parts increases unavoidably, and the whole configuration becomes complex. The more the number of parts increases and the more the whole configuration becomes complex, the more the system becomes weak and expensive. Such a power generating system has a possibility of lowering the power generation efficiency because of a loss through transferring of the rotation or the vibration.

In the case of the power generating system that generates power by causing the rotation or vibration of the mechanical structure like the rotation shaft or the vibration plate to be transferred to the power generating mechanism through electromagnetic induction or the piezoelectric oscillator, the number of parts revealed in a fluid increases unavoidably, so that it is necessary to ensure the anti-corrosiveness (a characteristic of suppressing corrosion) of those parts. Furthermore, the rotational mechanism and the vibrating mechanism are weak against adhesion of foreign object like a living thing, and the output remarkably decreases originating from such adhesion. Still further, as explained above, the configuration that has the rotational mechanism or the vibrating mechanism revealed in the fluid has a difficulty of surely accomplishing a watertight configuration, so that the long-term reliability when used under a marine environment is poor.

In the case of the power generating system that obtains power by transferring vibration produced by a Karman vortex or the like to the piezoelectric oscillator, power generation is difficult if the direction of the fluid is not in the predetermined direction. However, directions of the ocean stream and the sea tide change day by day and hour by hour. Hence, under a circumstance in which the flow direction of the fluid changes every second, it is necessary to provide several power generating systems with different installation directions in order to cope with all flow directions of the fluid.

The factor of generation of a Karman vortex depends on the radius of the column or the flow speed of the fluid. What is more, it is important that the flow of the fluid is steady to some level. Accordingly, if such conditions do not match the factor of generation of a Karman vortex, power generation becomes inefficient.

The present invention has been made in view of the above-explained circumstances, and it is an object of the present invention to provide a power generator, a fluid sensor, and a fluid sensor net which do not need frequent maintenance and bothersome work, are capable of generating power highly efficiently for a long time with simple configuration and high reliability without being affected by the direction of a fluid, and enable long-term and real-time measurement by such power generation.

Means for Solving the Problem

In order to achieve the above object, a power generator according to a first aspect of the present invention comprises: a stress producing member formed in a columnar shape extending in a direction of a predetermined axis, having an outer circumferential side face that defines a contour of an orthogonal cross section to the predetermined axis rotationally symmetrical around the predetermined axis, and including a piezoelectric module structure comprising a plurality of piezoelectric modules arranged around the predetermined axis in a rotationally symmetrical manner, and producing a stress inside the stress producing member originating from a stress variation produced by a fluid around the stress producing member, the plurality of piezoelectric modules each including a pair of piezoelectric element and electrodes connected to both ends of the piezoelectric element in a polarization direction; a suppressing member which is connected to one end of each of the plurality of piezoelectric modules in the polarization direction, and which suppresses a displacement of the stress producing member in order to cause the stress producing member to produce a stress; and an adder that adds voltages output by the plurality of piezoelectric modules, respectively.

A fluid sensor according to a second aspect of the present invention comprises: the power generator of the present invention; and a sensor module that performs sensing in a fluid using power supplied from the power generator.

A fluid sensor net according to a third aspect of the present invention comprises: the power generator of the present invention; and a plurality of fluid sensors that perform sensing in a fluid using power supplied from the power generator.

A fluid sensor net according to a fourth aspect of the present invention comprises the plurality of fluid sensors of the present invention.

Effect of the Invention

According to the present invention, it becomes possible to generate power highly efficiently for a long time with simple configuration and high reliability regardless of the direction of a fluid without a highly-frequent maintenance and a bothersome work, and to carry out long-term and real-time measurement by such power generation.

BEST MODE FOR CARRYING OUT THE INVENTION

Next, an explanation will be given of embodiments of the present invention in detail with reference to the accompanying drawings.

<First Embodiment>

Figure 1:
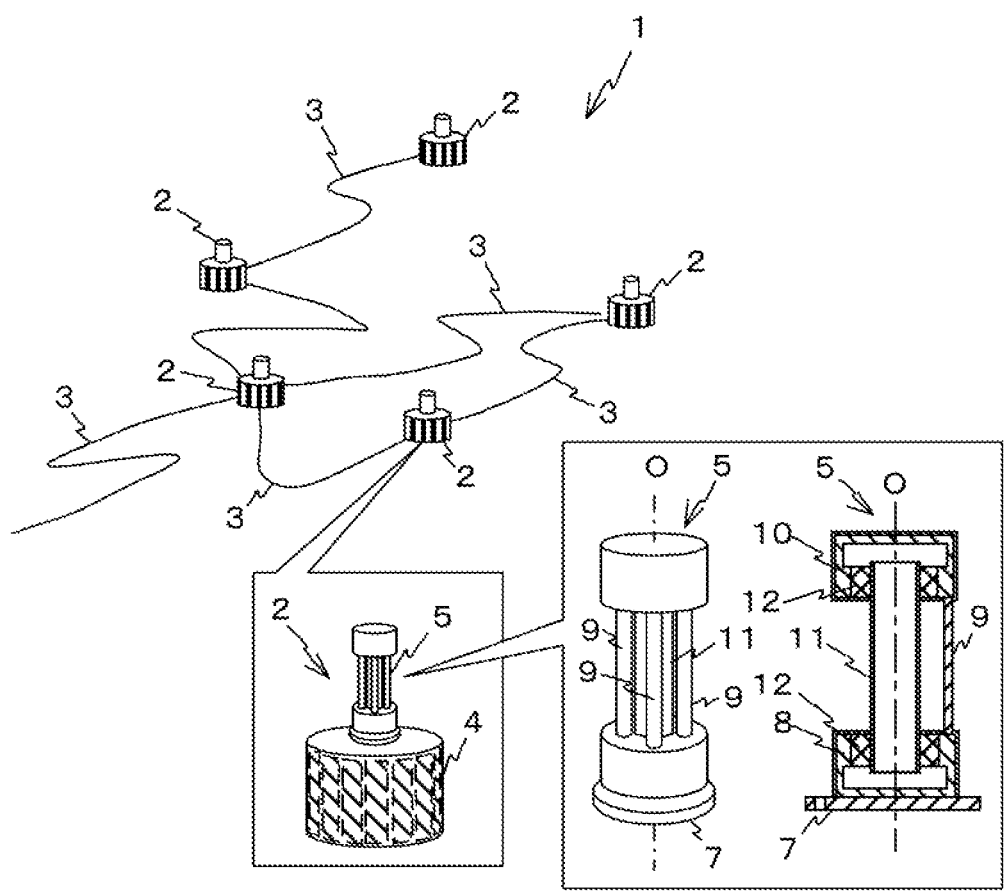
FIG. 1 is a perspective view showing a general configuration of a marine environment measuring sensor group according to a first aspect of the present invention.

A first embodiment of the present invention will be explained at first. FIG. 1 is a perspective view showing a general configuration of a marine-environment-measuring-sensor net 1 that is a fluid sensor net according to the first embodiment of the present invention. As shown in FIG. 1, the marine-environment-measuring-sensor net 1 includes plural marine environment measuring sensors 2 and signal transmitting cables 3. The marine environment measuring sensors 2 are installed at an ocean bottom. Respective marine environment measuring sensors 2 are connected through the signal transmitting cables 3.

The marine environment measuring sensor 2 includes a sensor module 4, and a power generating module 5. The sensor module 4 and the power generating module 5 are joined as a single piece.

Figure 2:
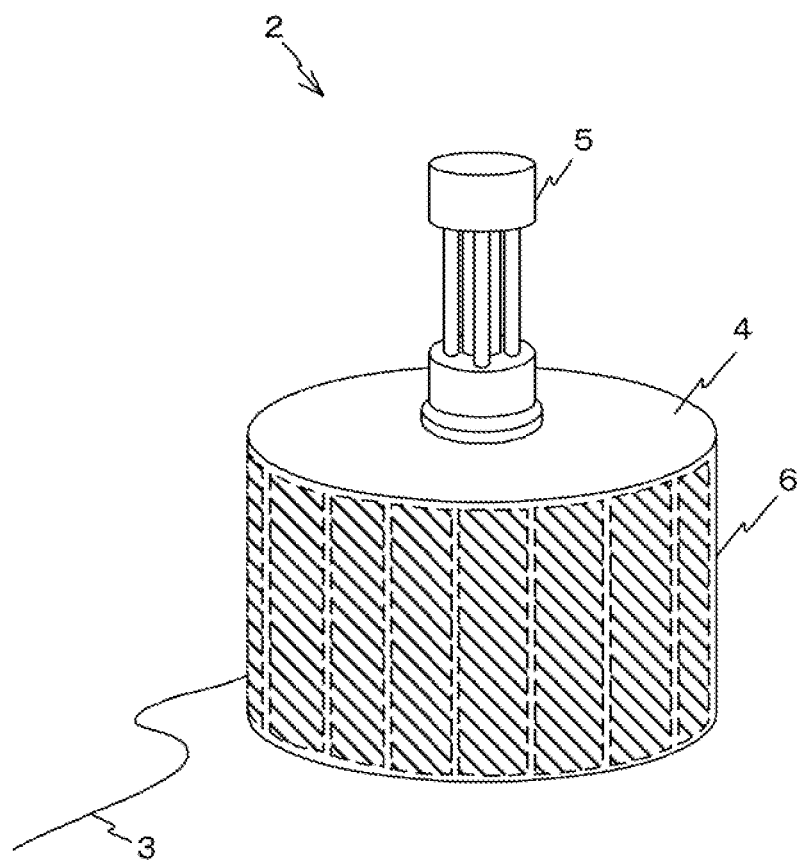
FIG. 2 is a perspective view showing an illustrative configuration of a marine environment measuring sensor.

As shown in FIG. 2, the sensor module 4 is retained in a watertight container 6 in order to maintain the water-tightness. The sensor module 4 measures a target among various measuring information relating to a marine environment, e.g., physicality such as an undersea temperature, the saline concentration of ocean water, undersea sound, the water pressure (pressure) of ocean water, vibration (earthquake motion), and crustal motion (movement of an ocean bottom surface). The sensor module 4 needs power for measurement.

The power generating module 5 generates power by utilizing the flow of a fluid therearound, such as an ocean stream and a tidal stream, and supplies power obtained by power generation to the sensor module 4. The power needed by the sensor module 4 is managed by the power generating module 5 built in each marine environment measuring sensor 2. Accordingly, no power is exchanged between the marine environment measuring sensors 2.

The measuring information measured by the sensor module 4, e.g., the temperature of ocean water, a flow speed, and a saline concentration do not rapidly change together with time. Hence, in general, it is sufficient if such information is collected for each several hours or for each several days. Accordingly, the operation availability of the sensor module 4 can be set to be extremely low, so that the power consumption of the sensor module 4 can be extremely small as a result.

For example, it is presumed that a time necessary for one measurement and a time for transmitting measurement data, i.e., an operating time of the sensor module 4 is one second, and one measurement and one transmitting per day is appropriate. In this case, the actual operation availability of the sensor module 4 is substantially $10^{-5}$. It is also presumed that measurement and transmitting at a time need a power consumption of 100 W. In this case, the requisite power amount for driving the sensor module 4 is 100 Wsec. According to such conditions, if power generation of 1 mW is carried out for each day using the power generating module 5 while the sensor module 4 is not in operation, sufficient power for driving the sensor module 4 can be obtained on the basis of a calculation.

An example of the signal transmitting cable 3 is an optical fiber. The optical fiber employs a simple configuration, so that it is advantageous from the standpoint of cost, etc. Various measurement information measured by the sensor module 4 is transmitted to another marine environment measuring sensor 2 through the signal transmitting cable 3. Each marine environment measuring sensor 2 has a function of adding measurement information locally measured to the measurement information transmitted from another marine environment measuring sensor 2, and transmits such information to the other marine environment measuring sensor 2. Accordingly, the measurement information obtained by each marine environment measuring sensor 2 is collected as single information throughout transmission, and is transmitted as signals to another marine environment measuring sensor 2 with a relay function, a relay point, an observation ship, a buoy, or a land station (all of which are not illustrated in FIG. 1). This function establishes the marine-environment-measuring-sensor net 1. Such transmission is executed using the power supplied from the power generating module 5 as explained in the calculation of power.

The detail of the power generating module 5 will be explained. The power generating module 5 includes an attachment seat 7, a lower container 8, support poles 9, an upper container 10, a pressure-receiving cylinder 11, and a piezoelectric ceramic structure 12.

Figure 3:
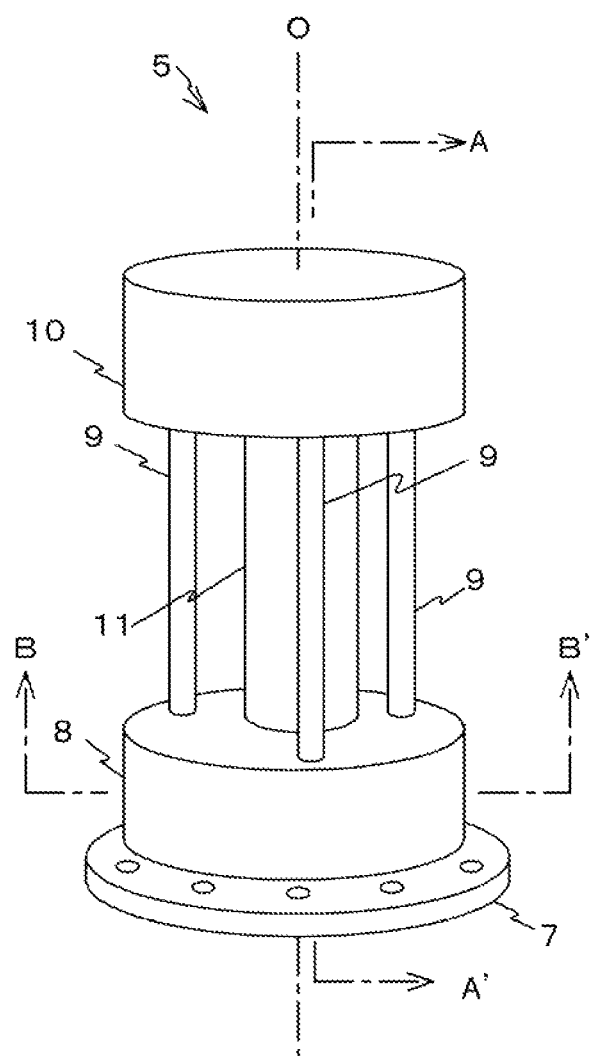
FIG. 3 is a perspective view showing an external appearance of a power generating module.

As shown in FIG. 3 in an enlarged manner, the attachment seat 7 is joined with the sensor module 4 by means of screws, etc. The container 8 is fixed to the attachment seat 7. Three support poles 9 are provided in a standing manner around a center axis O of the power generating module 5 at a clearance of, for example, 120 degrees. Each support pole 9 extends in the vertical direction, and has an upper end supporting the container 10. The support poles 9 are provided in order to fix the container 10 to a predetermined position.

In the embodiment, the attachment seat 7, the container 8, the support poles 9, and the container 10 together configure a suppression portion. These members have respective fixed positions together with the sensor module 4, and are installed so as not to change respective positions due to an ocean stream. These members suppresses respective displacements of the pressure-receiving cylinder 11 and the piezoelectric ceramic structure 12 as will be discussed later so that the pressure-receiving cylinder 11 and the piezoelectric ceramic structure 12 produce stress.

Figure 4:
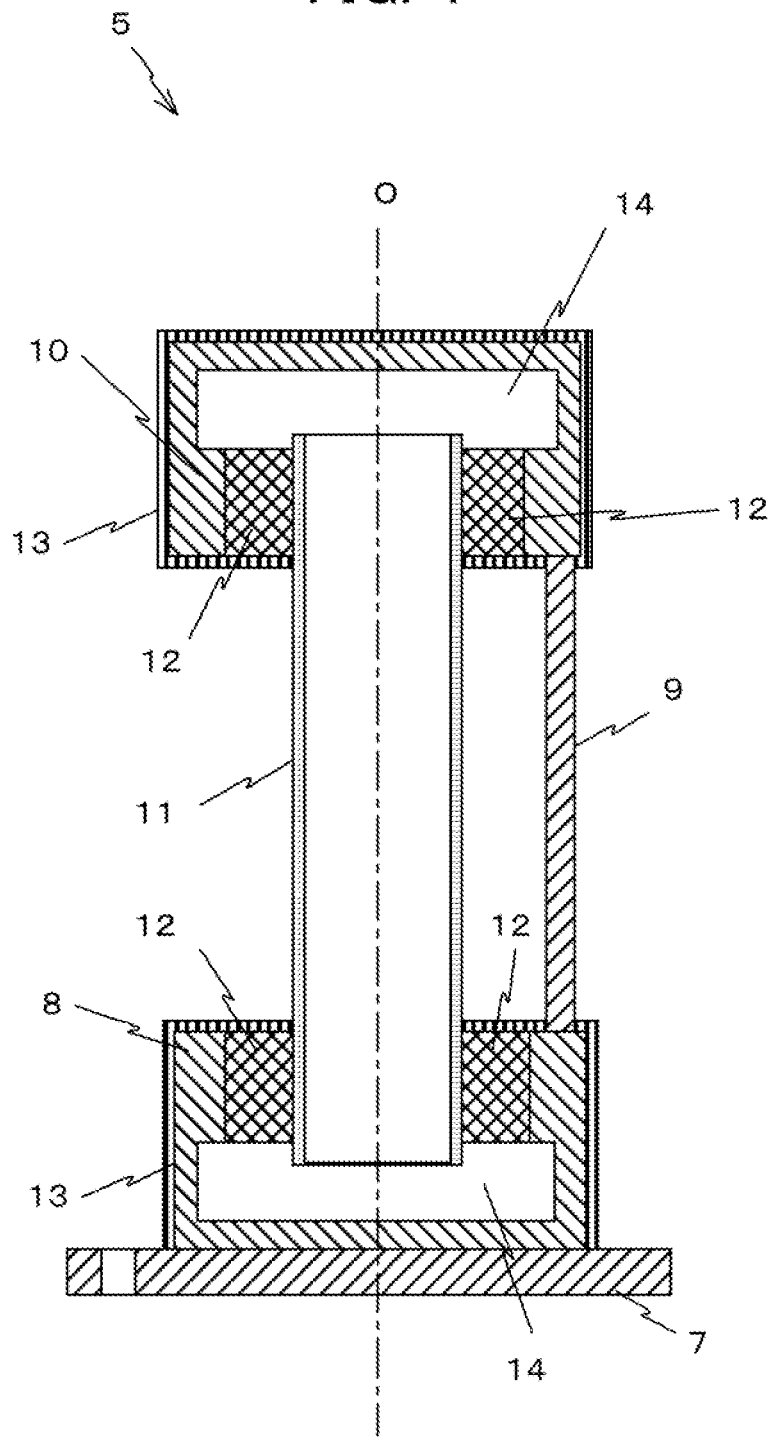
FIG. 4 is a cross-sectional view along a line A-A' of FIG. 3.

The pressure-receiving cylinder 11 that is a pole as a part of a stress producing member is, as shown in FIG. 4 that is a vertical cross-sectional view along a line A-A' including the center axis O, a cylindrical member coaxial with the center axis O and extending in the direction of the center axis O. In other words, the pressure-receiving cylinder 11 has the contour of the orthogonal cross section along the center axis O that is an outer circumferential side face formed as to be rotationally symmetric around the center axis O. The pressure-receiving cylinder 11 has an upper end and a lower end (both ends of the center axis O) joined with the container 8 and the container 10 through the piezoelectric ceramic structure 12.

The outer circumferential side face of the pressure-receiving cylinder 11 is revealed to ocean water. When the pressure-receiving cylinder 11 receives an ocean stream, a Karman vortex, etc., is produced at the downstream side of the pressure-receiving cylinder 11, and the pressure-receiving cylinder 11 receives a vibration force in a direction orthogonal to the flow of ocean stream by the Karman vortex, etc. By receiving this vibration force and a reaction force from the containers 8 and 10, etc., the pressure-receiving cylinder 11 and the piezoelectric ceramic structure 12 produce a repeated stress. Producing of the repeated stress allows the piezoelectric ceramic structure 12 to generate a voltage.

Respective surroundings of the containers 8 and 10 are covered by waterproof covers 13 that insulate the piezoelectric ceramic structure 12 from ocean water. The waterproof covers 13 are formed by, for example, molding a synthesis resin like rubber. The waterproof covers 13 can be provided so as to cover only portions of the piezoelectric ceramic structure 12 as long as insulation of the piezoelectric ceramic structure 12 from ocean water is ensured. When the containers 8 and 10 and the pressure-receiving cylinder 11 are formed of corrosive resistant materials, it is not necessary to cover the whole power generating module 5 by the waterproof cover 13 like the present embodiment.

The pressure-receiving cylinder 11 and the containers 8 and 10 have hollows 14. The hollows 14 may be filled with a gas or the like, or may be filled with an insulating liquid in order to withstand the water pressure of a deep depth as long as the reduction of the conversion efficiency to power is retained within an allowable range. When the insulating liquid is filled and the pressure inside the hollows 14 is set to be a high pressure, the pressure difference between the exterior of the pressure-receiving cylinder 11 and the containers 8 and 10 and the interior thereof can be reduced, thereby enhancing the device strength.

The water-tightness of the pressure-receiving cylinder 11 and the containers 8 and 10 depends on the allowable stress to the containers 8 and 10 and the pressure-receiving cylinder 11 and the joining strength of the piezoelectric ceramic structure 12 to the containers 8 and 10 and the pressure-receiving cylinder 11. Hence, it is necessary to select the materials of the containers 8 and 10 and the pressure-receiving cylinder 11, the thicknesses thereof, the height and thickness of the piezoelectric ceramic structure 12, and the joining strength of the piezoelectric ceramic structure 12 to the containers 8 and 10 and the pressure-receiving cylinder 11 so that a necessary water-tightness is satisfied.

Figure 5:
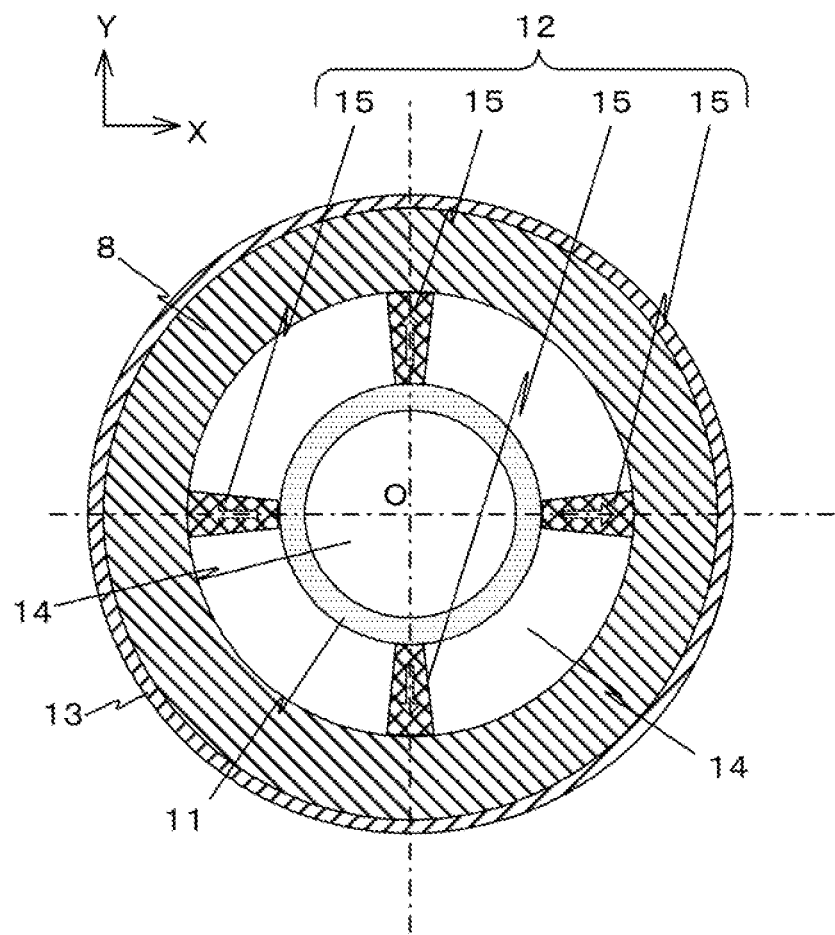
FIG. 5 is a cross-sectional view along a line B-B' of FIG. 3.

A detailed explanation will be given of the piezoelectric ceramic structure 12. FIG. 5 shows a cross-sectional view along a B-B' line of FIG. 3 for explaining the piezoelectric ceramic structure 12. In FIG. 5, the horizontal direction of the figure is taken as an X axis, the vertical direction of the figure is taken as a Y axis, and the horizontal direction and the vertical direction are defined as +X direction, and +Y direction, respectively.

As shown in FIG. 5, the piezoelectric ceramic structure 12 includes four piezoelectric ceramic modules 15. Two piezoelectric ceramic modules 15 are arranged side by side in the X axis direction around the center axis O so as to face with each other, and another two piezoelectric ceramic modules are arranged side by side in the Y axis direction in the same manner. That is, the piezoelectric ceramic modules 15 arranged side by side in the X axis direction configure a pair of piezoelectric ceramic modules, and the piezoelectric ceramic modules 15 arranged side by side in the Y axis direction configure a pair of piezoelectric ceramic modules. In other words, in the present embodiment, the four piezoelectric ceramic modules 15 are arranged in a rotational symmetry manner at four locations which is ¼ of the whole around the center axis O.

In FIG. 5, the polarization direction of each piezoelectric ceramic module 15 is indicated by an arrow. As shown in FIG. 5, the polarization direction of the piezoelectric ceramic module 15 provided at +X side is +X direction, and the polarization direction of the piezoelectric ceramic module 15 provided at −X side is −X direction. Moreover, the polarization direction of the piezoelectric ceramic module 15 provided at +Y side is +Y direction, and the polarization direction of the piezoelectric ceramic module 15 provided at −Y side is −Y direction. That is, the polarization direction of each piezoelectric ceramic module 15 is along the radial direction around the center axis O, and in the present embodiment, is directed outwardly of the radial direction. Respective polarization directions may be directed inwardly of the radial direction.

Figure 6:
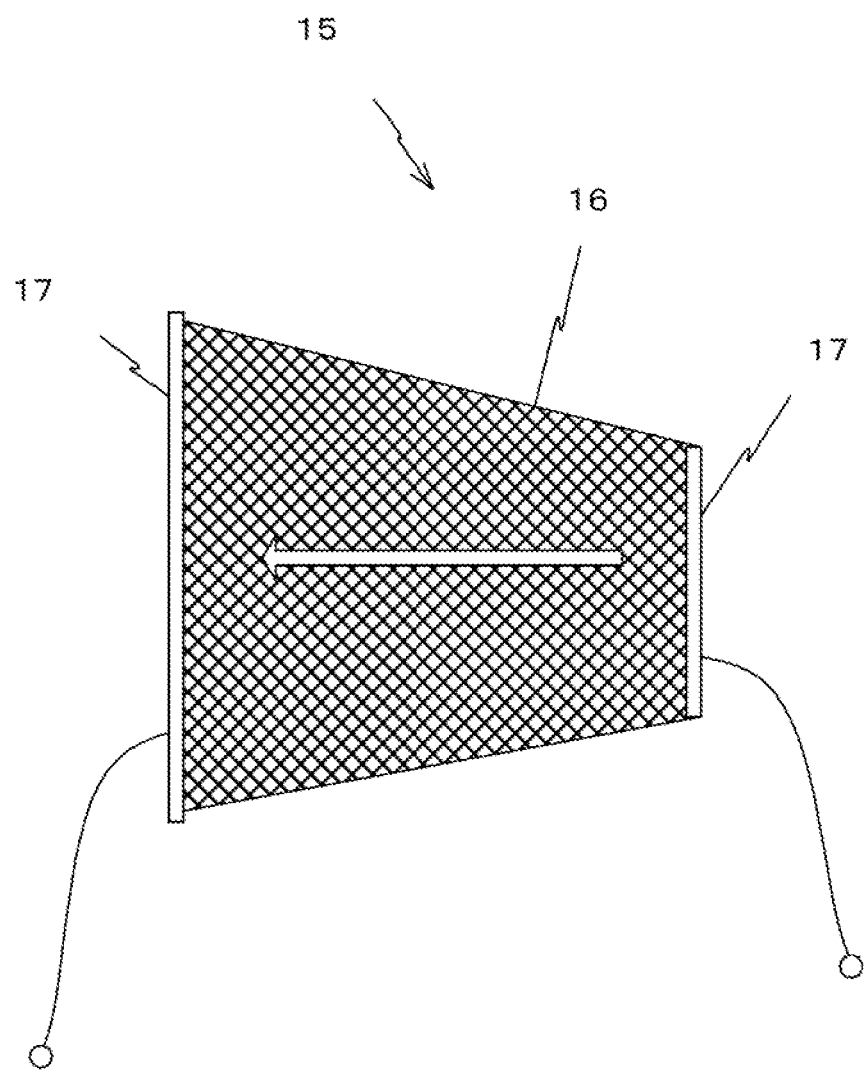
FIG. 6 is a diagram showing an illustrative piezoelectric ceramic module.

The piezoelectric element (piezoelectric ceramic) of each piezoelectric ceramic module 15 is a trapezoidal single piezoelectric ceramic 16 as shown in FIG. 6. Both ends of the piezoelectric ceramic 16 in the polarization direction are connected to respective electrodes 17. That is, the piezoelectric ceramic 16 and both electrodes 17 at both ends in the polarization direction configure the piezoelectric ceramic module 15. A voltage generated by the piezoelectric ceramic 16 is output across both electrodes 17.

In the present embodiment, the pressure-receiving cylinder 11 and the piezoelectric module structure 12 configure the stress producing member. Respective one ends of the piezoelectric ceramic modules 15 configuring the piezoelectric module structure 12 in the polarization directions are connected to the outer circumferential side face of the pressure-receiving cylinder 11 in the vicinity of both ends of the center axis O. Moreover, respective another ends of the piezoelectric ceramic modules 15 are connected to the inner circumferential side faces of the containers 8 and 10 covering both ends of the center axis O of the pressure-receiving cylinder 11. According to this configuration, the containers 8 and 10 restrict the displacement of stress of the pressure-receiving cylinder 11 and the piezoelectric ceramic structure 12 inwardly of the radial direction around the center axis O.

Figure 7:
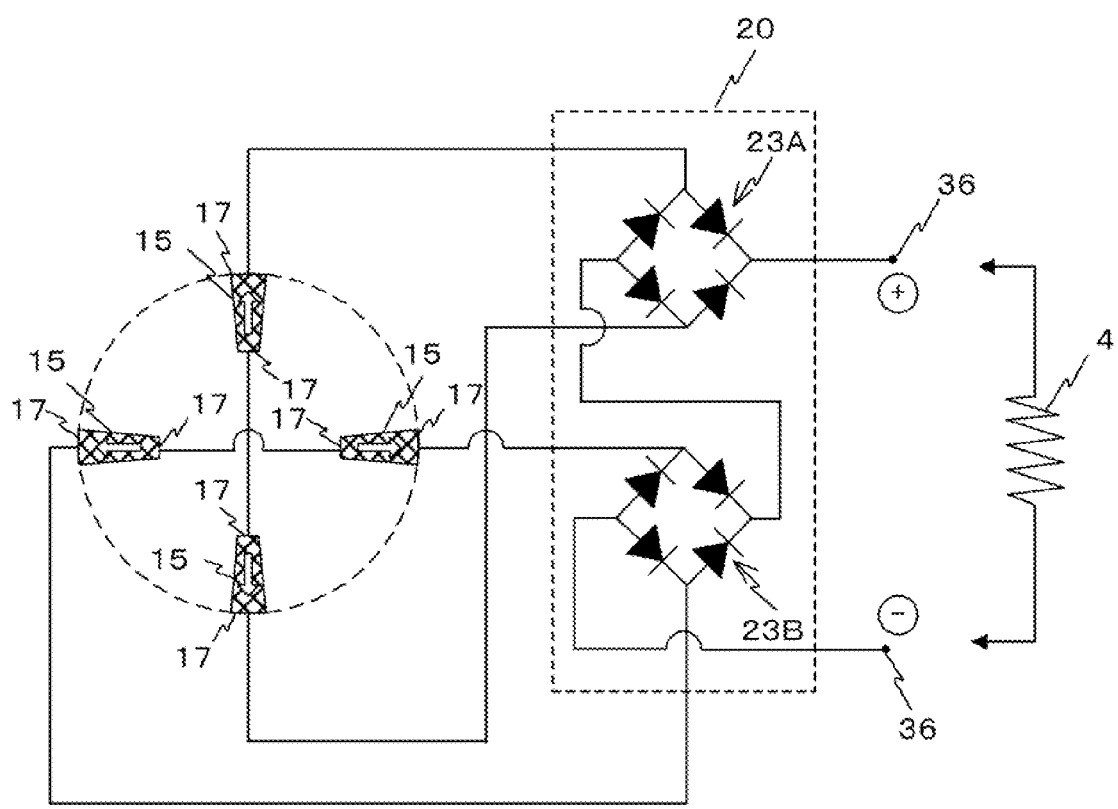
FIG. 7 is a circuit diagram of the power generating module.

As shown in FIG. 7, the pair of piezoelectric ceramic modules 15 arranged side by side in the X axis direction have respective electrodes 17 inwardly of the radial direction (i.e., both electrodes opposite to the polarization direction) connected together. Moreover, the pair of piezoelectric ceramic modules 15 arranged side by side in the Y axis direction have respective electrodes 17 inwardly of the radial direction (i.e., both electrodes opposite to the polarization direction) connected together. As explained above, according to the present embodiment, the coaxial two piezoelectric ceramic modules 15 are connected in a cascade connection manner.

The electrode 17 of each piezoelectric ceramic module 15 outwardly of the radial direction is connected to a power averaging unit 20 that serves as an adder. The power averaging unit 20 includes two rectifier circuits 23A and 23B.

The rectifier circuit 23A is connected to the electrode 17 of the piezoelectric ceramic module 15 arranged side by side in the Y axis direction, the electrode being outwardly of the radial direction (the polarization direction side). Hence, a voltage generated across both electrodes of the pair of piezoelectric ceramic modules 15 arranged side by side in the Y axis direction and connected in a cascade connection manner is input into the rectifier circuit 23A. Conversely, the rectifier circuit 23B is connected to the electrode 17 of the piezoelectric ceramic module 15 arranged side by side in the X axis direction, the electrode being outwardly of the radial direction (opposite to the polarization direction side). Hence, a voltage generated across both terminals of the pair of piezoelectric ceramic modules 15 arranged side by side in the X axis direction and connected in a cascade connection manner is input into the rectifier circuit 23B.

The rectifier circuits 23A and 23B are further connected together in a cascade connection manner. Respective voltages input into the rectifier circuits 23A and 23B are subjected to full-wave rectification by the rectifier circuits 23A and 23B so that the respective polarities become in the same direction. The output voltage by the power averaging unit 20 is a voltage across the first and second stages that are the rectifier circuits 23A and 23B connected in a cascade connection manner. The voltage output by the power averaging unit 20 is applied to load terminals 36. That is, the power averaging unit 20 adds all voltages output by plural piezoelectric ceramic modules 15 and outputs the sum.

The voltage output by the power averaging unit 20 and applied to the load terminals 36 always has the same polarity. That is, regardless of the direction of stress produced at each piezoelectric ceramic module 15, the power averaging unit 20 has a circuit configuration that makes the polarity of a voltage applied to the load terminals 36 always same.

For example, the sensor module 4 is connected across the load terminals 36. In FIG. 7, the sensor module 4 is expressed as a resistor. The load terminals 36 may be connected to a non-illustrated secondary battery or capacitor. By employing such a configuration, when a change in a tidal stream together with time is expected or when the sensor module 4 is not in operation, the power output by the power averaging unit 20 can be primarily stored in the non-illustrated secondary battery or capacitor and the stored power can be supplied to the sensor module 4 as needed.

Next, an explanation will be given of an operation of the power generating module 5 according to the present embodiment.

First, an explanation will be given of a case in which the flow direction of the ocean stream is in the X axis direction or in the Y axis direction.

Figure 8:
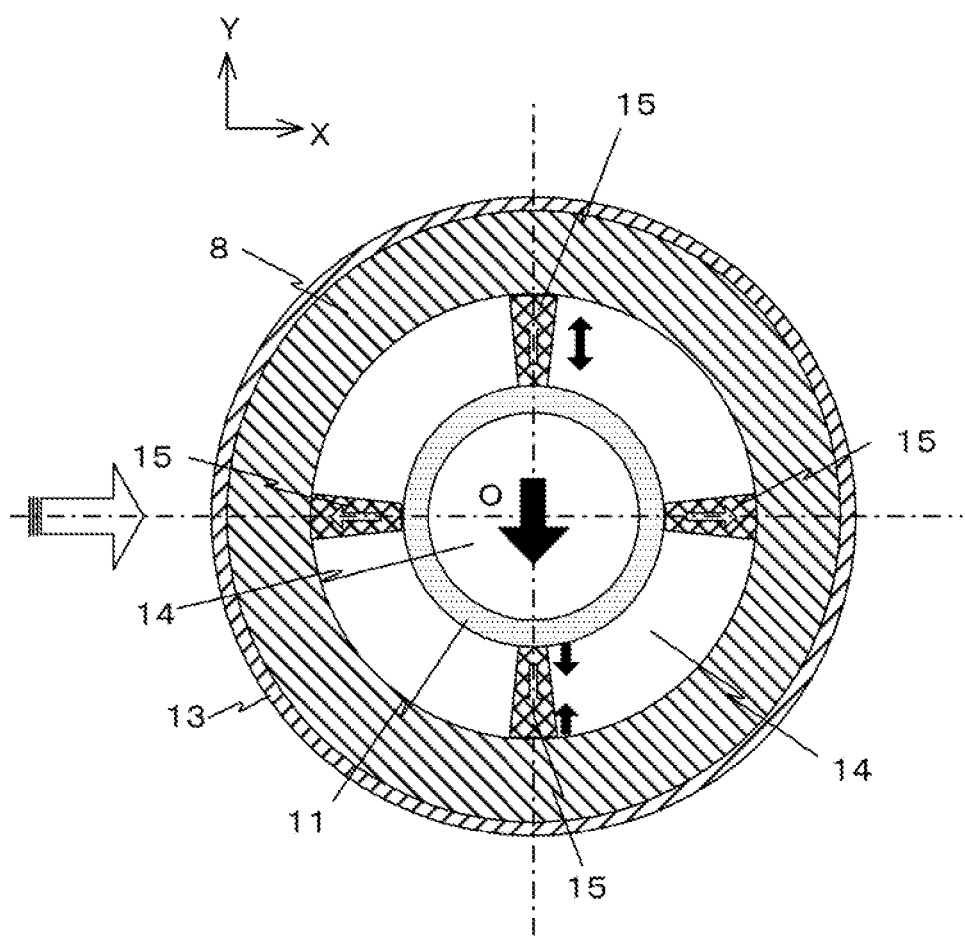
FIG. 8 is a diagram showing an instant at which a stress in −Y direction is produced with the flow of ocean stream being in +X direction.

When the flow direction of the ocean stream is in +X direction, an external force which causes the pressure-receiving cylinder 11 to vibrate in the direction orthogonal to the flow, i.e., the Y axis direction due to a Karman vortex is applied to the pressure-receiving cylinder. In this case, in a given instant, as shown in FIG. 8, an external force in −Y direction is applied to the pressure-receiving cylinder 11. Because of this external force and a reaction force from the container 8, a tensile stress is produced at the piezoelectric ceramic module 15 at +Y side, and a compression stress is produced at the piezoelectric ceramic module 15 at −Y side.

Figure 9:
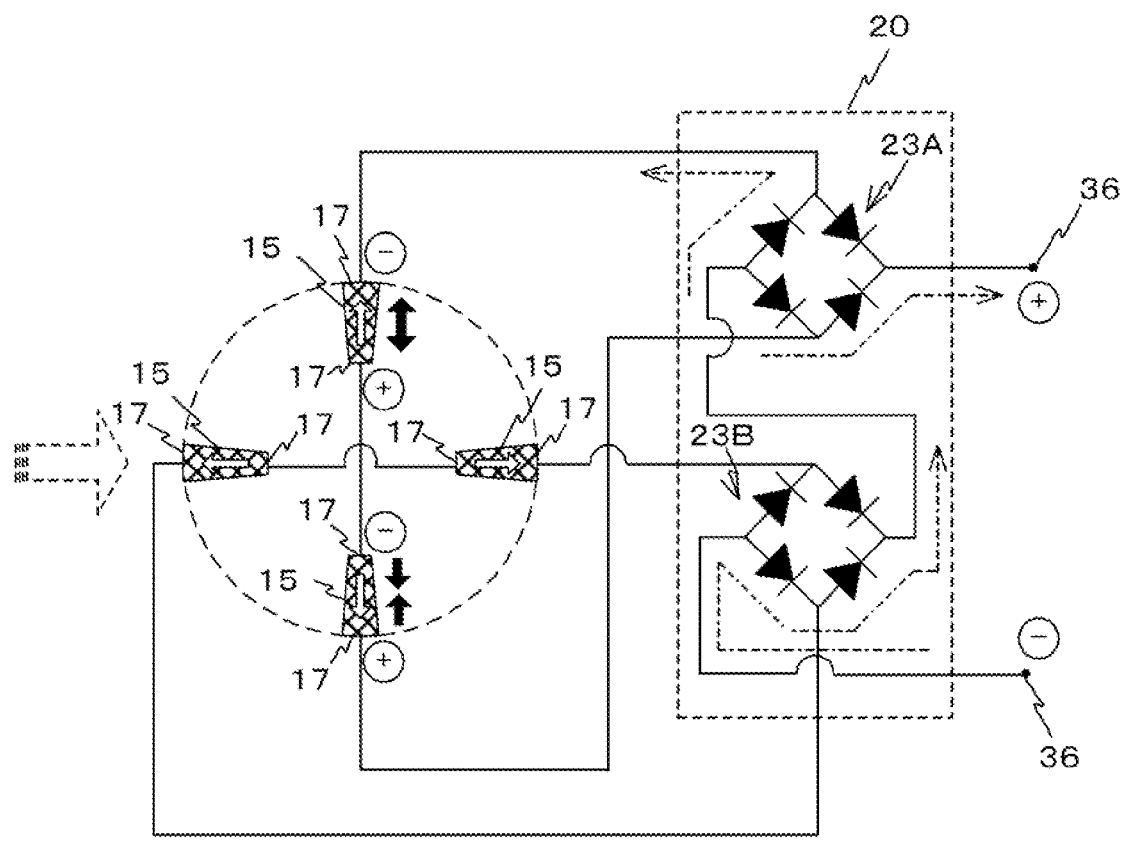
FIG. 9 is a diagram for explaining an operation of the power generating module in the instant shown in FIG. 8.

At this time, as shown in FIG. 9, the piezoelectric ceramic modules 15 arranged side by side in the Y axis direction generate voltages, respectively, because of piezoelectric effects. More specifically, regarding the piezoelectric ceramic module 15 at +Y side, a voltage is generated so that the polarity of the inward electrode 17 becomes positive and the polarity of the outward electrode 17 becomes negative. Regarding the piezoelectric ceramic module 15 at −Y side, a voltage is generated so that the polarity of the outward electrode 17 becomes positive and the polarity of the inward electrode 17 becomes negative. Such voltages generated by the piezoelectric ceramic modules 15 arranged side by side in the Y axis direction allow currents indicated by arrows to flow through the rectifier circuits 23A and 23B, and a voltage is applied across the load terminals 36. That is, the voltage generated across both ends of the pair of piezoelectric ceramic modules 15 arranged side by side in the Y axis direction is applied to the load terminals 36 through the power averaging unit 20.

Conversely, no stress is produced in the X axis direction, i.e., the flow direction of the ocean stream, so that no voltage is generated across the piezoelectric ceramic modules 15 arranged side by side in the X axis direction. Accordingly, no potential difference is generated between connected portions of those piezoelectric ceramic modules 15 to the electrodes 17, and the potential remains same.

Figure 10:
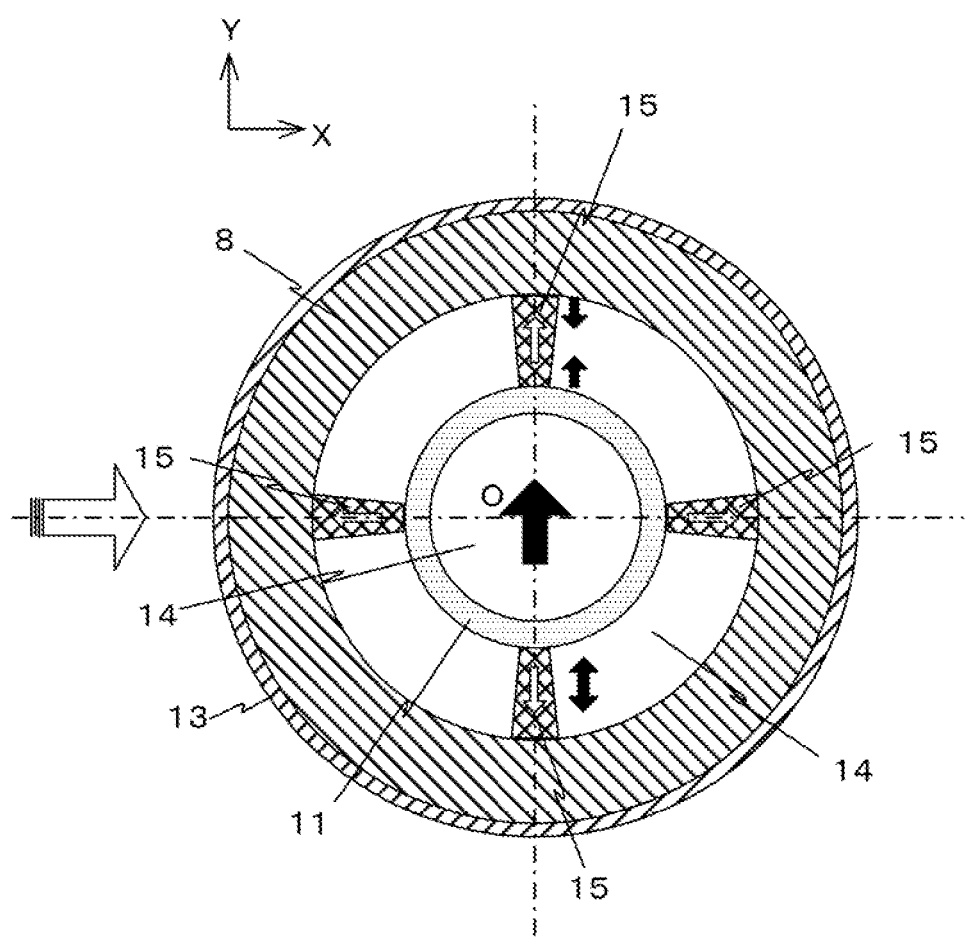
FIG. 10 is a diagram showing an instant at which a stress in +Y direction is produced with the flow of ocean stream being in +X direction.

When a little time advances from the condition shown in FIG. 8, as shown in FIG. 10, an external force in +Y direction is applied to the pressure-receiving cylinder 11. This external force produces a tensile stress at the piezoelectric ceramic module 15 at −Y side, and a compression stress at the piezoelectric ceramic module 15 at +Y side.

Figure 11:
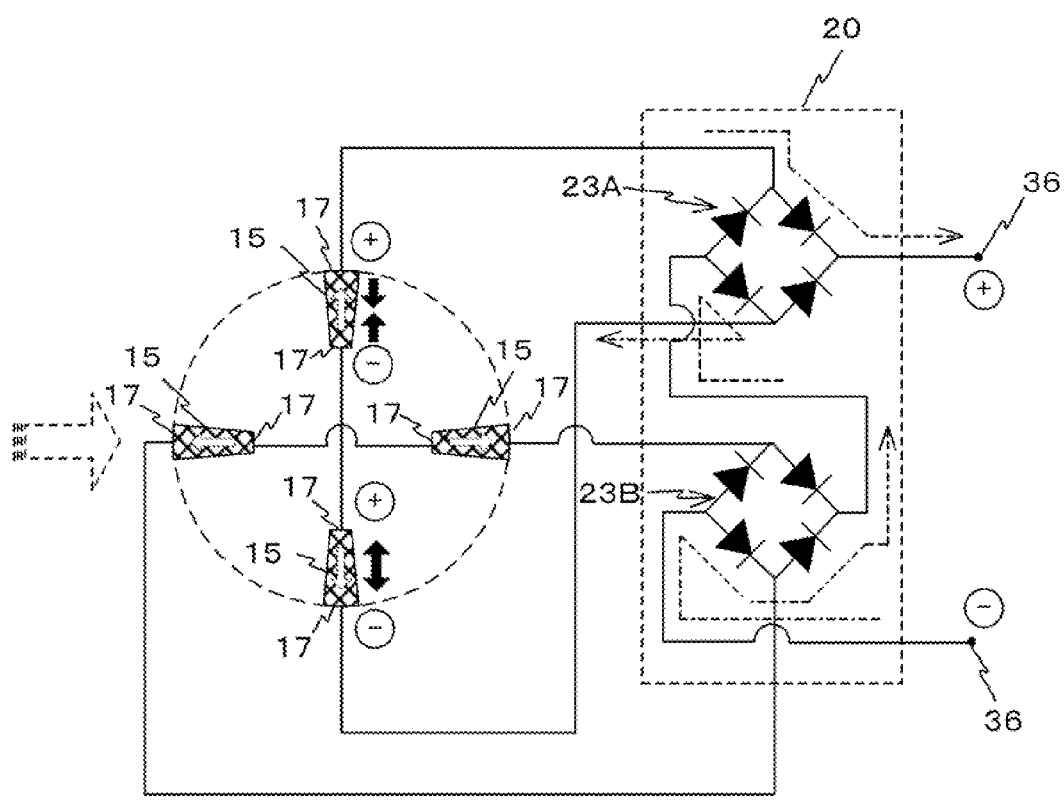
FIG. 11 is a diagram for explaining an operation of the power generating module in the instant shown in FIG. 10.

At this time, as shown in FIG. 11, the piezoelectric ceramic modules 15 arranged side by side in the Y axis direction generate voltages because of piezoelectric effects. More specifically, regarding the piezoelectric ceramic module 15 at −Y side, a voltage is generated so that the polarity of the inward electrode 17 becomes positive. Regarding the piezoelectric ceramic module 15 at +Y side, a voltage is generated so that the polarity of the outward electrode 17 becomes positive. Such voltages generated by the piezoelectric ceramic modules 15 arranged side by side in the Y axis direction cause currents indicated by arrows to flow through the rectifier circuits 23A and 23B, and a voltage is applied across the load terminals 36. That is, a voltage generated across both ends of the pair of piezoelectric ceramic modules 15 arranged side by side in the Y axis direction is applied to the load terminals 36 through the power averaging unit 20.

Conversely, no stress is produced in the X axis direction, i.e., the flow direction of the ocean stream, so that no voltage is generated across the piezoelectric ceramic modules 15 arranged side by side in the X axis direction. Accordingly, no potential difference is generated between connected portions of those piezoelectric ceramic modules 15 to the electrodes 17, and the potential remains same.

As explained above, when the flow direction of the ocean stream is in +X direction, the condition shown in FIG. 8 and the condition FIG. 10 are alternately repeated, and because of an external force in +Y direction or in −Y direction repeatedly applied to the pressure-receiving cylinder 11 by the Karman vortex produced at the downstream side of the pressure-receiving cylinder 1, tensile stresses or compression stresses are repeatedly produced at the piezoelectric ceramic modules 15 arranged side by side in the Y axis direction. As a result, a voltage with a reverse polarity is repeatedly generated between the piezoelectric ceramic modules 15 arranged side by side in the Y axis direction. Even if a voltage with a reverse polarity is generated repeatedly, because of the rectification actions by the rectifier circuits 23A and 23B, the polarity of the voltage applied across the load terminals 36 becomes always same.

When the ocean stream flows in −X direction, the vibration direction of the pressure-receiving cylinder 11 is in the Y axis direction, so that like the case in which the ocean stream flows in +X direction as explained above, a voltage with a polarity always same is applied across the load terminals 36.

Figure 12:
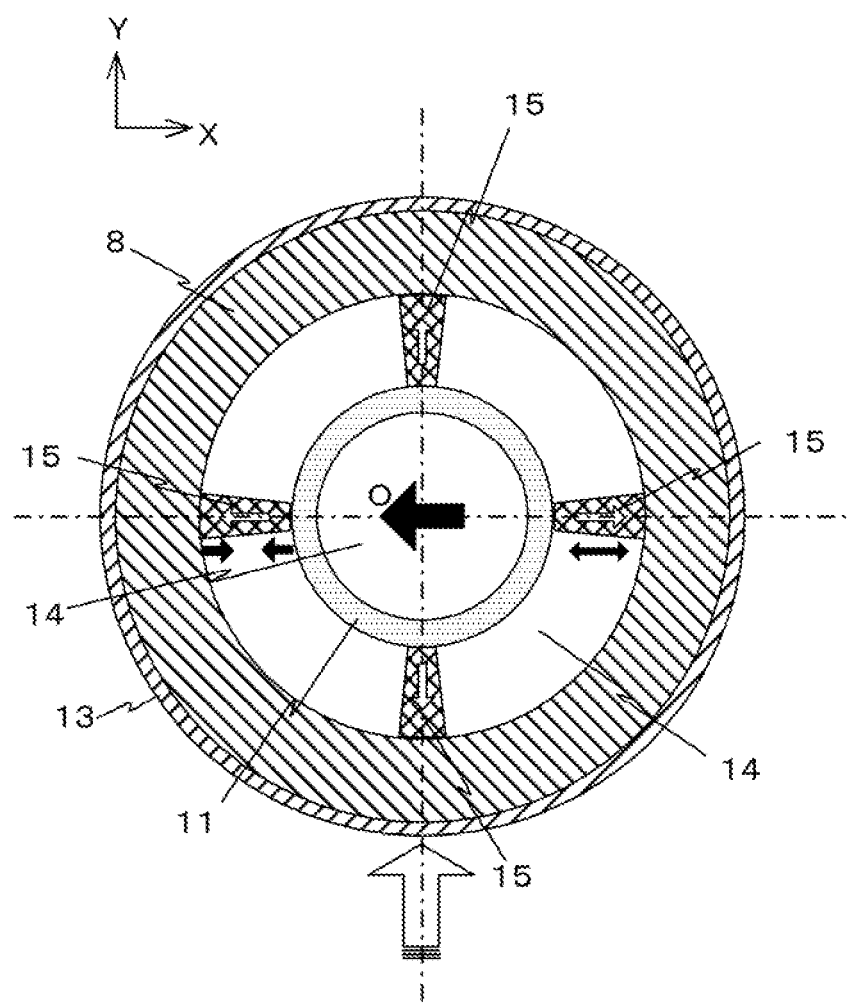
FIG. 12 is a diagram showing an instant at which a stress in −X direction is produced with the flow of ocean stream being in +Y direction.

When the flow of the ocean stream becomes in +Y direction, an external force which causes the pressure-receiving cylinder 11 to vibrate in the direction orthogonal to the flow, i.e., the X axis direction by a Karman vortex is applied to the pressure-receiving cylinder. In this case, in a given instant, as shown in FIG. 12, a stress in −X direction is applied to the pressure-receiving cylinder 11. Because of this external force and a reaction force from the container 8, a tensile stress is generated by the piezoelectric ceramic module 15 at +X side, and a compression stress is generated by the piezoelectric ceramic module 15 at −X side.

Figure 13:
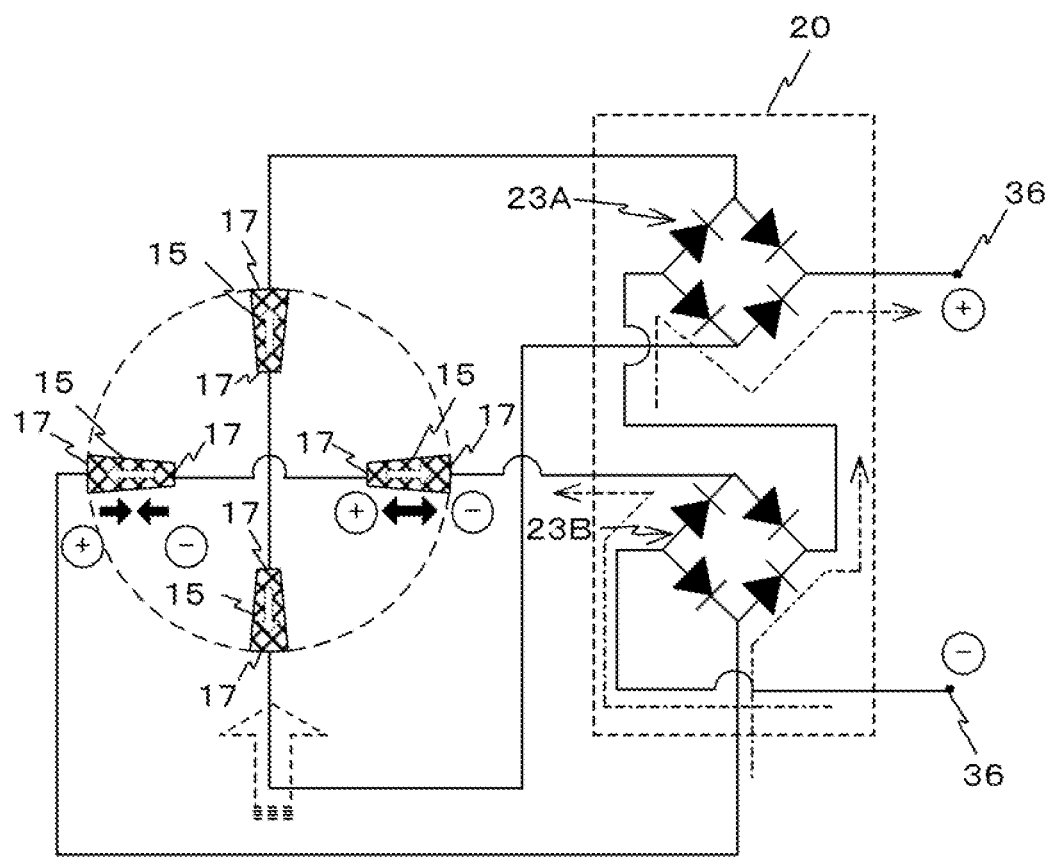
FIG. 13 is a diagram for explaining an operation of the power generating module in the instant shown in FIG. 12.

At this time, as shown in FIG. 13, a voltage is generated across the piezoelectric ceramic modules 15 arranged side by side in the X axis direction because of piezoelectric effects. Such voltages generated by the piezoelectric ceramic modules 15 arranged side by side in the X axis direction cause currents indicated by arrows to flow through the rectifier circuits 23A and 23B, and a voltage is applied across the load terminals 36. That is, the voltage generated across both ends of the pair of piezoelectric ceramic modules 15 arranged in the X axis direction is applied to the load terminals 36 through the power averaging unit 20.

Conversely, no stress is produced in the Y axis direction, i.e., the flow direction of the ocean stream, so that no voltage is generated across the piezoelectric ceramic modules 15 arranged side by side in the Y axis direction. Accordingly, no potential difference is generated between connected portions of those piezoelectric ceramic modules 15 to the electrodes 17, and the potential remains same.

When a little time advances from the condition shown in FIG. 12, an external force in +X direction is applied to the pressure-receiving cylinder 11. This external force produces a compression stress at the piezoelectric ceramic module 15 at +X side, and a tensile stress at the piezoelectric ceramic module 15 at −X side. As a result, the piezoelectric ceramic modules 15 arranged side by side in the X axis direction generate voltages, respectively by piezoelectric effects, and currents originating from such voltages are subjected to rectification by the rectifier circuits 23A and 23B, and a voltage is applied across the load terminals 36.

In this case, also, no stress is produced in the Y axis direction, i.e., the flow direction of the ocean stream, so that no voltage is generated across the piezoelectric ceramic modules 15 arranged side by side in the Y axis direction. Accordingly, potentials at connected portions of those piezoelectric ceramic modules 15 to the electrodes 17 become an equal potential.

As explained above, the external force applied to the pressure-receiving cylinder causes the piezoelectric ceramic modules 15 to repeatedly produce stresses. Even if the flow of ocean stream is in the Y axis direction or in the X axis direction, a voltage with a polarity always same is applied across the load terminals 36 because of the actions by the rectifier circuits 23A and 23B of the power averaging unit 20.

Next, an explanation will be given of a case in which the flow direction of ocean stream is in directions other than the X axis direction and the Y axis direction.

When an ocean stream is coming from the direction of 7:30 as viewed from the center axis O, an external force in the direction orthogonal to the flow, i.e., the direction of 4:30 or 10:30 is applied to the pressure-receiving cylinder 11 because of a Karman vortex.

Figure 14:
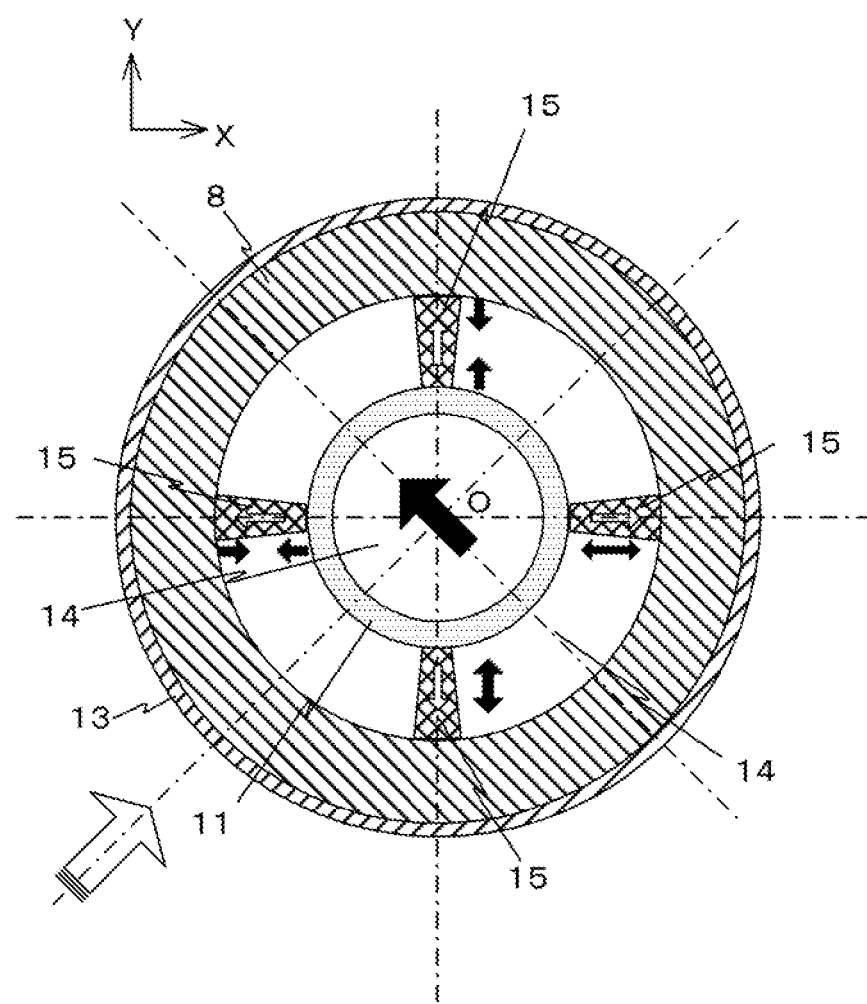
FIG. 14 is a diagram showing an instant at which a stress in the direction of 10:30 is produced with the flow of ocean stream being in the direction of 7:30.

For example, at a given instant, as shown in FIG. 14, an external force in the direction of 10:30 is applied to the pressure-receiving cylinder 11. This external force can be divided into vector components: a force in −X direction; and a force in +Y direction. In this case, regarding the piezoelectric ceramic modules 15 arranged side by side in the X axis direction, a compression stress is produced at the piezoelectric ceramic module 15 at −X side, and a tensile stress is produced at the piezoelectric ceramic module 15 at +X side. Moreover, regarding the piezoelectric ceramic modules 15 arranged side by side in the Y axis direction, a tensile stress is produced at the piezoelectric ceramic module 15 at −Y side, and a compression stress is produced at the piezoelectric ceramic module 15 at +Y side.

Figure 15:
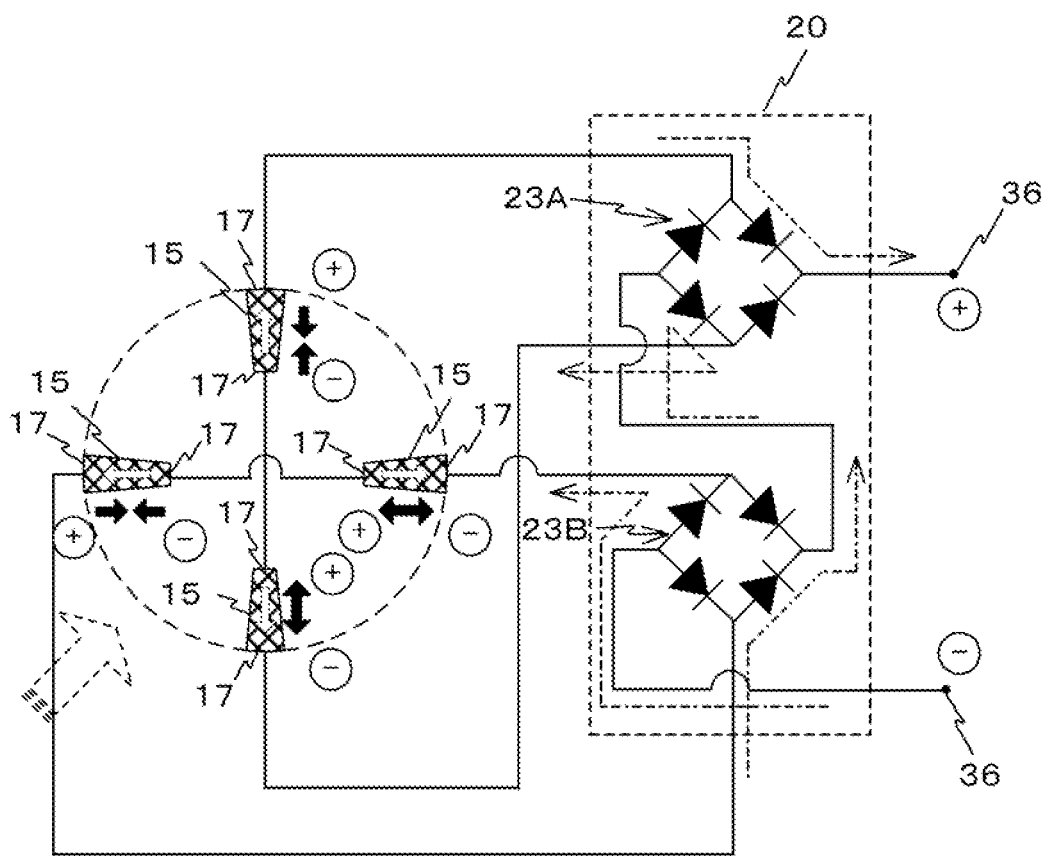
FIG. 15 is a diagram for explaining an operation of the power generating module in the instant shown in FIG. 14.

At this time, as shown in FIG. 15, because a compression stress is applied to the piezoelectric ceramic module 15 at −X side, this piezoelectric ceramic module 15 generates a voltage so that the polarity of the outward electrode 17 of this piezoelectric ceramic module 15 becomes positive, and the polarity of the inward electrode 17 becomes negative. Moreover, because a tensile stress is applied to the piezoelectric ceramic module 15 at +X side, this piezoelectric ceramic module 15 generates a voltage so that the polarity of the outward electrode 17 of this piezoelectric ceramic module 15 becomes negative, and the polarity of the inward electrode 17 becomes positive. Because both piezoelectric ceramic modules 15 are connected in series, a voltage that makes the polarity at −X side positive and the polarity at +X side negative as a whole is output.

Conversely, because a compression stress is applied to the piezoelectric ceramic module 15 at +Y side, this piezoelectric ceramic module 15 generates a voltage so that the polarity of the outward electrode 17 of that piezoelectric ceramic module 15 becomes positive and the polarity of the inward electrode 17 thereof becomes negative. Moreover, because a tensile stress is applied to the piezoelectric ceramic module 15 at −Y side, this piezoelectric ceramic module 15 generates a voltage so that the polarity of the outward electrode 17 of that piezoelectric ceramic module 15 becomes negative and the polarity of the inward electrode 17 thereof becomes positive. Because both piezoelectric ceramic modules 15 are connected in series, a voltage that makes the polarity at +Y side positive and the polarity at −Y direction negative as a whole is output.

The currents originating from such voltages are subjected to rectification by the rectifier circuits 23A and 23B of the power averaging unit 20, and a voltage is applied across the load terminals 36 as a result. Accordingly, the voltage applied across the load terminals 36 is a voltage in series that is a sum of the output voltage by the rectifier circuit 23B where the voltage generated in the X axis direction is input and the output voltage by the rectifier circuit 23A where the voltage generated in the Y axis direction is input, and the polarity of such voltage remains same.

Figure 16:
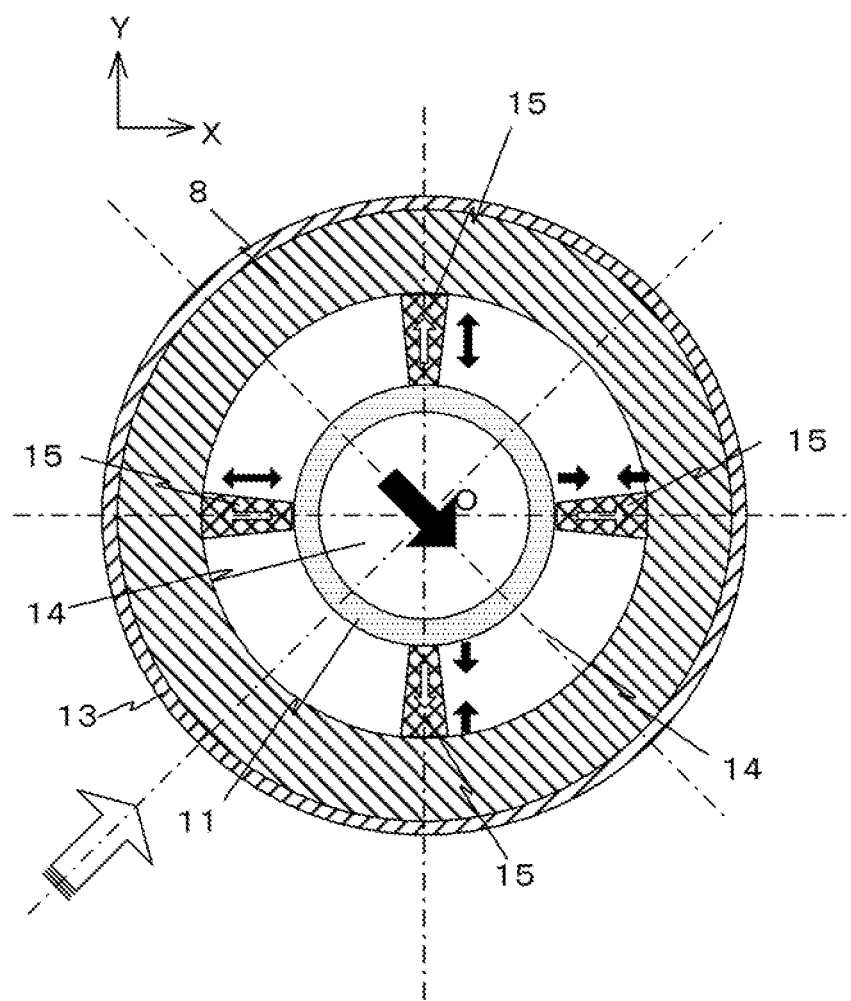
FIG. 16 is a diagram showing an instant at which a stress in the direction of 4:30 is produced with the ocean stream coming from the direction of 7:30.

When a little time advances from the condition shown in FIG. 14, as shown in FIG. 16, an external force in the direction of 4:30 is applied to the pressure-receiving cylinder 11 because of a Karman vortex. In this case, regarding the piezoelectric ceramic modules 15 arranged side by side in the X axis direction, a compression stress is produced at the piezoelectric ceramic module 15 at +X side and a tensile stress is produced at the piezoelectric ceramic module 15 at −X side. Conversely, regarding the piezoelectric ceramic modules 15 arranged side by side in the Y axis direction, a tensile stress is produced at the piezoelectric ceramic module 15 at +Y side and a compression stress is produced at the piezoelectric ceramic module 15 at −Y side.

Figure 17:
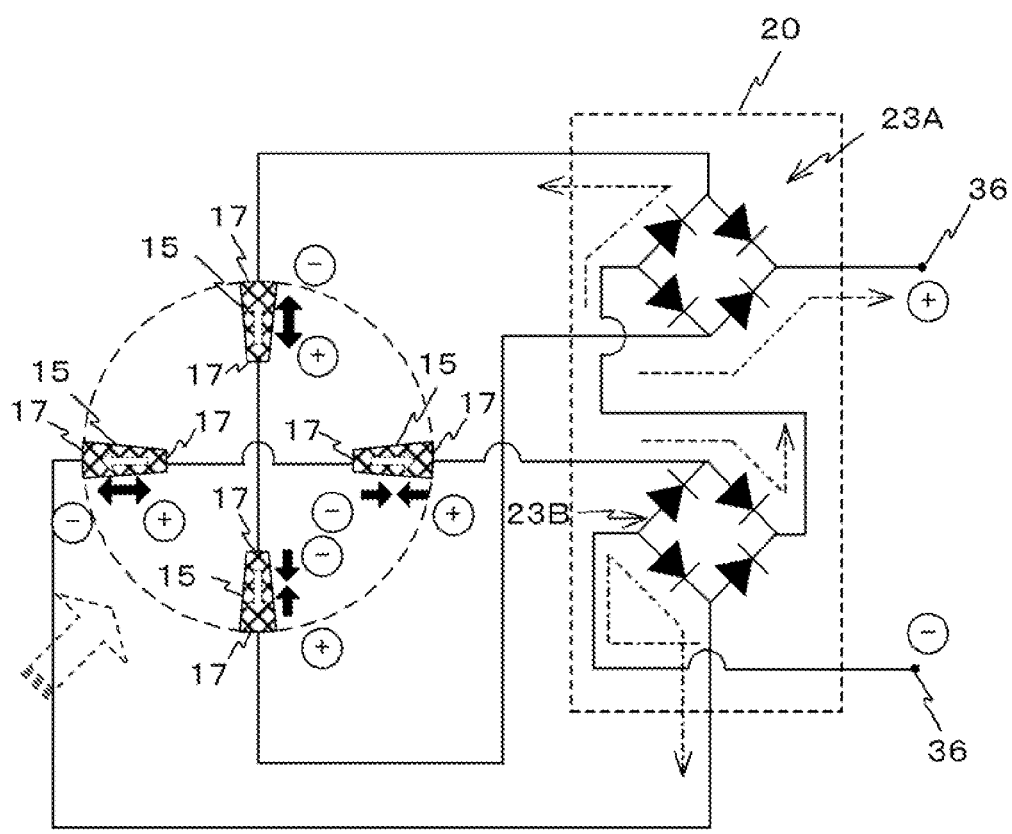
FIG. 17 is a diagram for explaining an operation of the power generating module in the instant shown in FIG. 16.

At this time, as shown in FIG. 17, because a compression stress is applied to the piezoelectric ceramic module 15 at +X side, this piezoelectric ceramic module 15 generates a voltage so that the polarity of the outward electrode 17 of this piezoelectric ceramic module 15 becomes positive, and the polarity of the inward electrode 17 becomes negative. Moreover, because a tensile stress is applied to the piezoelectric ceramic module 15 at −X side, this piezoelectric ceramic module 15 generates a voltage so that the polarity of the outward electrode 17 of this piezoelectric ceramic module 15 becomes negative, and the polarity of the inward electrode 17 becomes positive. Because both piezoelectric ceramic modules 15 are connected in series, a voltage that makes the polarity at −X side positive and the polarity at +X side negative as a whole is output.

Conversely, because a compression stress is applied to the piezoelectric ceramic module 15 at −Y side, this piezoelectric ceramic module 15 generates a voltage so that the polarity of the outward electrode 17 of that piezoelectric ceramic module 15 becomes positive and the polarity of the inward electrode 17 thereof becomes negative. Moreover, because a tensile stress is applied to the piezoelectric ceramic module 15 at +Y side, this piezoelectric ceramic module 15 generates a voltage so that the polarity of the outward electrode 17 of that piezoelectric ceramic module 15 becomes negative and the polarity of the inward electrode 17 thereof becomes positive. Because both piezoelectric ceramic modules 15 are connected in series, a voltage that makes the polarity at +Y side negative and the polarity at −Y direction positive as a whole is output.

The currents originating from such voltages are subjected to rectification by the rectifier circuits 23A and 23B of the power averaging unit 20, and a voltage is applied across the load terminals 36 as a result. Accordingly, the voltage applied across the load terminals 36 is a voltage in series that is a sum of the output voltage by the rectifier circuit 23B where the voltage generated in the X axis direction is input and the output voltage by the rectifier circuit 23A where the voltage generated in the Y axis direction is input, and the polarity of such voltage remains same.

When the ocean stream is coming from the direction of 4:30, an external force in the direction orthogonal to the flow, i.e., the direction in 7:30 or in 1:30 is applied to the pressure-receiving cylinder 11 because of a Karman vortex.

Figure 18:
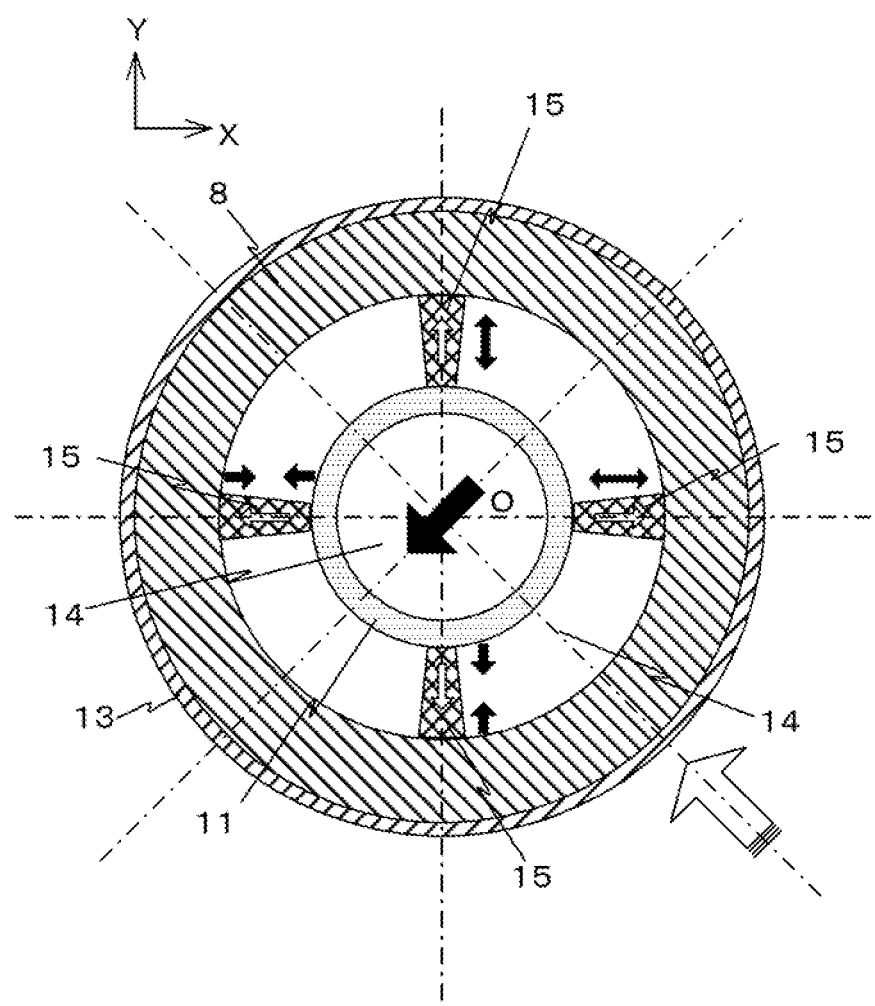
FIG. 18 is a diagram showing an instant at which a stress in the direction of 7:30 is produced with the ocean stream coming from the direction of 4:30.

For example, at a given instant, as shown in FIG. 18, an external force in the direction of 7:30 is applied to the pressure-receiving cylinder 11. This external force can be divided into vector components: a force in −X direction; and a force in −Y direction. Hence, regarding the piezoelectric ceramic modules 15 arranged side by side in the X axis direction, a compression stress is produced at the piezoelectric ceramic module 15 at −X side, and a tensile stress is produced at the piezoelectric ceramic module 15 at +X side. Moreover, regarding the piezoelectric ceramic modules 15 arranged side by side in the Y axis direction, a tensile stress is produced at the piezoelectric ceramic module 15 at +Y side, and a compression stress is produced at the piezoelectric ceramic module 15 at −Y side.

Figure 19:
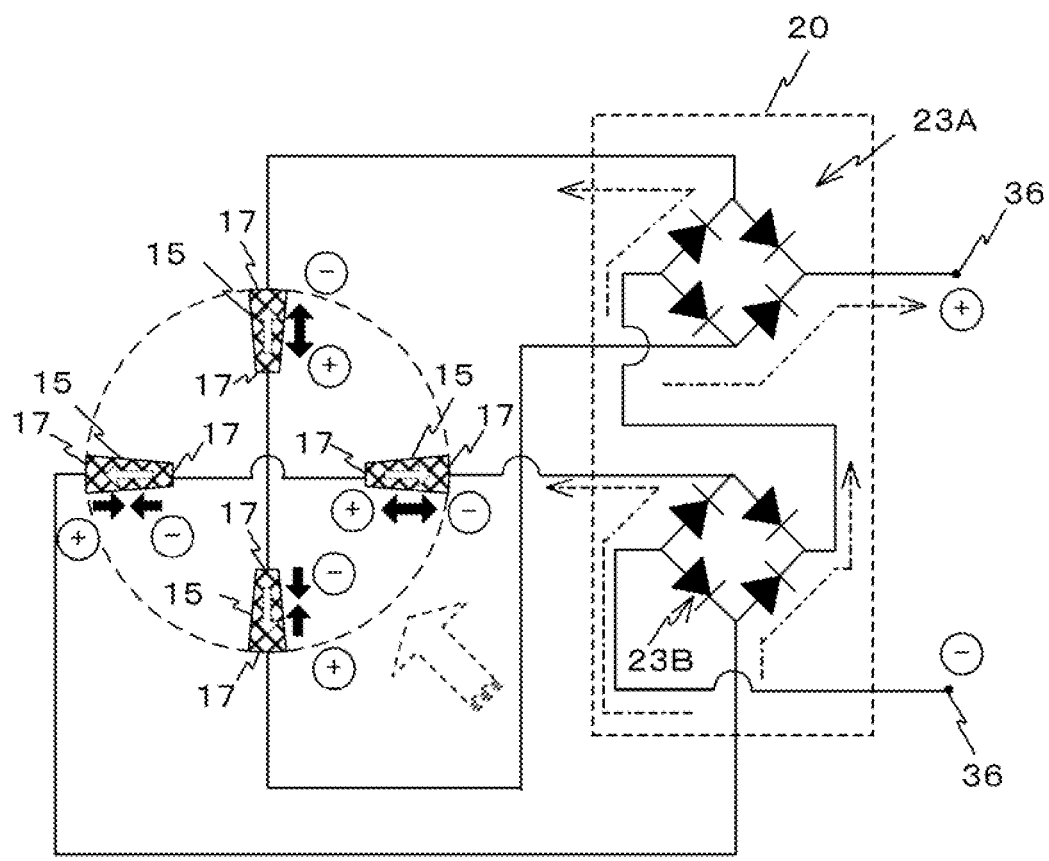
FIG. 19 is a diagram for explaining an operation of the power generating module in the instant shown in FIG. 18.

At this time, as shown in FIG. 19, because a compression stress is applied to the piezoelectric ceramic module 15 at −X side, this piezoelectric ceramic module 15 generates a voltage so that the polarity of the outward electrode 17 of this piezoelectric ceramic module 15 becomes positive, and the polarity of the inward electrode 17 becomes negative. Moreover, because a tensile stress is applied to the piezoelectric ceramic module 15 at +X side, this piezoelectric ceramic module 15 generates a voltage so that the polarity of the outward electrode 17 of this piezoelectric ceramic module 15 becomes negative, and the polarity of the inward electrode 17 becomes positive. Because both piezoelectric ceramic modules 15 are connected in series, a voltage that makes the polarity at −X side positive and the polarity at +X side negative as a whole is output.

Conversely, because a compression stress is applied to the piezoelectric ceramic module 15 at −Y side, this piezoelectric ceramic module 15 generates a voltage so that the polarity of the outward electrode 17 of that piezoelectric ceramic module 15 becomes positive and the polarity of the inward electrode 17 thereof becomes negative. Moreover, because a tensile stress is applied to the piezoelectric ceramic module 15 at +Y side, this piezoelectric ceramic module 15 generates a voltage so that the polarity of the outward electrode 17 of that piezoelectric ceramic module 15 becomes negative and the polarity of the inward electrode 17 thereof becomes positive. Because both piezoelectric ceramic modules 15 are connected in series, a voltage that makes the polarity at +Y side negative and the polarity at −Y direction positive as a whole is output.

The currents originating from such voltages are subjected to rectification by the rectifier circuits 23A and 23B of the power averaging unit 20, and a voltage is applied across the load terminals 36 as a result. Accordingly, the voltage applied across the load terminals 36 is a voltage in series that is a sum of the output voltage by the rectifier circuit 23B where the voltage generated in the X axis direction is input and the output voltage by the rectifier circuit 23A where the voltage generated in the Y axis direction is input, and the polarity of such voltage remains same.

Figure 20:
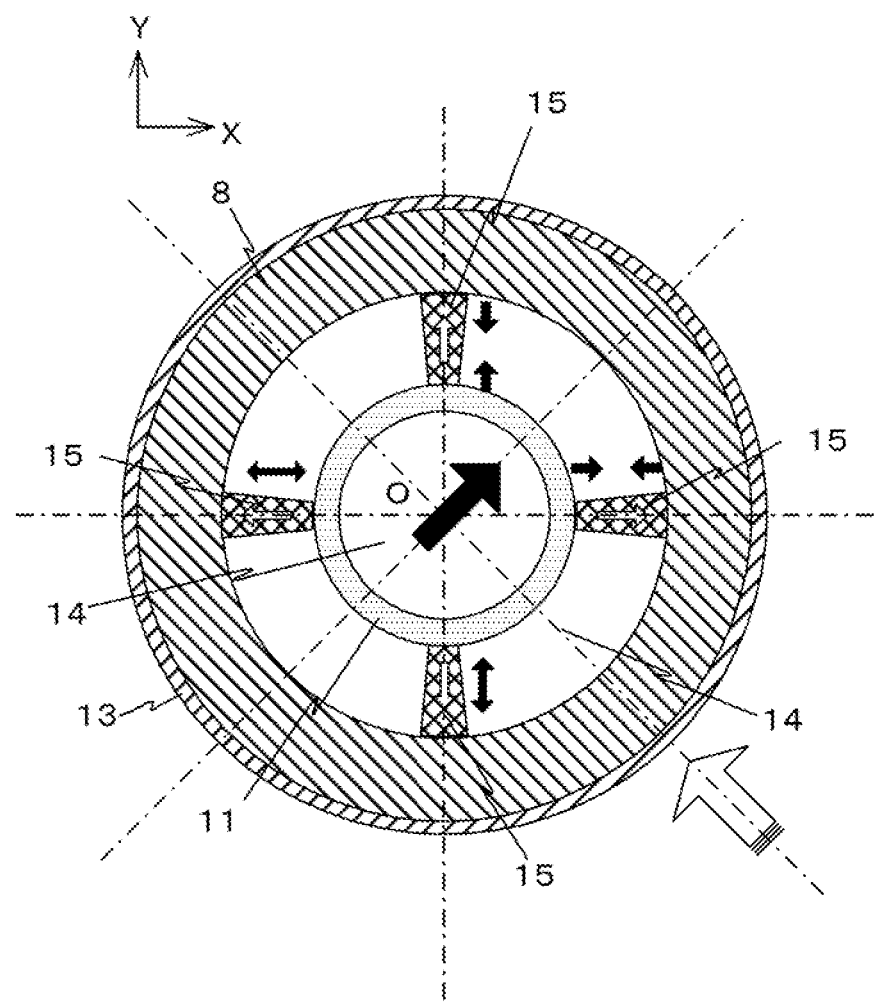
FIG. 20 is a diagram showing an instant at which a stress in the direction of 1:30 is produced with the ocean stream coming from the direction of 4:30.

When a little time advances from the condition shown in FIG. 19, as shown in FIG. 20, an external force in the direction of 1:30 is applied to the pressure-receiving cylinder 11 because of a Karman vortex. In this case, regarding the piezoelectric ceramic modules 15 arranged side by side in the X axis direction, a compression stress is produced at the piezoelectric ceramic module 15 at +X side and a tensile stress is produced at the piezoelectric ceramic module 15 at −X side. Moreover, regarding the piezoelectric ceramic modules 15 arranged side by side in the Y axis direction, a tensile stress is produced at the piezoelectric ceramic module 15 at −Y side and a compression stress is produced at the piezoelectric ceramic module 15 at +Y side.

Figure 21:
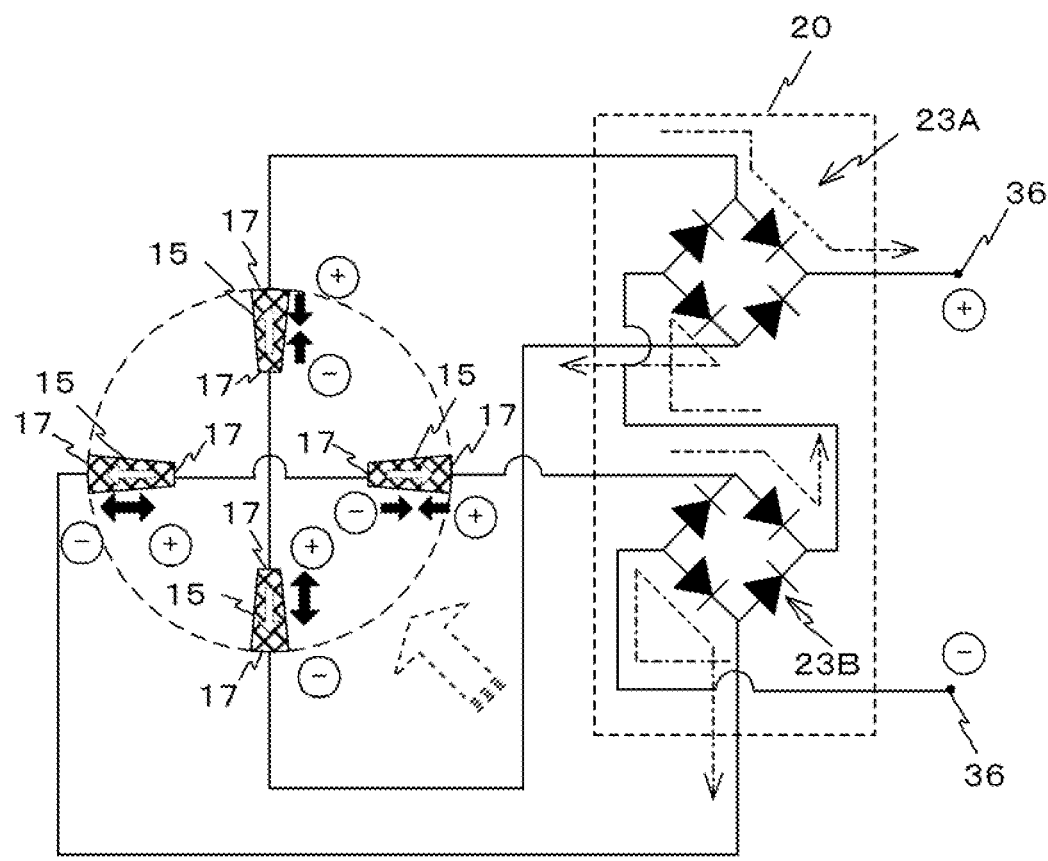
FIG. 21 is a diagram for explaining an operation of the power generating module at the instant shown in FIG. 20.

At this time, as shown in FIG. 21, because a compression stress is applied to the piezoelectric ceramic module 15 at +X side, this piezoelectric ceramic module 15 generates a voltage so that the polarity of the outward electrode 17 of this piezoelectric ceramic module 15 becomes positive, and the polarity of the inward electrode 17 becomes negative. Moreover, because a tensile stress is applied to the piezoelectric ceramic module 15 at −X side, this piezoelectric ceramic module 15 generates a voltage so that the polarity of the outward electrode 17 of this piezoelectric ceramic module 15 becomes negative, and the polarity of the inward electrode 17 becomes positive. Because both piezoelectric ceramic modules 15 are connected in series, a voltage that makes the polarity at −X side negative and the polarity at +X side positive as a whole is output.

Conversely, because a compression stress is applied to the piezoelectric ceramic module 15 at +Y side, this piezoelectric ceramic module 15 generates a voltage so that the polarity of the outward electrode 17 of that piezoelectric ceramic module 15 becomes positive and the polarity of the inward electrode 17 thereof becomes negative. Moreover, because a tensile stress is applied to the piezoelectric ceramic module 15 at −Y side, this piezoelectric ceramic module 15 generates a voltage so that the polarity of the outward electrode 17 of that piezoelectric ceramic module 15 becomes negative and the polarity of the inward electrode 17 thereof becomes positive. Because both piezoelectric ceramic modules 15 are connected in series, a voltage that makes the polarity at +Y side negative and the polarity at −Y direction positive as a whole is output.

The currents originating from such voltages are subjected to rectification by the rectifier circuits 23A and 23B of the power averaging unit 20, and a voltage is applied across the load terminals 36 as a result. Accordingly, the voltage applied across the load terminals 36 is a voltage in series that is a sum of the output voltage by the rectifier circuit 23B where the voltage generated in the X axis direction is input and the output voltage by the rectifier circuit 23A where the voltage generated in the Y axis direction is input, and the polarity of such voltage remains same.

As explained above, according to the power generating module 5, no matter whether the flow of ocean stream is in like the X axis direction and in the Y axis direction along the polarization direction of the piezoelectric ceramic module 15 or in the other directions, a voltage with a polarity always same is applied across the load terminals 36. Moreover, voltages in respective axial directions are added and applied across the load terminals 36, so that the level of such a voltage is substantially uniform regardless of the direction where the ocean stream comes.

In the present embodiment, the attachment seat 7 is provided at only one end face in the center axis O, but when there is a member above the power generating module which enables fixing thereof, the attachment seats 7 may be provided at both end faces in the center axis O. When the container 10 can be surely fixed like a case in which the attachment seats 7 are provided at both end faces and the container 10 is fixed to another member through that attachment seat 7, the poles 10 become unnecessary.

Moreover, according to the present embodiment, in order to increase a stress originating from a Karman vortex, etc., the column portion is designed as a light-weight pressure-receiving cylinder 11. However, the pressure-receiving cylinder 11 may be a solid column as long as it is light weighted, and may be a polygonal shape or a shape having wings arranged therearound as long as the stress distribution of the fluid around the pressure-receiving cylinder 11 becomes non-uniform. In a word, it is appropriate if the pressure-receiving cylinder 11 is formed in a shape that produces a change in the stress distribution on its surface by an ocean stream.

The rectifier circuits 23A and 23B are used in the present embodiment in order to not only convert the output voltage by the piezoelectric ceramic module 15 into a constant DC voltage but also average four output voltages at a constant efficiency regardless of the direction where the fluid comes and output a voltage to the load terminals 36. Hence, the rectifier circuits 23A and 23B have different applications and function from those of a rectifier circuit in other applications which simply performs rectification on a current and outputs a DC current.

Moreover, the containers 8 and 10 restrict the displacement of the pressure-receiving cylinder 11, etc., only inwardly of the radial direction at both ends of the direction of center axis O of the pressure-receiving cylinder 11. However, as long as the pressure-receiving cylinder 11, etc., produces a stress by the flow of a fluid, the displacement of the pressure-receiving cylinder 11 may be restricted inwardly of the radial direction at a location in the vicinity of the center of the direction of the center axis O of the pressure-receiving cylinder 11. That is, according to the present invention, the location which restricts the displacement of the stress producing member is not limited to any particular one.

<Second Embodiment>

Next, an explanation will be given of a second embodiment of the present invention.

Figure 22:
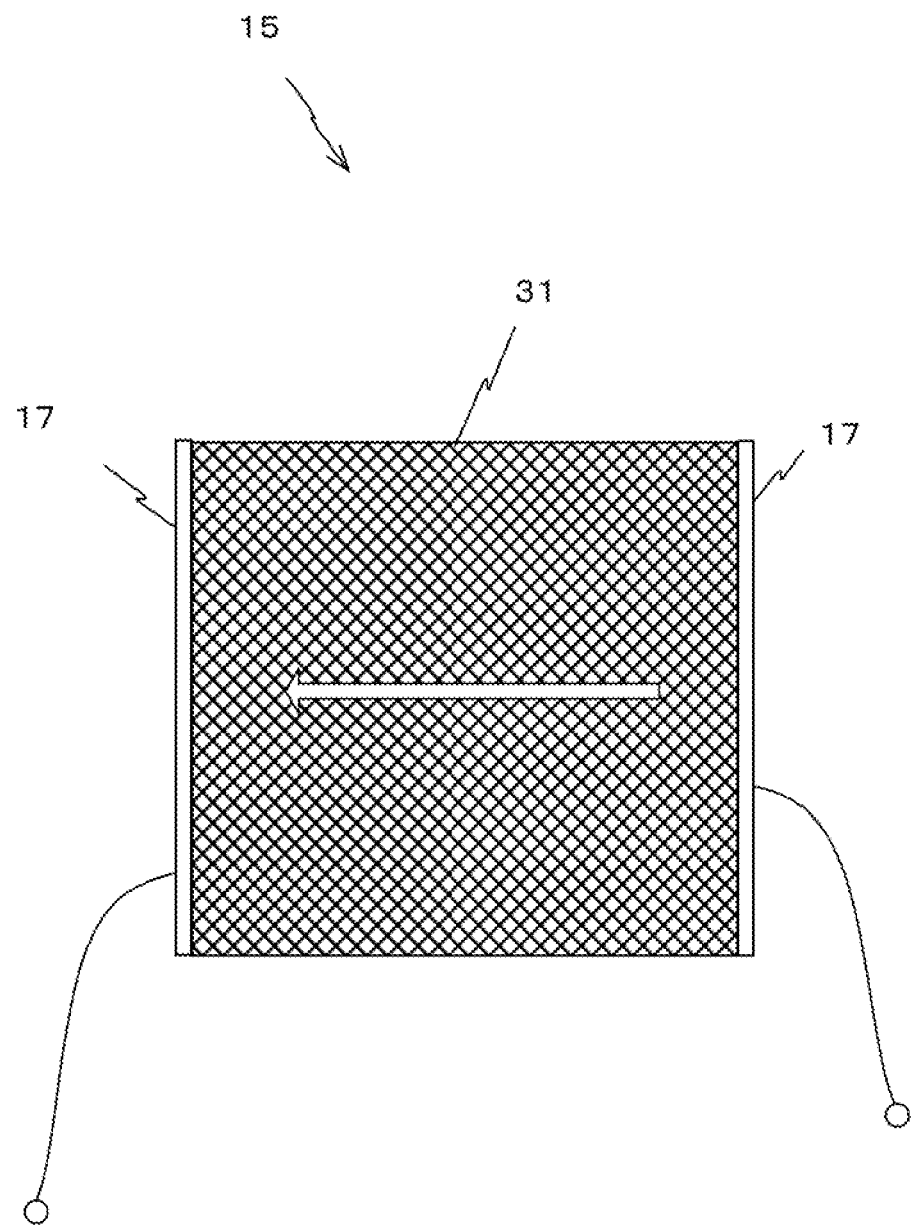
FIG. 22 is a diagram showing a piezoelectric ceramic module used for a power generating module according to a second aspect of the present invention.

According to the present embodiment, as shown in FIG. 22, a rectangular single piezoelectric ceramic 31 is used as the piezoelectric ceramic module 15 instead of the trapezoidal piezoelectric ceramic 16 shown in FIG. 6. When each piezoelectric ceramic module 15 is rectangular, the electric field produced thereinside can be made more uniform.

The present embodiment is same as the first embodiment other than the difference in the shape of the piezoelectric ceramic module 15.

<Third Embodiment>

Next, an explanation will be given of a third embodiment of the present invention.

Figure 23:
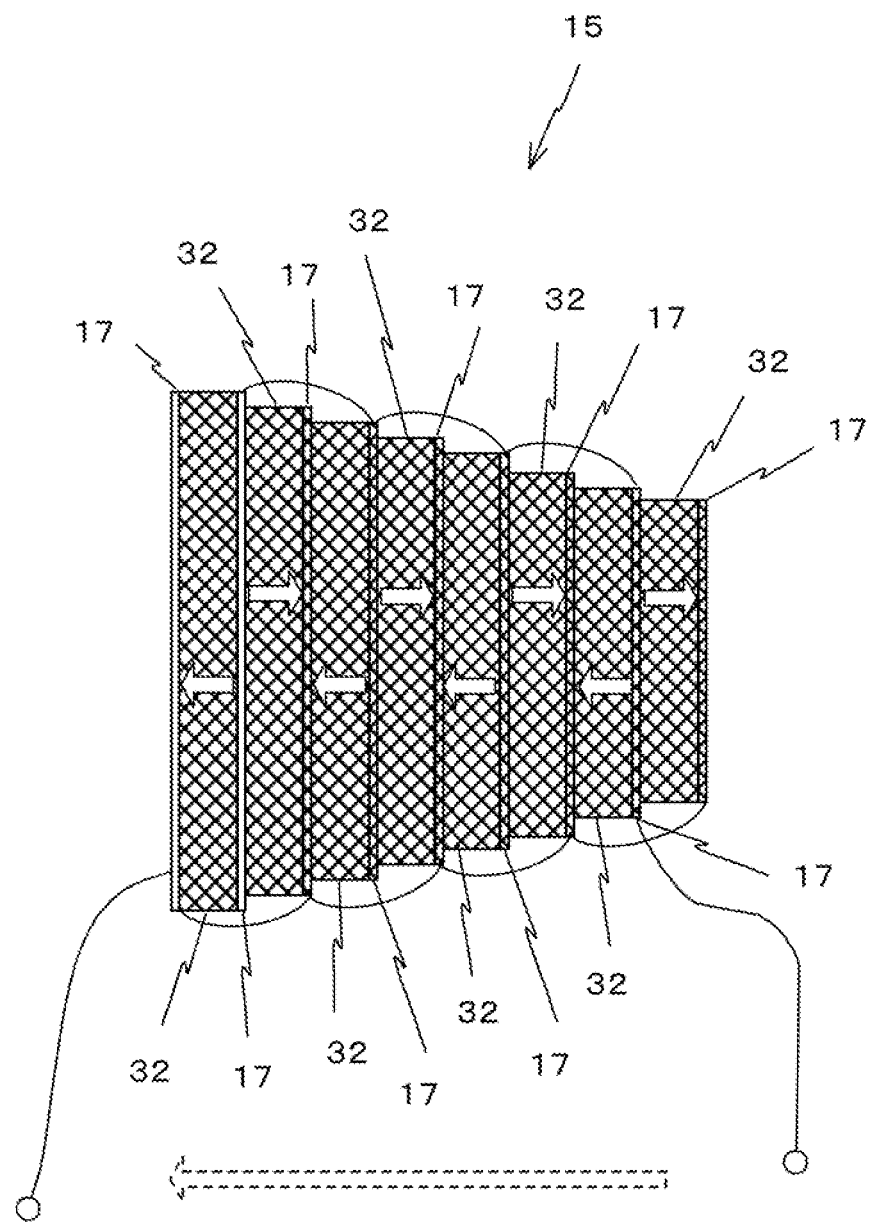
FIG. 23 is a diagram showing a piezoelectric ceramic module used for a power generating module according to a third aspect of the present invention.

In the present embodiment, as shown in FIG. 23, a structure formed of stacked rectangular piezoelectric ceramics 32 is used as the piezoelectric ceramic module 15 instead of the trapezoidal piezoelectric ceramic 16 shown in FIG. 6.

Respective polarization directions of adjoining piezoelectric ceramics 32 are opposite. Moreover, each piezoelectric ceramic 32 has electrodes 17 at both ends in the polarization direction.

The electrodes 17 of respective piezoelectric ceramics 32 in the polarization direction are connected together. Moreover, the electrodes 17 of respective piezoelectric ceramics 32 at the opposite side of the polarization direction are also connected together. Hence, an apparent polarization direction of the piezoelectric ceramic module 15 is set, and the piezoelectric ceramic module 15 can operate like one configured by the single piezoelectric ceramic according to the first embodiment. The present embodiment is same as the first embodiment other than the difference in the structure of the piezoelectric ceramic module 15.

The piezoelectric ceramic module 15 of the present embodiment has slightly lower output efficiency than that of the singular structure, but it is appropriate if the size of the piezoelectric ceramic module 15 is too large and there is a difficulty in formation of the piezoelectric ceramic module 15 by sintering a single ceramic.

<Fourth Embodiment>

Next, an explanation will be given of a fourth embodiment of the present invention.

In the present embodiment, a cylindrical piezoelectric ceramic structure is used as the piezoelectric ceramic module 15 instead of the piezoelectric ceramic 16 shown in FIG. 6.

Figure 24:
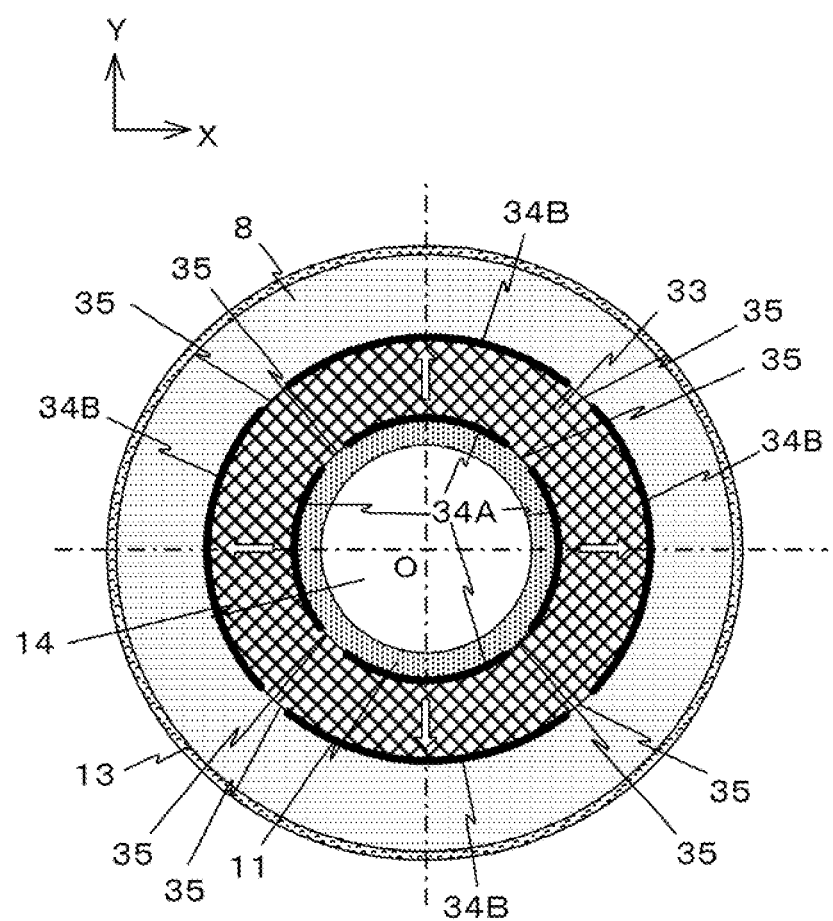
FIG. 24 is a diagram showing a configuration of a piezoelectric ceramic module used for a power generating module according to a fourth aspect of the present invention.

FIG. 24 is a lateral cross-sectional view of the power generating module 5 of the present embodiment which corresponds to the B-B' cross-sectional view of FIG. 5 according to the first embodiment. As shown in FIG. 24, in the present embodiment, a cylindrical piezoelectric ceramic structure 33 is arranged between the container 8 and the pressure-receiving cylinder 11. The polarization direction of the piezoelectric ceramic structure 33 is directed outwardly of the radial direction around the center axis O.

Formed inwardly of the piezoelectric ceramic structure 33 are four inner circumferential electrodes 34A that are arranged evenly in the circumferential direction (arranged at four locations each of which is ¼ of a cylinder so as to be rotationally symmetric). Each of the inner circumferential electrodes 34A is insulated by an electrode divider 35. Moreover, formed outwardly of the piezoelectric ceramic structure 33 are four outer circumferential electrodes 34B that are arranged evenly in the circumferential direction (arranged at four locations each of which is ¼ of a cylinder so as to be rotationally symmetric). Each of the outer circumferential electrodes 34B is insulated by the electrode divider 35.

The piezoelectric ceramic structure 33 has the same polarization direction and layout of electrodes as those of the piezoelectric ceramic structure 12 of the first embodiment, so that the piezoelectric ceramic structure 33 operates like the piezoelectric ceramic structure 12 upon application of an external force to the pressure-receiving cylinder 11. Accordingly, when the inner circumferential electrodes 34A and the outer circumferential electrodes 34B are connected to the power averaging unit 20 like the first embodiment, the power generating module 5 of the present embodiment can operate like the power generating module 5 of the first embodiment.

The piezoelectric ceramic structure 33 facilitates assembly because it is fine if the inner circumferential electrodes 34A and the outer circumferential electrodes 34B are just pasted on a produced cylindrical piezoelectric ceramic.

<Fifth Embodiment>

Next, an explanation will be given of a fifth embodiment of the present invention. A power generating module of the present embodiment has a different configuration from that of the power generating module 5 of the first embodiment.

Figure 25:
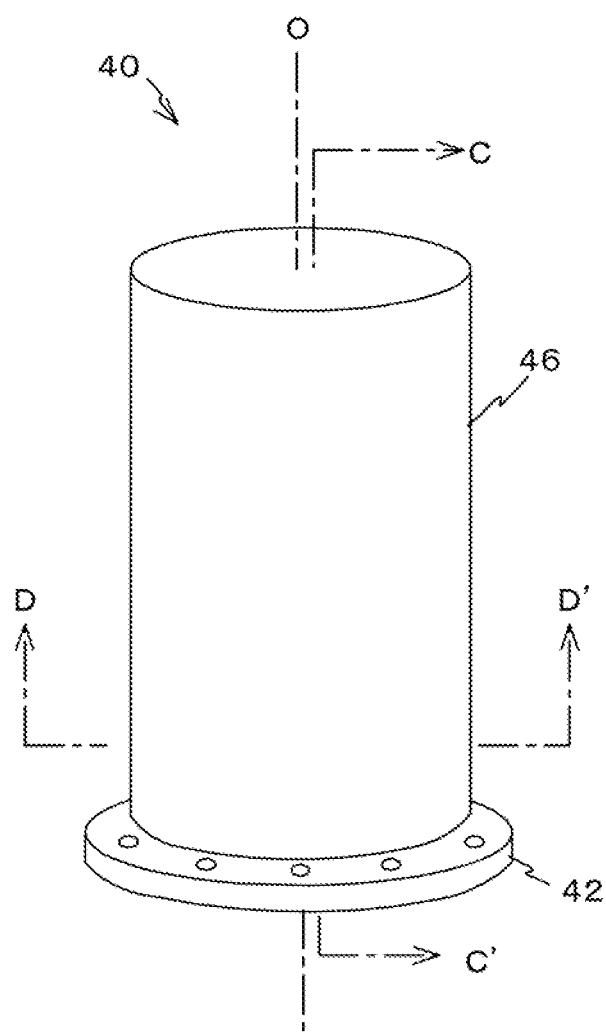
FIG. 25 is a perspective view showing an external appearance of a power generating module according to a fifth aspect of the present invention.
Figure 26:
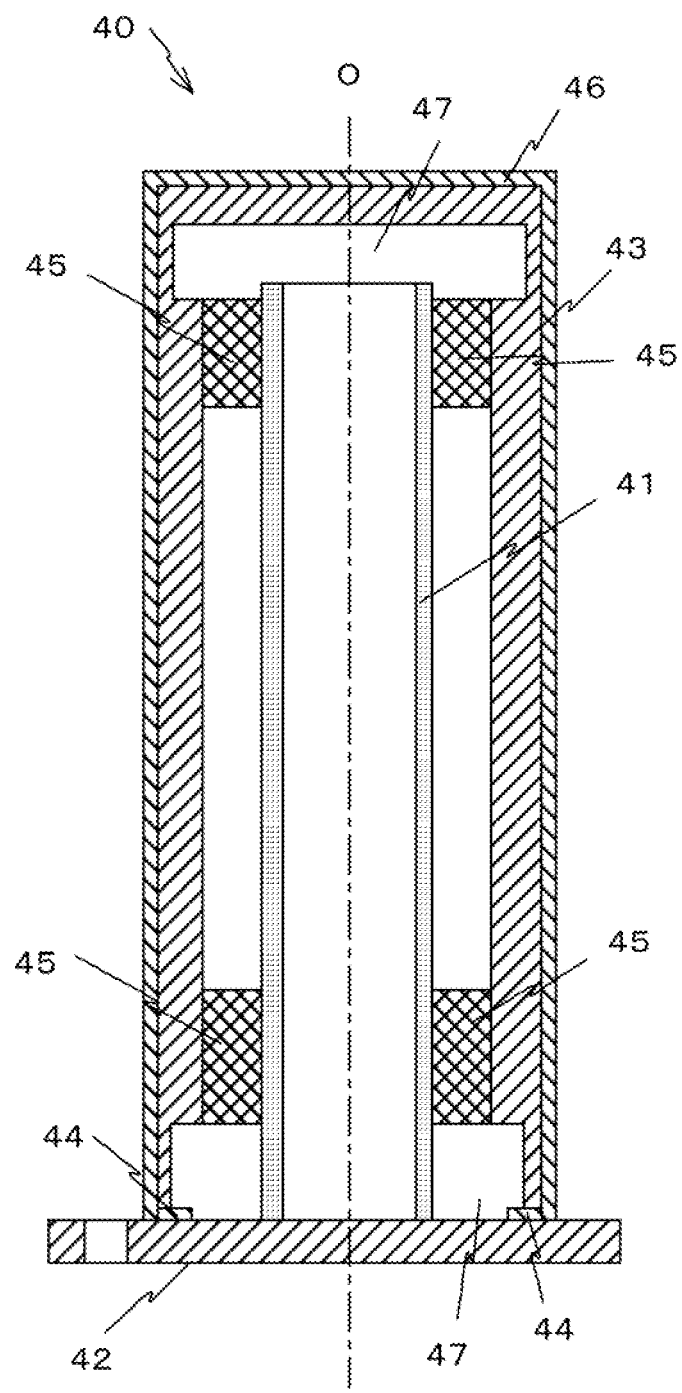
FIG. 26 is a cross-sectional view along a line C-C' of FIG. 25.
Figure 27:
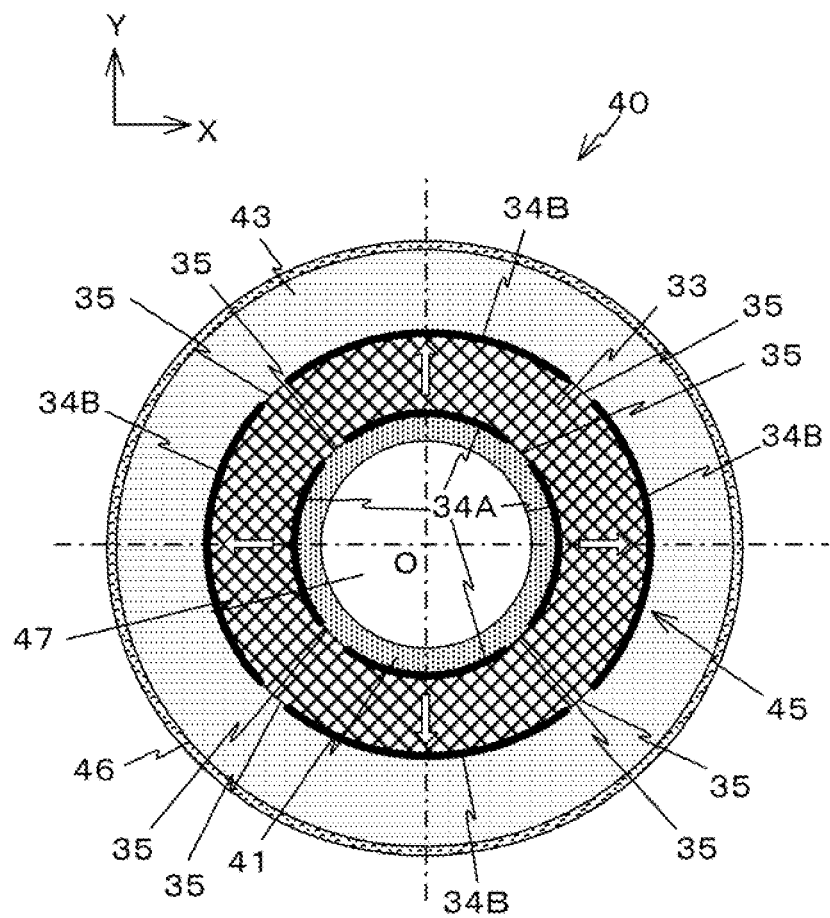
FIG. 27 is a cross-sectional view along a line D-D' of FIG. 25.

FIG. 25 shows an external appearance of a power generating module 40 of the present embodiment. FIG. 26 shows a cross section along a line C-C' in FIG. 25. FIG. 27 shows a cross section along a line D-D' in FIG. 25.

As shown in FIG. 25, the power generating module 40 is a columnar body as a whole around the center axis O in the vertical direction. As shown in FIG. 26, a columnar body extending in the direction of the center axis O coaxially with the center axis O, more specifically, a cylindrical support pole 41 is provided at the innermost circumference side. The support pole 41 is fixed to an attachment seat 42. In the present embodiment, the support pole 41 and the attachment seat 42 configure a suppression portion.

A pressure-receiving cylinder 43 is provided at the outer circumference side of the support pole 41. The pressure-receiving cylinder 43 is fixed to the attachment seat 42 via a buffering member 44. The buffering member 44 comprises a material with a small elasticity, such as a cork rubber, or a stacked paper sheet so as not to prevent the pressure-receiving cylinder 43 from vibrating.

The support pole 41 and the pressure-receiving cylinder 43 are joined together via two piezoelectric ceramic structures 45. One piezoelectric ceramic structure 45 joins both at the upper end side of the support pole 41 and another piezoelectric ceramic structure 45 joins both at the lower end side of the support pole 41.

The pressure-receiving cylinder 43 is a cylindrical body extending in the direction of the center axis O coaxially with the center axis O and embedding the support pole 41 and the piezoelectric ceramic modules 45 thereinside. The contour of the orthogonal cross section to the center axis O forms an outer circumferential side face and an inner circumferential side face rotationally symmetric around the center axis O.

Ones according to any one of the first to fourth embodiments can be used as the piezoelectric ceramic structure 45, but as shown in FIG. 27, in the present embodiment, the same piezoelectric ceramic structure as the cylindrical piezoelectric ceramic structure of the fourth embodiment is used. That is, the piezoelectric ceramic structure 45 has a polarization direction outwardly of the radial direction around the center axis O, and is connected to the outer circumferential side face of the support pole 41 at one end side of the polarization direction, and is connected to the inner circumferential side face of the pressure-receiving cylinder 43 at another end side of the polarization direction.

The outer circumference surface of the pressure-receiving cylinder 43 is revealed on ocean water, so that a waterproof cover 46 is applied thereon. The waterproof cover 46 is applied on the whole surface of the pressure-receiving cylinder 43, but when the pressure-receiving cylinder 43 is formed of a corrosive-resistant material, it is not necessary to apply such a cover to the whole surface of the pressure-receiving cylinder 43.

Like the first embodiment, a gas is generally filled in a hollow 47, but an insulating liquid may be filled therein. The water-tightness when a gas is filled in the hollow 47 is set based on the allowable stress of the pressure-receiving cylinder 43 and the withstanding pressure of the buffering member 44. Hence, the material of the pressure-receiving cylinder 43 and the thickness thereof, the thickness of the buffering member 44 and the structure thereof are selected in order to satisfy the necessary water-tightness.

According to the above-explained configuration, when the pressure-receiving cylinder 43 receives an external force originating from a Karman vortex generated as the flow of an external fluid contacts the pressure-receiving cylinder 43, a stress is produced at the piezoelectric ceramic structure 45 by the external force and a reaction force of the support pole 41. This stress causes the piezoelectric ceramic structure 45 to output a voltage.

The piezoelectric ceramic structure 45 has substantially same polarization direction and layout of electrodes as those of the piezoelectric ceramic structure 12 of the first embodiment, so that such a piezoelectric ceramic structure operates like the piezoelectric ceramic structure 12 upon application of an external force to the pressure-receiving cylinder 11. Hence, when the inner circumferential electrodes 34A and the outer circumferential electrodes 34B are connected to the power averaging unit 20 like the first embodiment, the power generating module 40 of the present embodiment can operate like the power generating module 5 of the first embodiment.

In the present embodiment, merely two piezoelectric ceramic structures 45 are provided at both ends of the pressure-receiving cylinder 43 in the vertical direction. However, the piezoelectric ceramic structure 45 may be spread and filled between the support pole 41 and the pressure-receiving cylinder 43. Moreover, a plurality of piezoelectric ceramic structures 45 may be spread and filled evenly between the support pole 41 and the pressure-receiving cylinder 43 in the vertical direction.

According to the present embodiment, it becomes better if the contacting area of the pressure-receiving cylinder 43 with the piezoelectric ceramic structure 45 becomes larger. Hence, with respect to the center axis O, when considering the ratio between the length of the pressure-receiving cylinder 43 and the length of the portion where the pressure-receiving cylinder 43 and the piezoelectric ceramic structure 45 are connected together, it is desirable that such a ratio should be equal to or larger than a predetermined ratio. This increases a stress produced at the piezoelectric ceramic structure 45 and the output voltage thereof, thereby improving the power generation efficiency.

Moreover, according to the present embodiment, although the support pole 41 is formed in a cylindrical shape, it may be in a columnar shape. Moreover, the buffering member 44 and the waterproof cover 46 may be a single piece. That is, a rubber, etc., forming both buffering member 44 and waterproof cover 46 may be provided.

<Sixth Embodiment>

Next, an explanation will be given of a sixth embodiment of the present invention. The present embodiment has a different configuration of a power generating module from that of the first embodiment.

Figure 28:
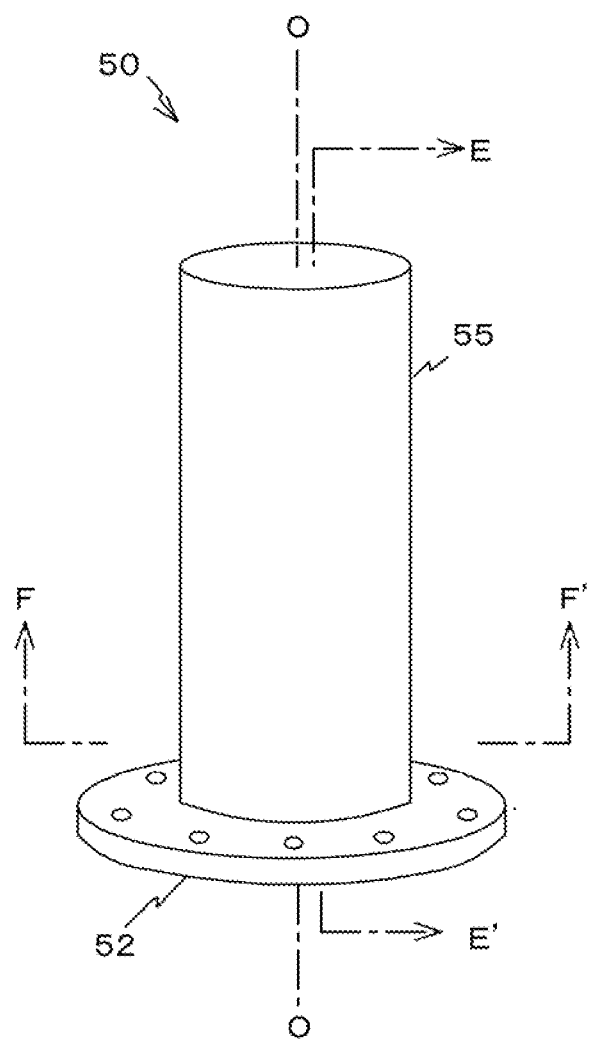
FIG. 28 is a perspective view showing an external appearance of a power generating module according to a sixth embodiment of the present invention.
Figure 29:
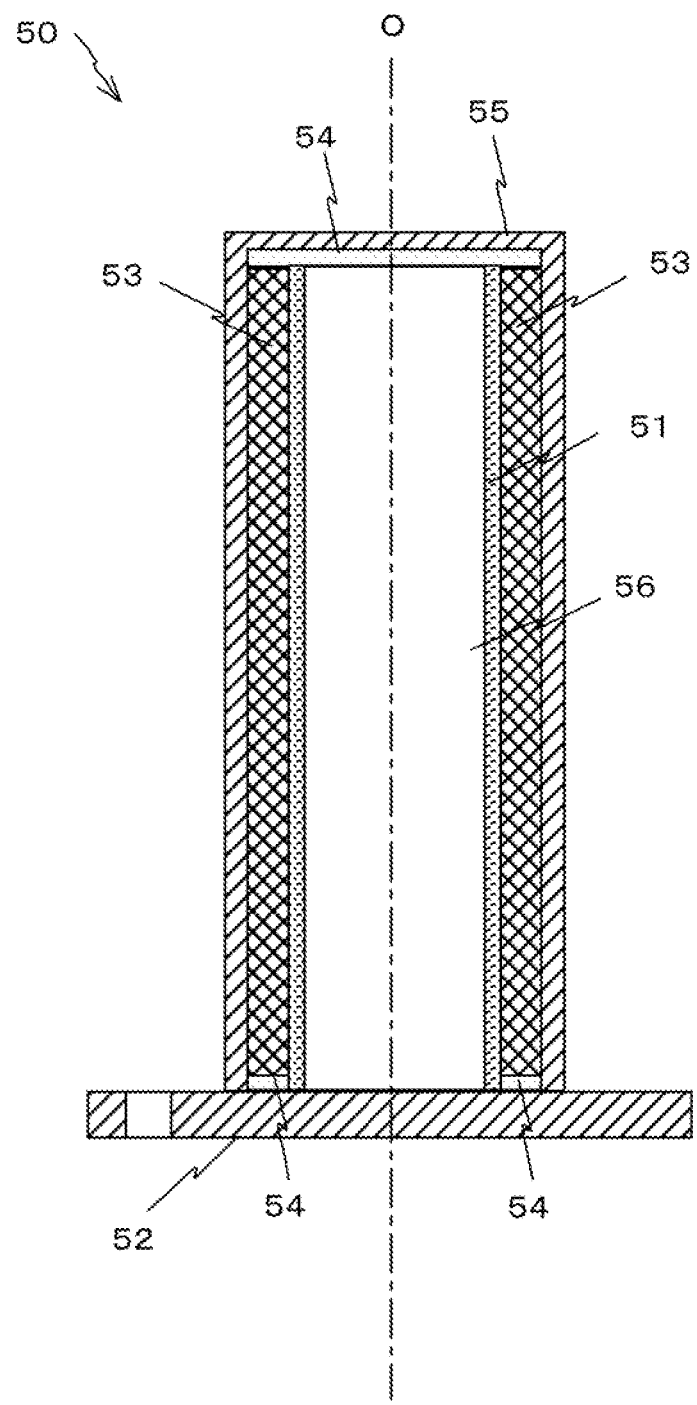
FIG. 29 is a cross-sectional view along a line E-E' of FIG. 28.
Figure 30:
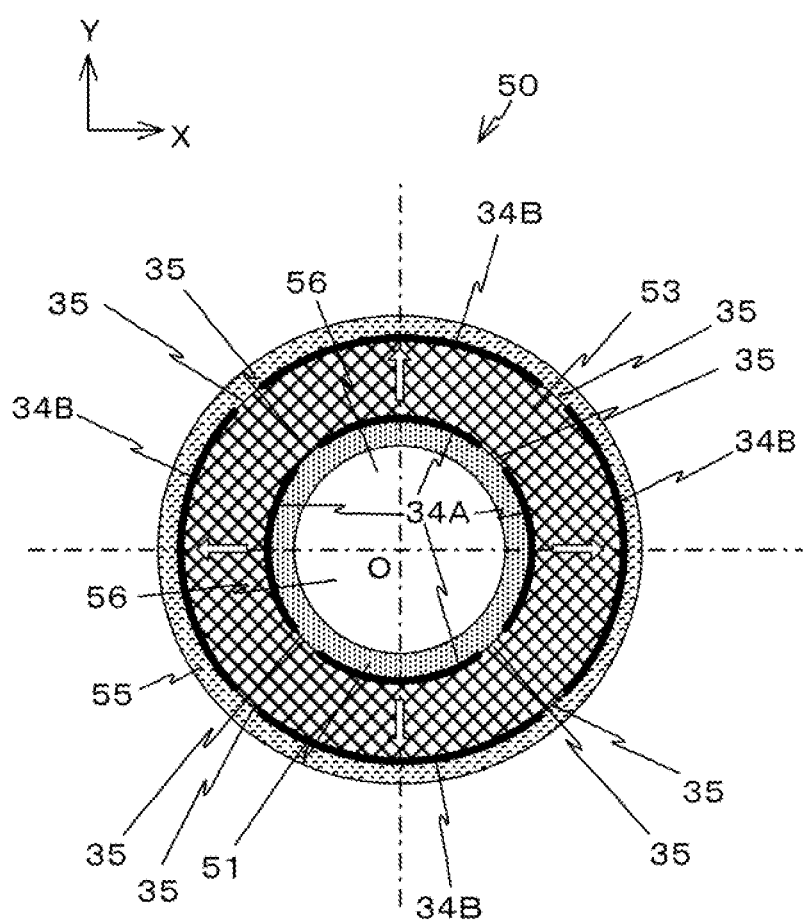
FIG. 30 is a cross-sectional view along a line F-F' of FIG. 28.

FIG. 28 shows an external appearance of a power generating module 50 according to the present embodiment. FIG. 29 shows a cross section along a line E-E' in FIG. 28. FIG. 30 shows a cross-section along a line F-F' in FIG. 28.

As is comprehensively shown in FIGS. 28 to 30, the power generating module 50 is a columnar body as a whole around the center axis O in the vertical direction. A cylindrical support pole 51 which is same as the support pole 41 of the fifth embodiment is provided at the innermost circumference side. The support pole 51 is fixed to an attachment seat 52. The support pole 51 and the attachment seat 52 configure a suppressing member.

A piezoelectric ceramic structure 53 is in a cylindrical shape. The piezoelectric ceramic structure 53 is a cylindrical body extending in the direction of the center axis O coaxially with the center axis O and embedding the support pole 51 thereinside. The piezoelectric ceramic structure 53 has the contour of an orthogonal cross section to the center axis O forming an outer circumferential side face rotationally symmetric around the center axis O, i.e., a cylindrical side face.

The piezoelectric ceramic structure 53 is fixed to the attachment seat 52 via a buffering member 54. The buffering member 54 suppresses interference between the support pole 51 and the piezoelectric ceramic structure 53. The buffering member 54 is formed of a material with a small elasticity, such as a cork rubber or a stacked paper sheet so as not to prevent the piezoelectric ceramic structure 53 from vibrating.

As shown in FIG. 30, the piezoelectric ceramic structure 53 has the same polarization direction and layout of electrodes as those of the fourth embodiment. Hence, when connected to the power averaging unit 20 in the same manner as that of the fourth embodiment, the same operation as that of the fourth embodiment can be realized.

In the present embodiment, the outer circumferential side face of the piezoelectric module structure 53 forms a side face of a stress producing member. The outer circumferential side face of the piezoelectric ceramic structure 53 is revealed on ocean water, so that a waterproof cover 55 is applied thereon.

The power generating module 50 employs a configuration that allows the piezoelectric ceramic structure 53 to directly receive an external force from a fluid therearound. Non-uniformity of a stress distribution by the fluid originating from a Karman vortex is generated outwardly of the piezoelectric ceramic structure 53, and when an external force is applied to the piezoelectric ceramic structure 53, a stress is produced inside the piezoelectric ceramic structure 53 by the external force and a reaction force by the support pole 51, and a voltage in accordance with such a stress can be obtained.

In the present embodiment, the support pole 51 may be also in a cylindrical shape or in a columnar shape.

Like the first embodiment, a gas is generally filled in a hollow 56, but an insulating liquid may be filled therein. The water-tightness when a gas is filled in the hollow 56 is set based on the allowable stress of the support pole 51 and that of the piezoelectric ceramic structure 53 and the withstanding pressure of the buffering member 54. Hence, the thickness of the piezoelectric ceramic structure 53, the thickness of the buffering member 54 and the structure thereof are selected in order to satisfy the necessary water-tightness.

Like the fifth embodiment, the buffering member 54 and the waterproof cover 55 may be formed of the same rubber, etc., and may be a single piece.

<Seventh Embodiment>

Next, an explanation will be given of a seventh embodiment of the present invention. The present embodiment has a different configuration of a power generating module from that of the first embodiment.

Figure 31:
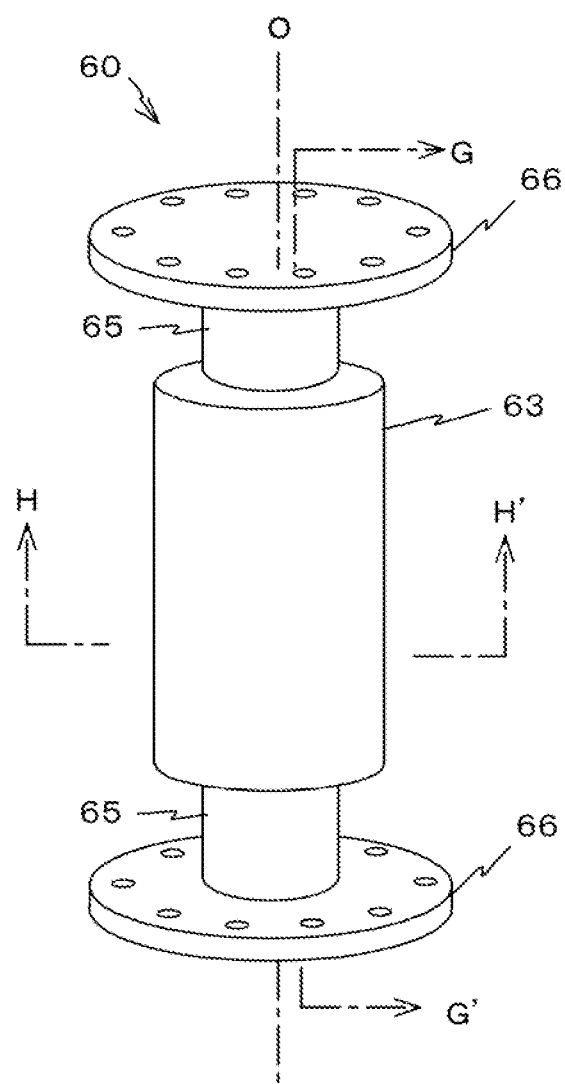
FIG. 31 is a perspective view showing an external appearance of a power generating module according to a seventh embodiment of the present invention.
Figure 32:
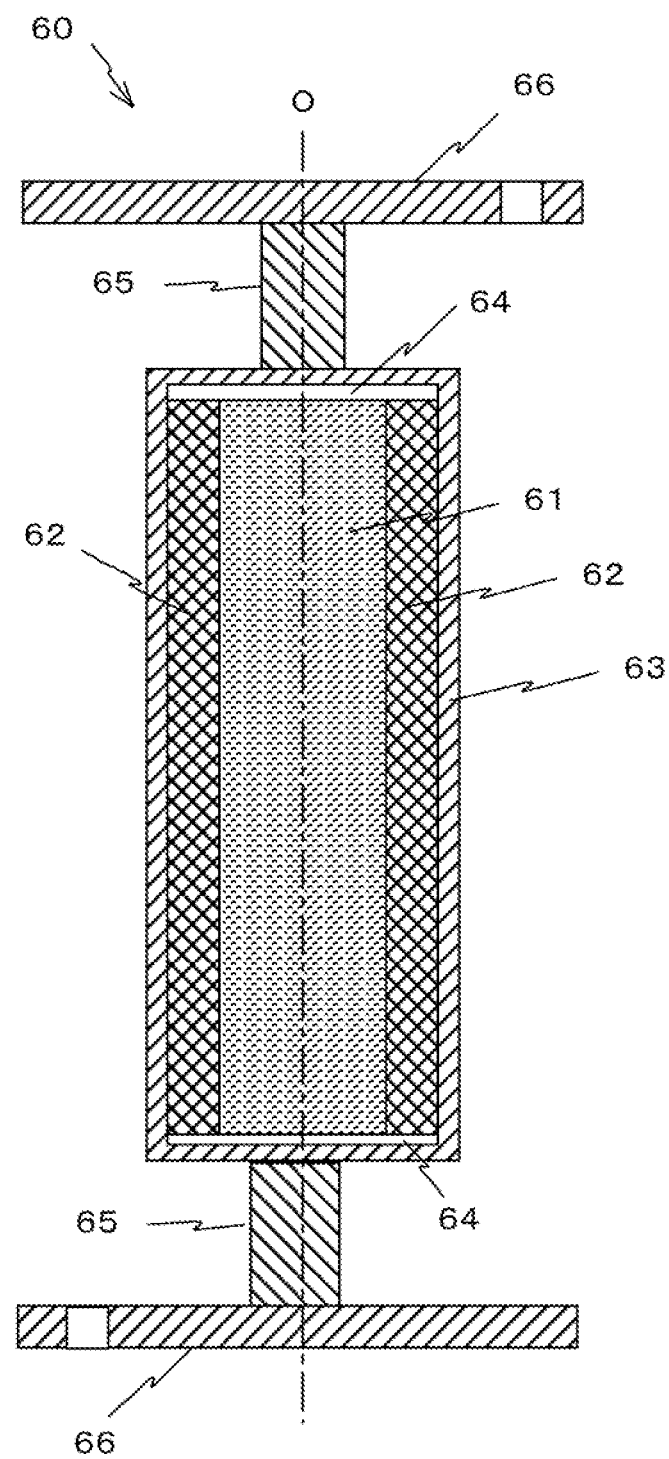
FIG. 32 is a cross-sectional view along a line G-G' of FIG. 31.
Figure 33:
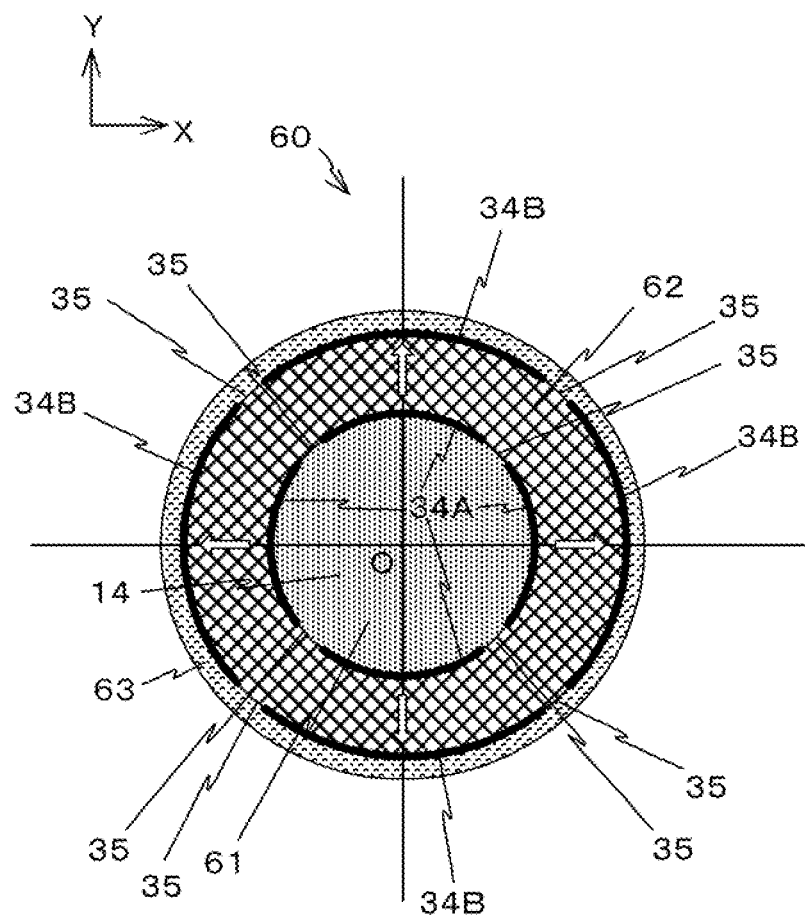
FIG. 33 is a cross-sectional view along a line H-H' of FIG. 31.

FIG. 31 shows an external appearance of a power generating module 60 according to the present embodiment. FIG. 32 is a cross-sectional view along a line G-G' in FIG. 31. FIG. 33 is a cross-sectional view along a line H-H' in FIG. 31.

As is comprehensively shown in FIGS. 31 to 33, the power generating module 60 is a columnar body as a whole around the center axis O in the vertical direction. A columnar deadweight 61 extending in the direction of the predetermined axis O is provided at the innermost circumference side. The deadweight 61 configures a suppressing member. A cylindrical piezoelectric ceramic structure 62 is provided at the outer circumference of the side face of the deadweight 61. The deadweight 61 and the piezoelectric ceramic structure 62 are retained in a cylindrical container 63.

Hollows 64 are formed between the internal bottom face and the ceiling face of the container 63 and the deadweight 61 and the piezoelectric ceramic structure 62. The hollows 64 are provided so as not to suppress a motion of the piezoelectric ceramic structure 62. A cork rubber or stacked paper sheets may be filled in the hollow 64. The water-tightness when a gas is filled in the hollow 64 of the container 63 is set based on the allowable stress of the container 63. Hence, the material of the container 63, the thickness and the structure thereof are selected in order to satisfy the necessary water-tightness.

The container 63 is connected to upper and lower attachment seats 66 via respective buffering members 65. The buffering members 65 are inserted so as not to suppress a vibration by a Karman vortex, etc.

The piezoelectric ceramic structure 62 has the same polarization direction and the layout of electrodes as those of the fourth embodiment. Hence, when the inner circumferential electrodes 34A and the outer circumferential electrodes 34B of the piezoelectric ceramic structure 62 are connected to the power averaging unit 20 like the fourth embodiment, the same operation as that of the fourth embodiment can be realized.

According to the present embodiment, when a Karman vortex is produced at the downstream side of the container 63 and a stress distribution changes due to the Karman vortex, a force is produced which causes the whole container 63 to be displaced. A stress is produced at the piezoelectric ceramic structure 62 by this force and an inertial force that causes the center deadweight 61 to stand still. As explained above, because the deadweight 61 is for producing a stress at the piezoelectric ceramic structure 62 by an inertial force as a fixed point, it is appropriate if the mass thereof is heavier, and when a predetermined mass that produces a sufficient stress at the piezoelectric ceramic structure 62 is known, it is desirable that the mass thereof should be heavier than that known mass.

<Eighth Embodiment>

Next, an explanation will be given of an eighth embodiment of the present invention. The present embodiment employs a different configuration of a power generating module from that of the first embodiment.

Figure 34:
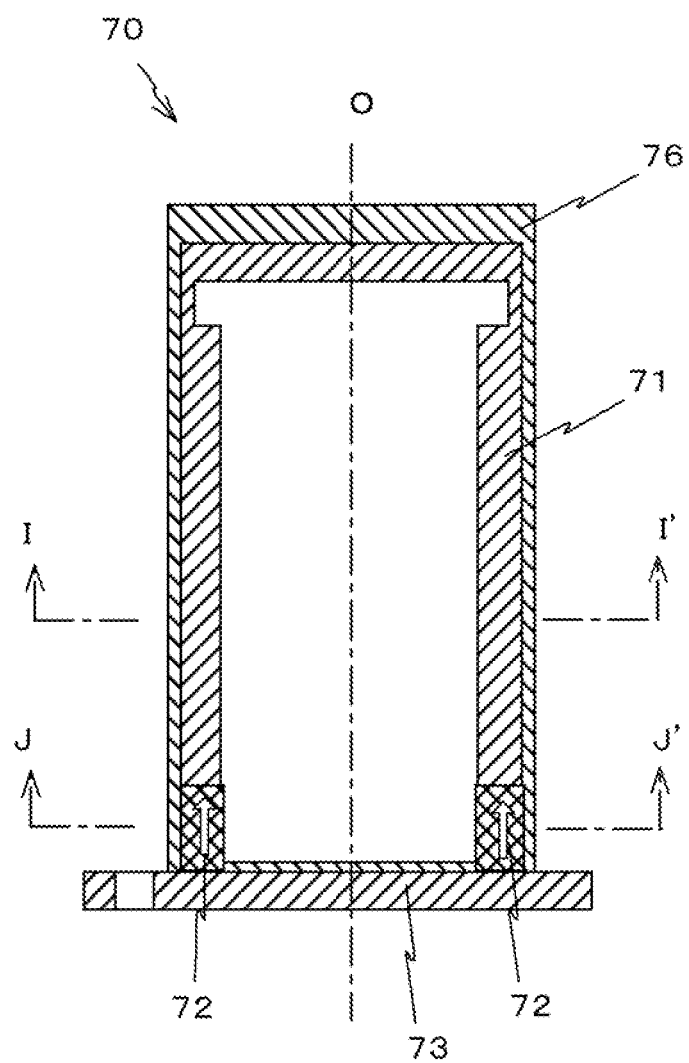
FIG. 34 is a cross-sectional view showing a configuration of a power generating module according to an eighth embodiment of the present invention.
Figure 35:
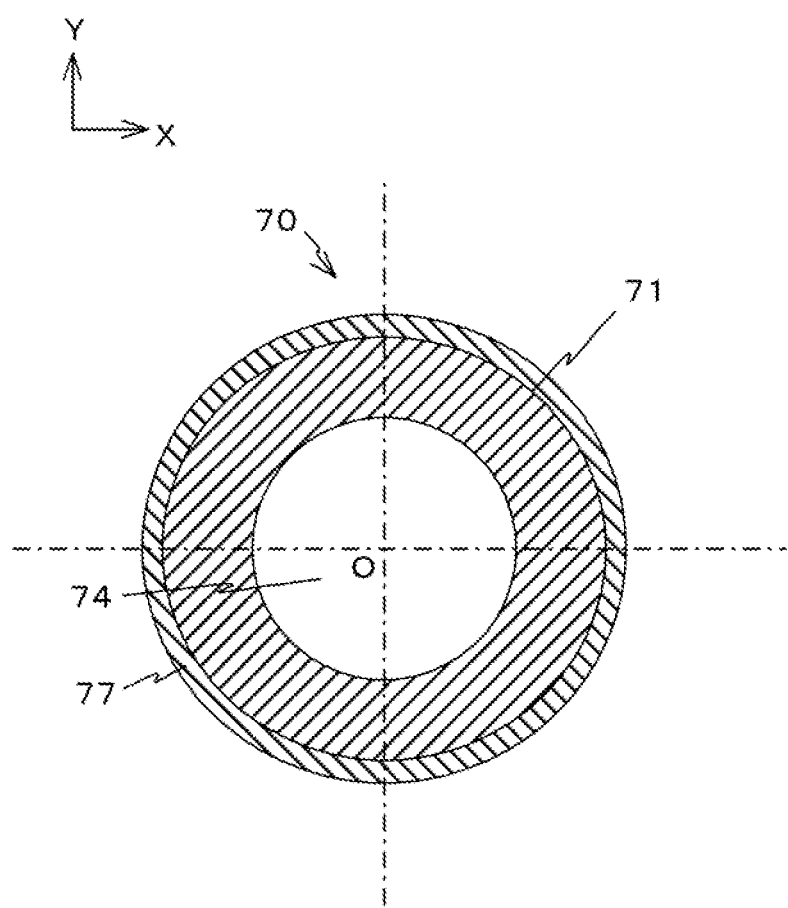
FIG. 35 is a cross-sectional view along a line I-I' of FIG. 34.
Figure 36:
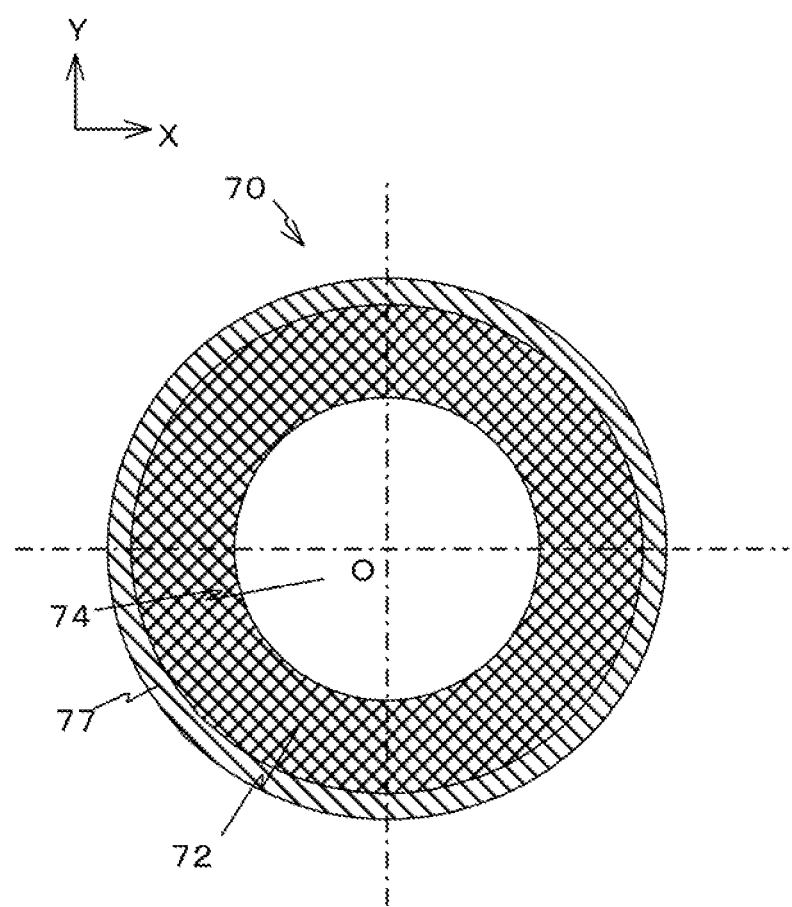
FIG. 36 is a cross-sectional view along a line J-J' of FIG. 34.

FIG. 34 is a cross-sectional view of a power generating module 70 according to the present embodiment. FIG. 35 is a cross-sectional view along a line I-I' in FIG. 34. FIG. 36 is a cross-sectional view along a line J-J' in FIG. 34.

As is comprehensively shown in FIGS. 34, 35, and 36, the power generating module 70 has a pressure-receiving cylinder 71 extending in the direction of the center axis O, and the contour of an orthogonal cross section to the center axis O is rotationally symmetric around the center axis O, more specifically, in a circular shape. A cylindrical piezoelectric ceramic structure 72 is provided at the lower end of the pressure-receiving cylinder 71. The pressure-receiving cylinder 71 is connected to an attachment seat 73 that is a suppressing member via the piezoelectric ceramic structure 72 in the direction of the center axis O. The pressure-receiving cylinder 71 and the piezoelectric ceramic structure 72 configure a cantilever beam with a supporting point that is the attachment seat 73.

Figure 37:
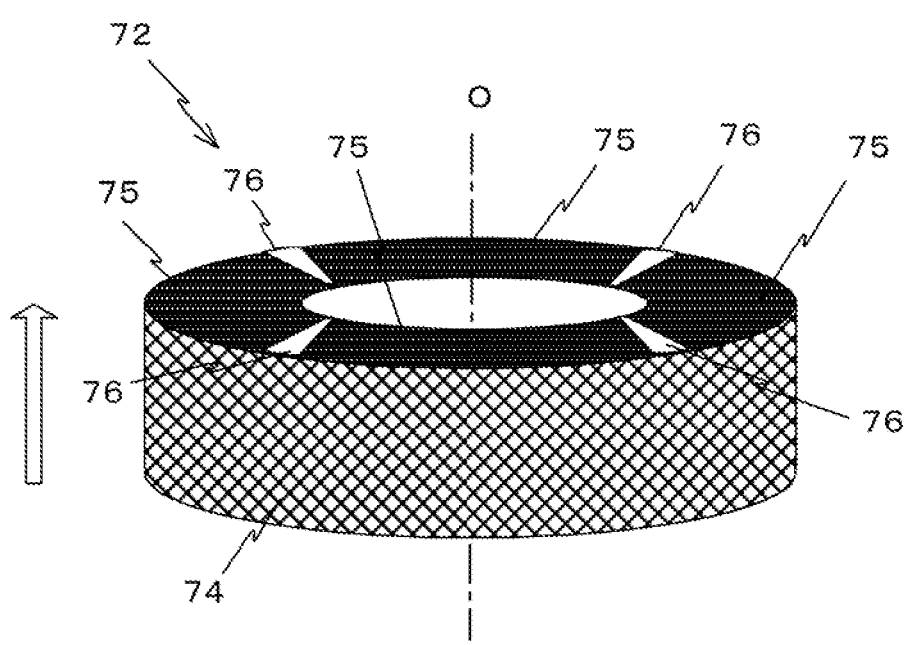
FIG. 37 is a diagram showing a configuration of a piezoelectric ceramic module.

The piezoelectric ceramic structure 72 has a polarization direction that is in the direction of the center axis O (the thickness direction). In the present embodiment, the polarization direction of the piezoelectric ceramic structure 72 is arranged upwardly of the direction of the center axis O (the thickness direction), but may be arranged downwardly thereof. FIG. 37 shows a perspective view of the piezoelectric ceramic structure 72.

Four electrodes 75 that are arranged evenly in the circumferential direction are formed at the upper face side of a piezoelectric element 74 that configures the piezoelectric ceramic structure 72. Moreover, four divided electrodes 75 arranged evenly in the circumferential direction are formed at the lower face side of the piezoelectric element 74. The upper and lower divided electrodes 75 correspond one by one. An electrode divider 76 that is an insulator for dividing the electrodes is provided between adjoining divided electrodes 75. According to this configuration, the piezoelectric ceramic structure 72 also employs a configuration with plural piezoelectric modules arranged so as to face one another around the center axis O. Accordingly, by connecting respective divided electrodes 75 to the power averaging unit 20 like the first embodiment, the same operation as that of the first embodiment can be realized.

That is, the piezoelectric ceramic structure 72 has a pair of piezoelectric modules arranged so as to face with each other around the center axis O and connected in a cascade connection manner with respective electrodes at the same side in the polarization direction being connected together. The power averaging unit 20 has the rectifier circuits 23A and 23B where voltages of respective pairs of piezoelectric modules connected in a cascade connection manner are input.

Figure 38:
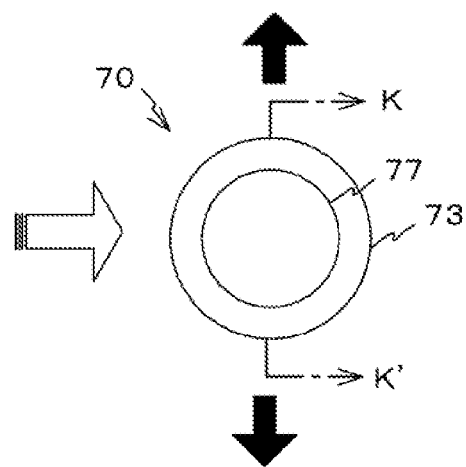
FIG. 38 is a top view of the power generating module.
Figure 39A:
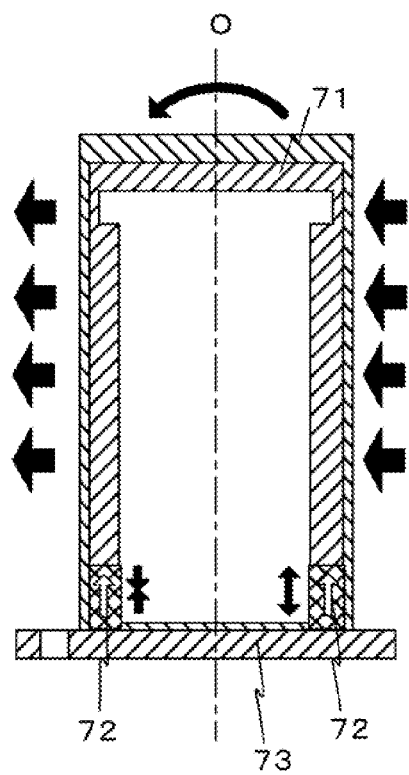
FIG. 39A is a diagram showing how a bending stress is produced.
Figure 39B:
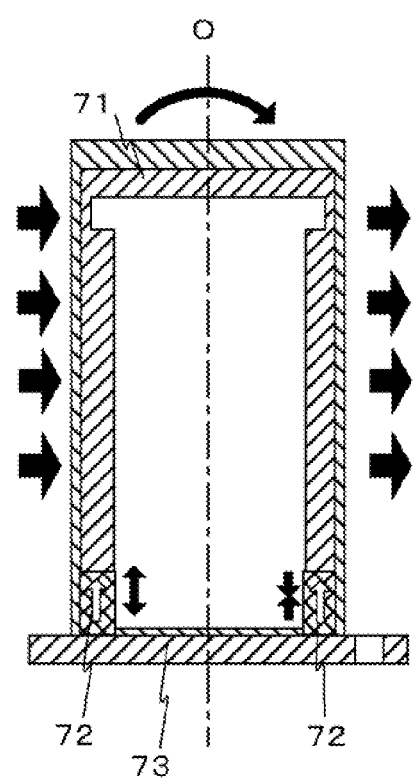
FIG. 39B is a diagram showing how a bending stress is produced.

FIG. 38 is a diagram showing the power generating module 70 as viewed from the above. As shown in FIG. 38, when the pressure-receiving cylinder 71 receives the flow of ocean stream indicated by a whitened arrow, an external force is applied to the pressure-receiving cylinder 71 which causes the pressure-receiving cylinder 71 to vibrate in the direction orthogonal to the flow of ocean stream. This external force produces a bending stress at the pressure-receiving cylinder 71 and the piezoelectric ceramic structure 72 with the attachment seat 73 being as a supporting point as shown in a K-K' cross-sectional view of FIGS. 39A and 39B. This bending stress produces a compression stress and a tensile stress in the height direction (the vertical direction) at the piezoelectric ceramic structure 72.

These stresses produce an electric field inside the piezoelectric ceramic structure 72, and based on a voltage originating from the electric field, a voltage output through the power averaging unit 20 is applied across the load terminals 36.

Figure 40:
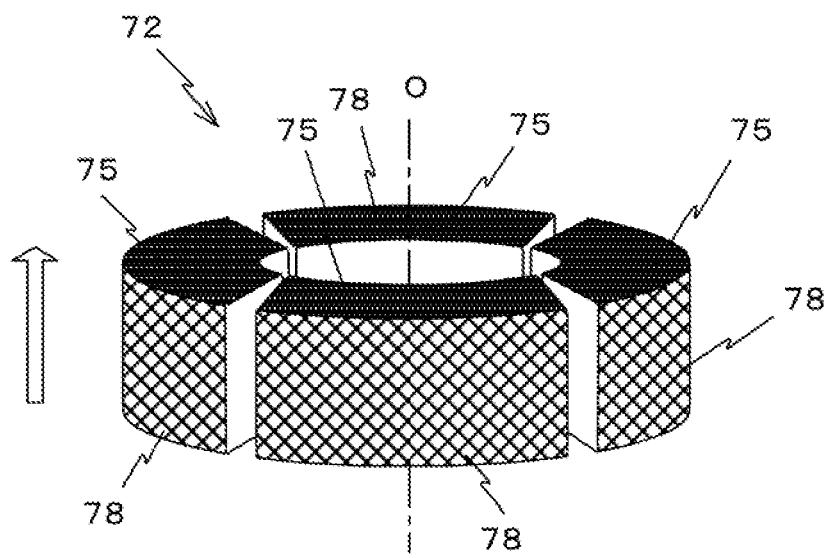
FIG. 40 is a diagram showing (first) other illustrative configuration of a piezoelectric ceramic module.
Figure 41:
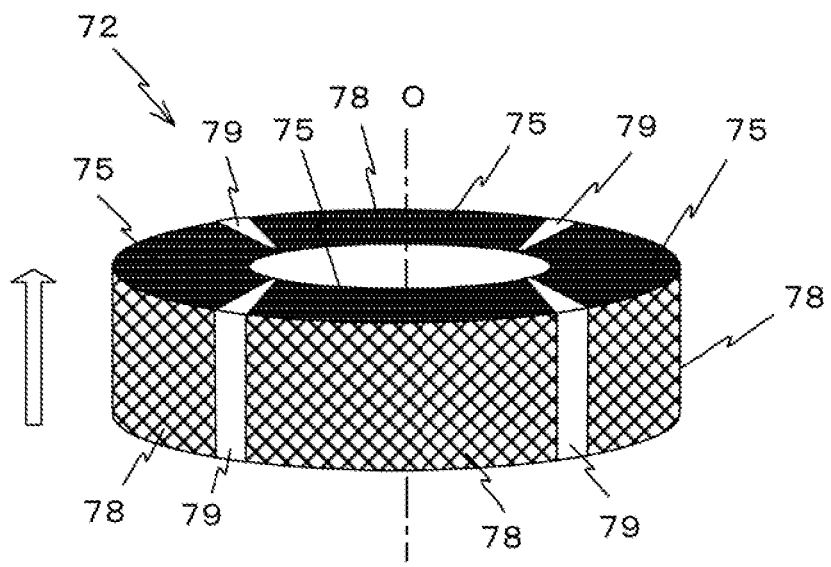
FIG. 41 is a diagram showing (second) other illustrative configuration of a piezoelectric ceramic module.

As shown in FIG. 40, a piezoelectric ceramic structure 72 can be used which employs a configuration in which piezoelectric elements 78 are arranged evenly in the circumferential direction. Moreover, as shown in FIG. 41, a piezoelectric ceramic structure 72 formed in a cylindrical shape as a whole can be used by sandwiching insulators 79 between adjoining ones of piezoelectric elements 78 divided into four pieces.

As explained above, the pressure-receiving cylinder 71 and the piezoelectric ceramic structure 72 are cantilever beams with the attachment seat 73 being as a supporting point. Hence, when the resonant frequencies of the cantilever beams are set to be consistent with the frequency of vibration produced by a stress variation by a Karman vortex, etc., by adjusting the materials and thicknesses of the pressure-receiving cylinder 71 and the piezoelectric ceramic structure 72 and by optimizing respective masses and rigidities, a stress produced at the piezoelectric ceramic structure 72 can be increased, thereby obtaining power more efficiently.

Figure 42:
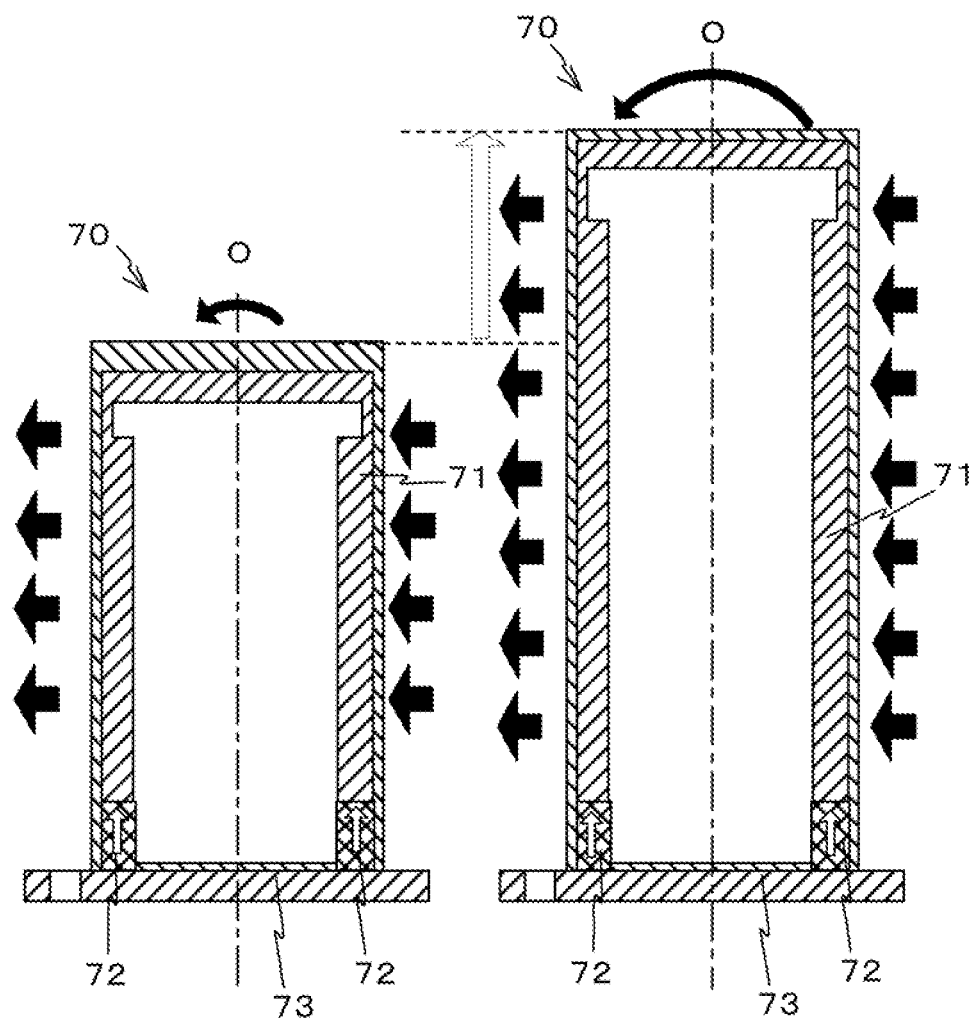
FIG. 42 is a diagram showing a relationship between the whole length of a pressure-receiving cylinder and a stress.

Moreover, as shown in FIG. 42, when the whole length of the pressure-receiving cylinder 71 is extended, a stress produced at the piezoelectric ceramic structure 72 can be increased. Accordingly, the longer the whole length of the pressure-receiving cylinder 71 is, the more power can be obtained.

Figure 43:
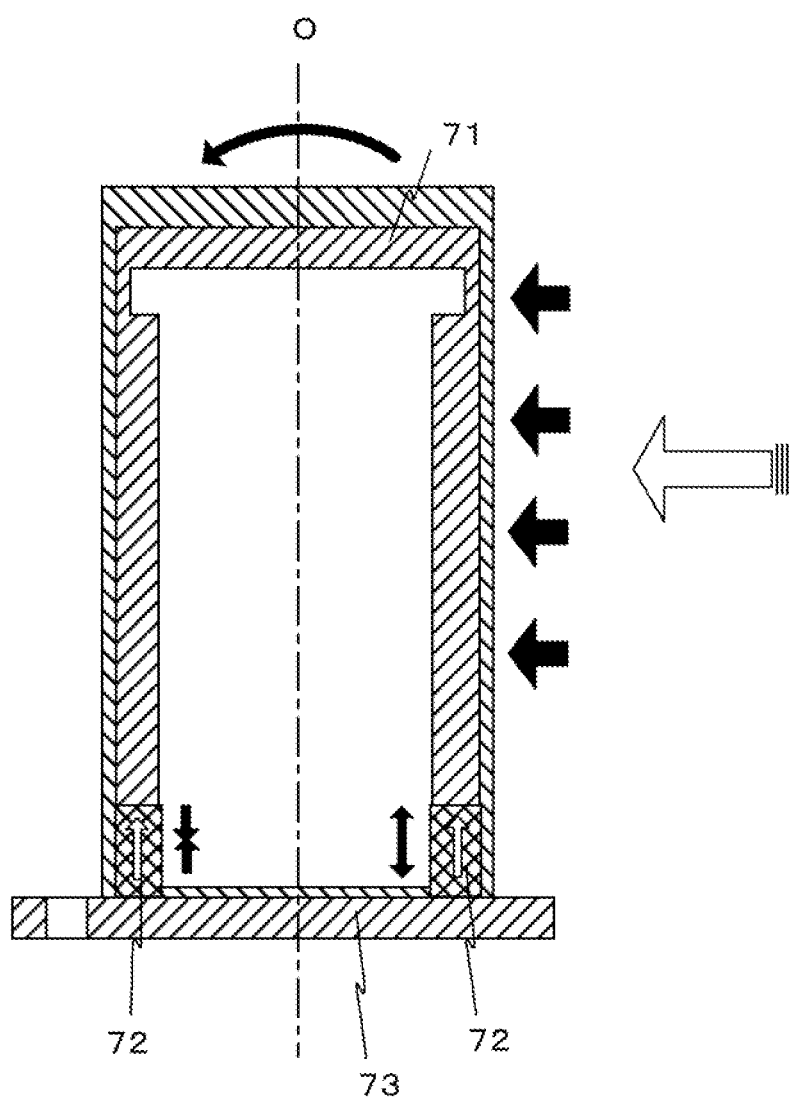
FIG. 43 is a diagram for explaining how a stress is produced when installed near a seacoast.

Furthermore, the power generating module 70 can be installed in the vicinity of a seacoast. In this case, as shown in FIG. 43, it is possible to generate power by utilizing ocean waves repeatedly applied in a direction.

Figure 44:
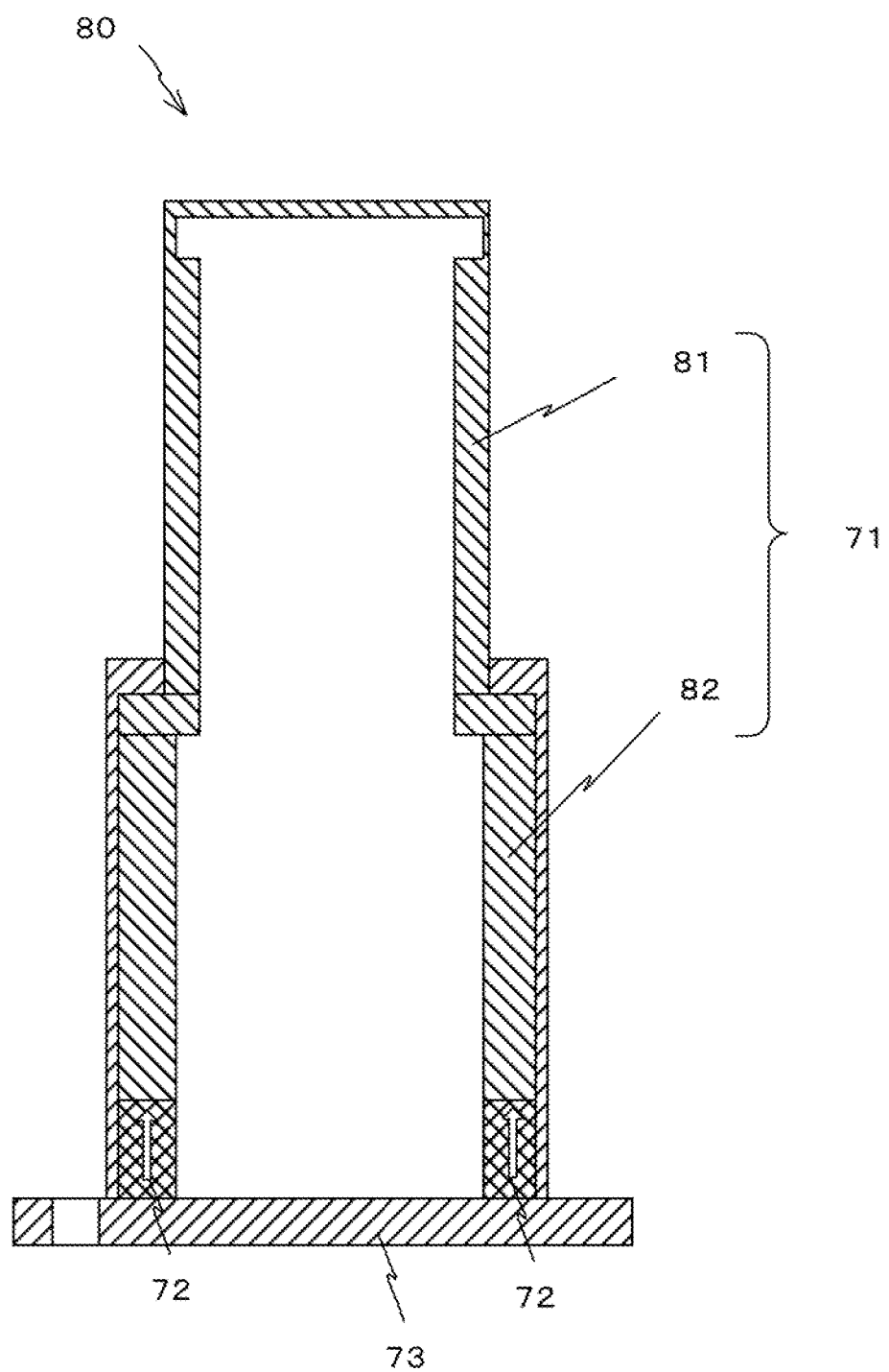
FIG. 44 is a cross-sectional view showing a power generating module having plural cylinders with different radii.

Meanwhile, the generation condition of a Karman vortex at the downstream side of the pressure-receiving cylinder 71 depends on the flow speed of a fluid and the diameter of the pressure-receiving cylinder 71. Hence, like a power generating module 80 shown in FIG. 44, the pressure-receiving cylinder 71 may comprise cylinders 81 and 82 having different diameters and coupled in the direction of the center axis O. That is, an outer circumferential side face of a stress producing member may be formed by connecting plural columnar bodies having different sizes of orthogonal cross sections to the center axis O in series in the direction of the center axis O. This enhances the condition of the flow speed of a fluid which generates a Karman vortex. Accordingly, it becomes possible to surely generate a Karman vortex within a wider flow speed range, to produce a stress originating from that Karman vortex, and to obtain power more efficiently.

<Ninth Embodiment>

Next, an explanation will be given of a ninth embodiment of the present invention. The present embodiment differs from the first embodiment in that a power generating module is distant from a sensor module.

Figure 45:
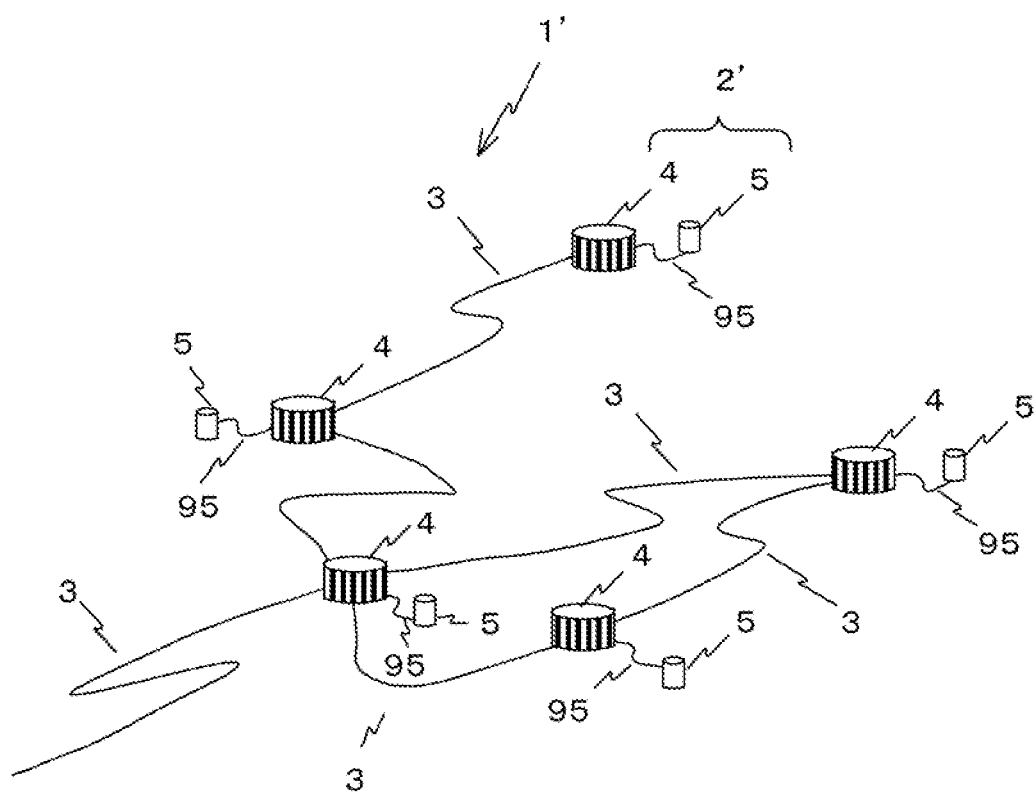
FIG. 45 shows a whole configuration of a marine-environment-measuring-sensor net according to a ninth embodiment of the present invention.

FIG. 45 shows a configuration of a marine-environment-measuring-sensor net 1' of the present embodiment. As shown in FIG. 45, the marine-environment-measuring-sensor net 1' includes plural marine environment measuring sensors 2'.

The marine environment measuring sensor 2' has a sensor module 4 and a power generating module 5 arranged distant from each other at equal to or larger than a predetermined distance. It is appropriate if such a distance is in some level which does not cause the sensor module 4 to be affected by fluid sound at the power generating module 5 at the time of measurement.

The sensor module 4 and the power generating module 5 are connected through a power feeding cable 95. Power from the power generating module 5 is supplied to the sensor module 4 through the power feeding cable 95. Respective sensor modules 4 are connected together through signal transmitting cables 3.

The marine-environment-measuring-sensor-net 1' of the present embodiment is especially appropriate for a case in which fluid sound generated at the power generating module 5, etc., affects a measurement by the sensor module 4 as noises when measuring sound, vibration, etc. By setting the power generating module 5 distant from the sensor module 4, it is possible to reduce the effect thereof.

<Tenth Embodiment>

Figure 46:
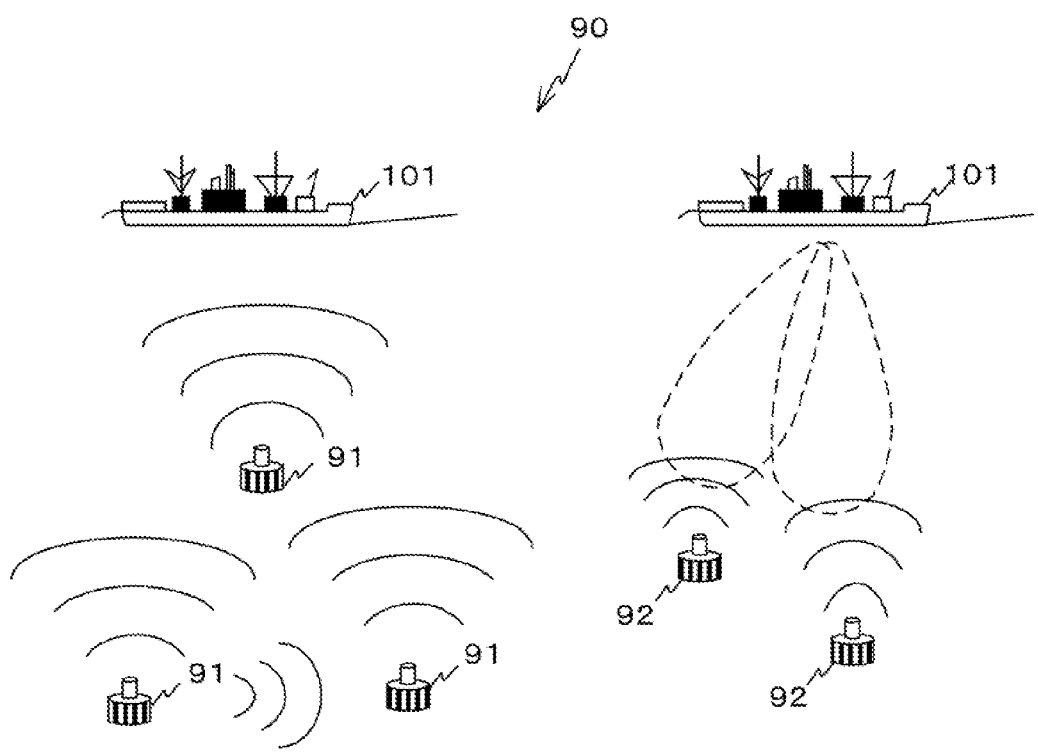
FIG. 46 shows a whole configuration of a marine-environment-measuring-sensor net according to a tenth embodiment of the present invention.

Next, an explanation will be given of a tenth embodiment of the present invention. A marine-environment-measuring-sensor net 90 of the present embodiment differs from the first embodiment in that a marine environment measuring sensor is not connected to a signal transmitting cable 3 for transmitting measurement information to a relay, a land station, etc. FIG. 46 shows a configuration of the marine-environment-measuring-sensor net 90 according to the present embodiment. According to the present embodiment, the marine-environment-measuring-sensor net 90 utilizes underwater acoustics for transmitting measurement information.

According to the present embodiment, employed as the marine environment measuring sensor is either one of a marine environment measuring sensor 91 that has a pinger function generating an acoustic signal periodically or a marine environment measuring sensor 92 that has a responder function generating a repeated acoustic signal in response to an acoustic signal from an observation ship. Both marine environment measuring sensors 91 and 92 have a sensor module 4 and a power generating module 5.

A pinger function simply means, in general, a function of acoustically emitting a predetermined signal (a pinger sound) periodically. In the present embodiment, the marine environment measuring sensor 91 emits measurement information as an acoustic signal together with a pinger sound.

Moreover, a responder function means, in general, a function of responding a predetermined acoustic signal with an acoustic signal from an observation ship, a buoy, or a measurement buoy or a relay buoy dropped from an aircraft being as a trigger. In the present embodiment, the marine environment measuring sensor 92 emits an acoustic signal as a response including measurement information obtained by the marine environment measuring sensor.

Both pinger function and responder function are driven by power supplied from the power generating module 5.

As shown in FIG. 46, the marine environment measuring sensor 91 periodically emits an acoustic signal at a short time, and an observation ship 101 on the ocean receives this acoustic signal, and obtains measurement information included in the acoustic signal by receiving the acoustic signal emitted from the marine environment measuring sensor 91.

The pinger function has a one-way transmission characteristic from an ocean bottom to an ocean surface, so that it is necessary to periodically transmit measurement information at a predetermined time. In contrast, when the responder function is used, it is appropriate if measurement is carried out only when there is a request signal from the observation ship 101, so that power necessary for measurement can be reduced at minimum. As a result, measurement for a longer period is enabled.

As explained above, by using the pinger function or the responder function, when a driving time and a season thereof are set beforehand, the power consumption can be remarkably reduced, and a continuous measurement for extremely longer period is enabled by generating power using regenerable energy like ocean stream.

Such a system is appropriate for a case in which a long period is requisite in order to measure a measurement target like a movement of an ocean bottom itself originating from an earthquake or a volcanic activity. For example, when an acoustic signal at a short time is periodically emitted by using the pinger function and when an emission location thereof is measured, information on a movement of an ocean bottom can be obtained. Moreover, when the responder function is used, a movement of the ocean bottom can be measured for a longer period.

A moored buoy or a measurement buoy or a relay buoy dropped from an aircraft may be used instead of the observation ship 101 on the ocean. When the marine environment sensor 91 has a relay function, information from another marine environment sensor 91 can be transmitted as an acoustic signal not through the signal transmitting cable.

<Eleventh Embodiment>

Figure 47:
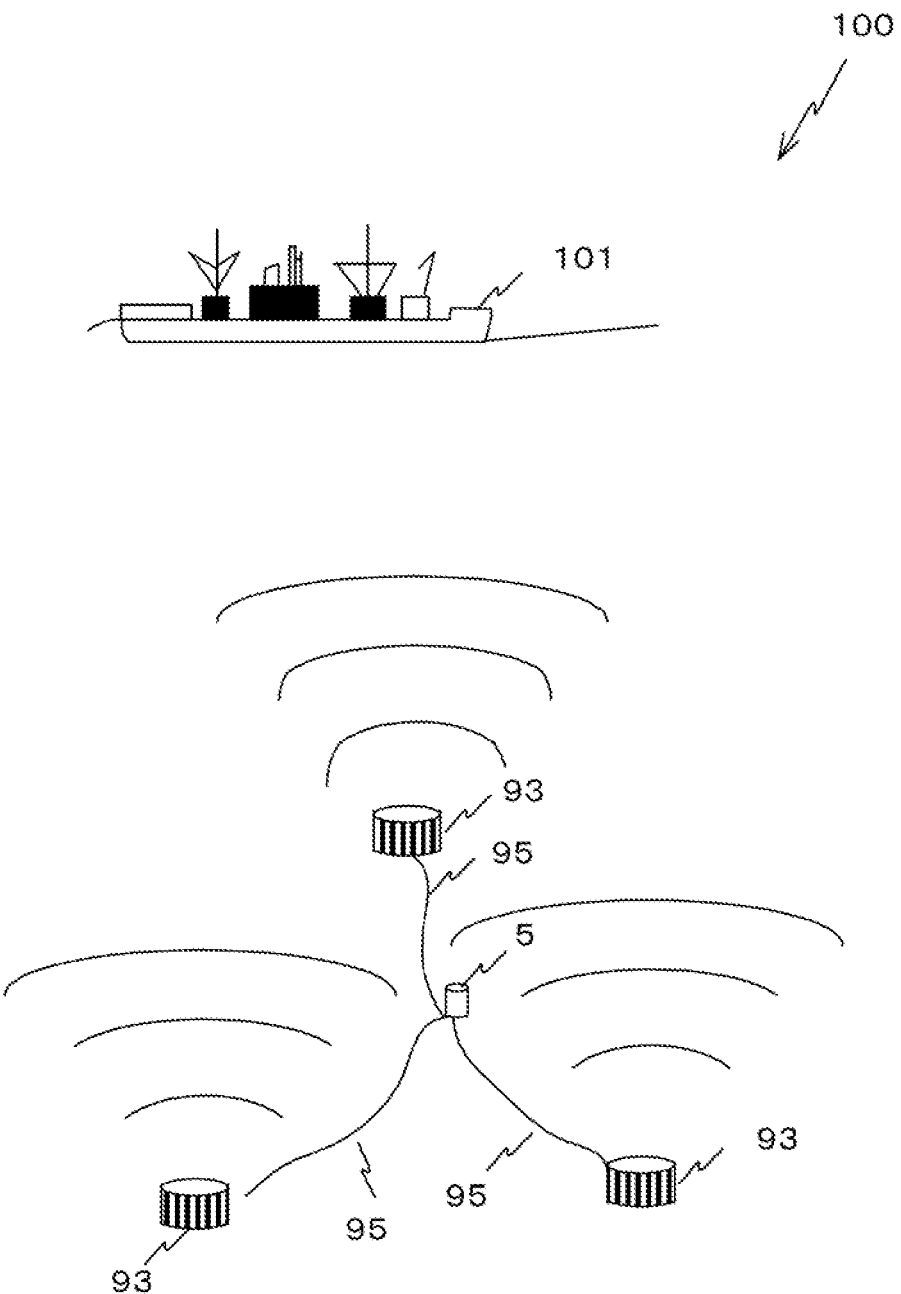
FIG. 47 shows a whole configuration of a marine-environment-measuring-sensor net according to an eleventh embodiment of the present invention.

Next, an explanation will be given of an eleventh embodiment of the present invention. FIG. 47 is a perspective view showing a marine-environment-measuring-sensor net 100 according to the present embodiment. As shown in FIG. 47, the marine-environment-measuring-sensor net 100 of the present embodiment includes plural marine environment measuring sensors 93. The marine environment measuring sensor 93 differs from the marine environment measuring sensor 91 of the tenth embodiment which has no power generating module. Power is supplied to the marine environment measuring sensors 93 from a power generating module 5 through power feeding cables 95.

Like the tenth embodiment, the marine environment measuring sensor 93 periodically emits an acoustic signal by the pinger function. It is needless to say that a marine environment measuring sensor having the responder function can be used instead of the marine environment measuring sensor 93.

The marine environment measuring sensor 93 is appropriate for a case in which measurement frequency of each marine environment measuring sensor 93 is further little and extremely little power consumption is sufficient for each marine environment measuring sensor 93.

<Twelfth Embodiment>

Figure 48:
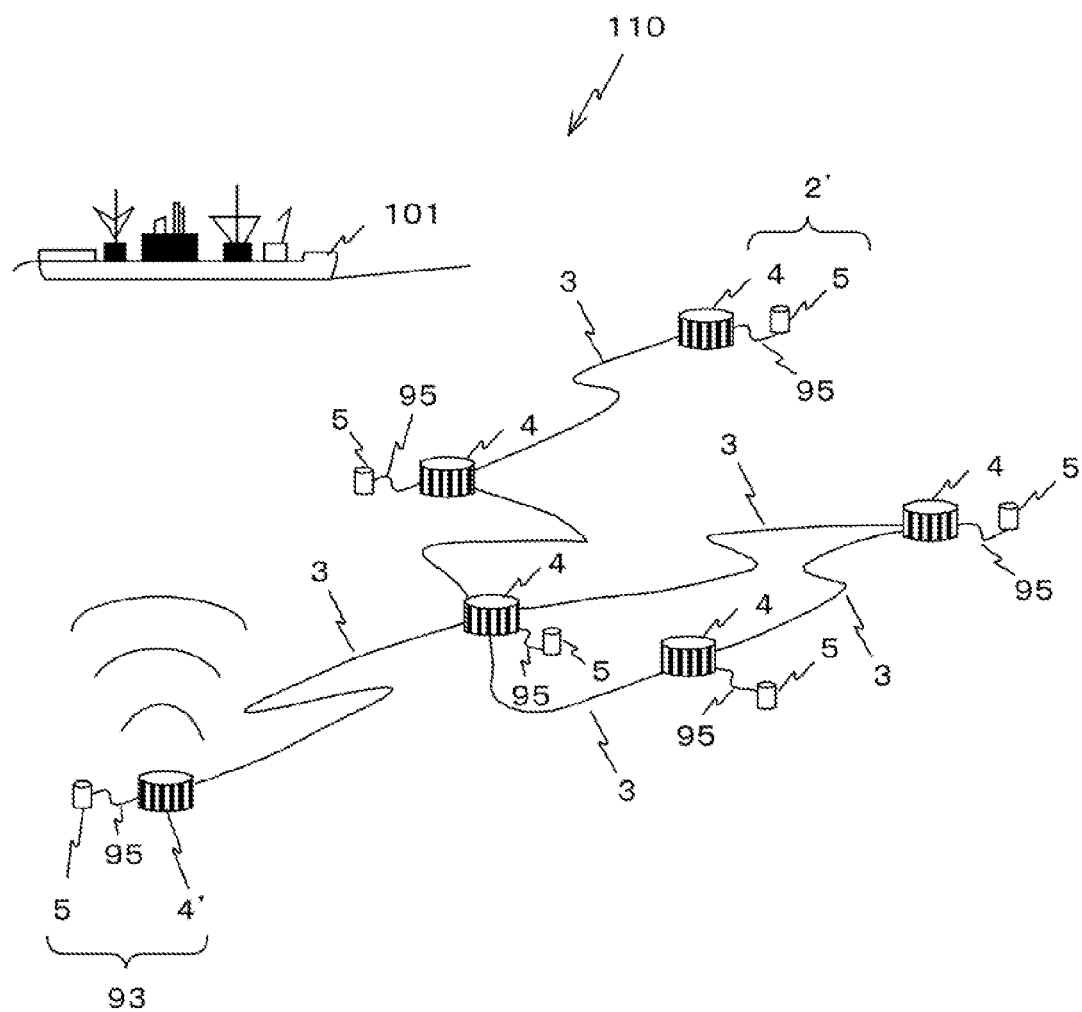
FIG. 48 shows a whole configuration of a marine-environment-measuring-sensor net according to a twelfth embodiment of the present invention.

Next, an explanation will be given of a twelfth embodiment of the present invention. FIG. 48 is a perspective view showing a marine-environment-measuring-sensor net 110 of the present embodiment. As shown in FIG. 48, the marine-environment-measuring-sensor net 110 includes plural marine environment measuring sensors 2'. Each marine environment measuring sensor 2' has a sensor module 4 and a power generating module 5 arranged distant from each other. The sensor modules 4 of respective marine environment measuring sensors 2' are connected together through signal transmitting cables 3.

The marine-environment-measuring-sensor net 110 further includes a marine environment measuring sensor 93 having the pinger function. The marine environment measuring sensor 93 also has a sensor module 4' and the power generating module 5 arranged distant from each other. The sensor module 4' is connected to the other sensor module 4 through the signal transmitting cable 3.

According to the marine-environment-measuring-sensor net 110, pieces of marine environment measurement information of respective sensor modules 4 are collected by the sensor module 4'. The sensor module 4' transmits an acoustic signal including measurement information to the observation ship 101 on the ocean. As explained above, power from the power generating module 5 is used for this transmission. Moreover, as explained above, an acoustic signal may be transmitted to a moored buoy or a measurement buoy or a relay buoy dropped from an aircraft instead of the observation ship 101.

<Thirteenth Embodiment>

Figure 49:
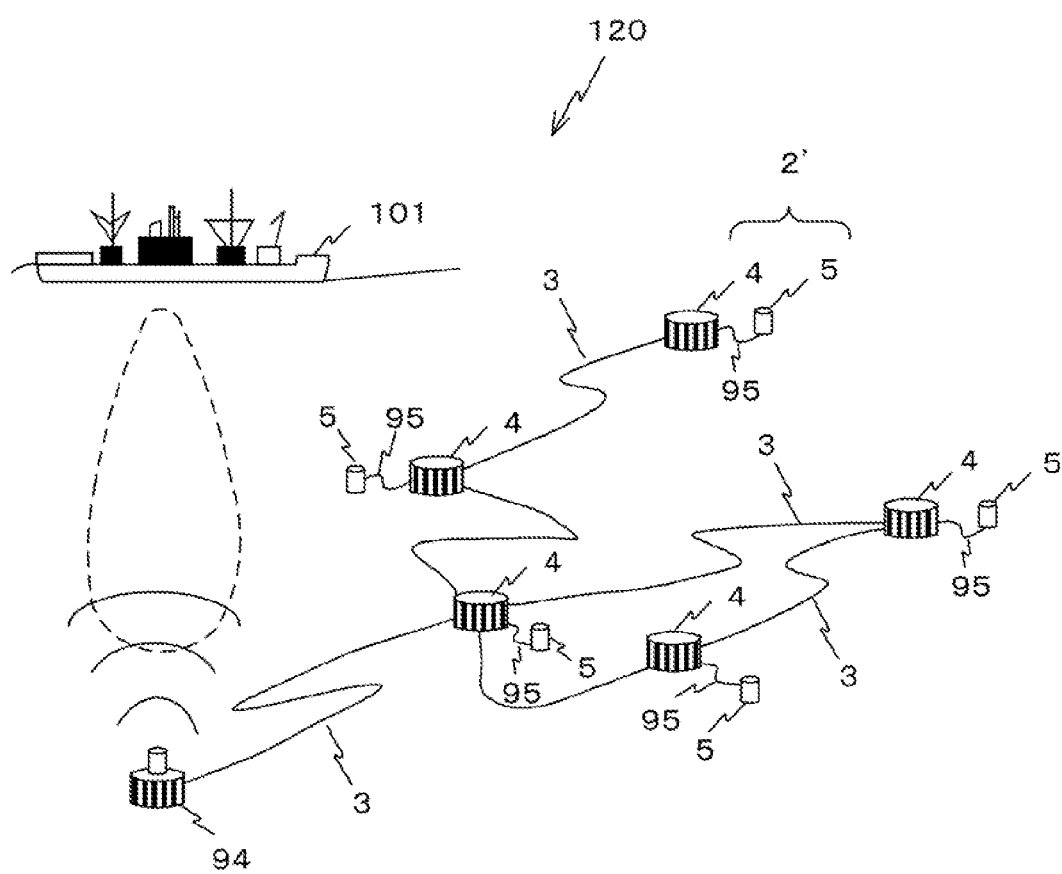
FIG. 49 shows a whole configuration of a marine-environment-measuring-sensor net according to a thirteenth embodiment of the present invention.

Next, an explanation will be given of a thirteenth embodiment of the present invention. FIG. 49 is a perspective view showing a marine-environment-measuring-sensor net 120 according to the present embodiment. As shown in FIG. 49, the present embodiment differs from the eleventh embodiment in that a marine environment measuring sensor 94 with the responder function is used instead of the marine environment measuring sensor 93 with the pinger function. The marine environment measuring sensor 94 has a sensor module and a power generating module integrated together. Power from the power generating module is used for the responder function.

<Overview>

As explained above in detail, according to respective embodiments, the marine environment measuring sensor 2, etc., installed on an ocean bottom or the like is a locally-power-generating type sensor provided with the sensor module 4 and the power generating module 5. Power necessary for sensing, etc., is supplied from the power generating module 5, etc., arranged in the vicinity of the sensor module 4, etc. Accordingly, no external power is necessary.

The power generating module 5, etc., generates power using a regenerable fluid energy (a fluid force) included in an ocean stream. Hence, as long as ocean stream is flowing around such a module, power generation is possible. Accordingly, it becomes unnecessary to build a primary battery in the sensor and to supply power from the land. Therefore, the life of the sensor can be extended, a measurement for a long period and a continuous management are enabled, and a real-time measurement of a marine environment, etc., is also enabled. Moreover, it is unnecessary to draw a power feeding cable, etc., and to build a complex power supply system, so that a highly-frequent maintenance becomes unnecessary and a cost requisite for establishing a sensor net can be reduced.

Moreover, the power generating module of each of the above-explained embodiments generates power using a fluid energy of an ocean stream, so that power generation is possible even at an ocean bottom where there is no wave and no sunlight reaches. Accordingly, a measurement at an ocean bottom is enabled using the power obtained by this power generation.

Furthermore, the power generating module of each of the above-explained embodiments generates power using a piezoelectric element, so that no mechanical moving part is necessary which rotates, slides, or makes a displacement. Accordingly, a structure with a superior water-tightness can be realized. Moreover, because the structure can be simplified, it is possible to suppress a reduction of the device strength. Furthermore, a reduction of the power generation efficiency originating from a mechanical loss can be suppressed. Therefore, the power generating module of each of the above-explained embodiments enables stable measurement and continuous maintenance for a long time, and reduction of the device cost.

The power generating module of each of the above-explained embodiments will be briefly and comprehensively explained. The power generating module is provided with a stress producing member which produces a stress thereinside originating from a stress varying produced by a fluid around such a module. The stress producing member is a columnar body extending in the direction of the center axis O, and has an outer circumferential side face which is the orthogonal cross section to the center axis O and which is rotationally symmetrical around the predetermined axis O. Moreover, the stress producing member employs a piezoelectric module structure having a pair of piezoelectric ceramic modules arranged in a rotationally symmetric manner around the center axis O, the piezoelectric ceramic module including a piezoelectric ceramic and electrodes connected thereto at both ends of the polarization direction of the piezoelectric ceramic.

The power generating module is also provided with a suppressing member that suppresses a displacement of the stress producing member. The suppressing member is connected to one end of each of the plural piezoelectric ceramic modules in the polarization direction. The suppressing member allows the stress producing member to produce a stress, and each of the plural piezoelectric ceramic modules generates a voltage.

The power generating module is further provided with an adder that adds voltages output by respective piezoelectric modules.

As explained above, according to the power generating module according to each of the above-explained embodiments, the cross-sectional shape of the stress producing member which receives a force from a fluid and which produces a stress is in a rotationally symmetrical shape around the center axis O, and the plural piezoelectric modules are arranged in a rotationally symmetrical manner around the center axis O. Accordingly, power can be generated at a constant efficiency regardless of the direction in which an ocean stream is coming.

In a shallow marine range, the flow of sea tide is dominant, and the direction in which an ocean stream is coming changes day by day together with time, and is not constant. However, the flow of ocean stream is a flow in a substantially horizontal direction, and does not become an extraordinarily upward flow or downward flow. Accordingly, it is sufficient if obtaining of an electrical output is enabled no matter in which direction on a horizontal plane a flow is coming.

Conversely, in a deep ocean range, there is no extraordinarily upward flow or downward flow, and a tidal stream with substantially constant flow direction and flow speed is produced near an ocean bottom. This tidal stream is referred to as a bottom flow. Hence, it is sufficient if obtaining of an electrical output is enabled no matter in which direction on a horizontal plane a flow is coming in the case of the deep ocean bottom.

At the deep ocean range, the direction of the bottom flow is constant, power generating modules which can generate power using an ocean stream from a direction can sufficiently generate power. However, at the deep ocean bottom, management of a sensor installation direction needs a large amount of work and time. Accordingly, it is desirable to use the marine environment measuring sensor 2, etc., of the above-explained embodiments which can obtain an electrical output no matter in which direction on a horizontal plane a flow is corning and which does not need a management of an installation direction.

When a total electric generation capacity is calculated based on estimation on a fluid speed and a time, and when the configuration, the diameter, etc., of the pressure-receiving cylinder 11 or the like are selected based on the calculated total electric generation capacity, most appropriate power generation is realized.

As explained above, according to each of the above-explained embodiments, a highly-frequent maintenance and a troublesome work are unnecessary, and a highly-efficient power supply and a real-time measurement are enabled regardless of the direction in which a fluid flows with a simple configuration and a high reliability for a long time. Accordingly, establishment and operation of a marine-environment-measuring-sensor net are simplified, the fault tolerance, the reliability, the expandability, and the serviceability are improved, and the initial cost and the maintenance cost are dramatically reduced.

Moreover, adjoining sensors can be connected by an optical fiber, etc., so that drawing of an extensive metal cable becomes unnecessary.

Like each of the above-explained embodiments, when the polarization direction of the piezoelectric ceramic modules 15 is arranged outwardly or inwardly of the radial direction, a connection between adjoining piezoelectric ceramic modules 15 is facilitated. Regarding the piezoelectric ceramic modules 15 facing with each other in the X axis direction or in the Y axis direction, respective polarization direction need not be arranged outwardly or inwardly of the radial direction, unlike each of the above-explained embodiments. In this case, it is necessary to pay attention to the layout of respective piezoelectric ceramic modules 15 such that electrodes connected between the facing piezoelectric ceramic modules 15 are set to be in opposite polarities.

According to each of the above-explained embodiments, in order to obtain a uniform power generation efficiency regardless of the direction in which an ocean stream is coming, the columnar member is in a cylindrical shape. However, when the sensor is installed in a deep ocean range or a river where a tidal stream is constant or in a channel or a bay entrance where a tidal stream is reversed in an opposite direction, the cross-sectional shape of the column that produces a stress may be in a finned shape symmetrical in the direction of the tidal stream. This configuration improves producing of a stress more efficiently.

Moreover, according to each of the above-explained embodiments, a Karman vortex is produced and a stress is produced by the Karman vortex, thereby obtaining power. According to the present invention, however, it is not always necessary to produce a steady Karman vortex, and power generation is enabled as long as a non-uniform stress distribution is generated by a fluid around the column. Accordingly, power generation is enabled efficiently even if the column is not in a shape or a size that generates a steady Karman vortex.

Figure 50:
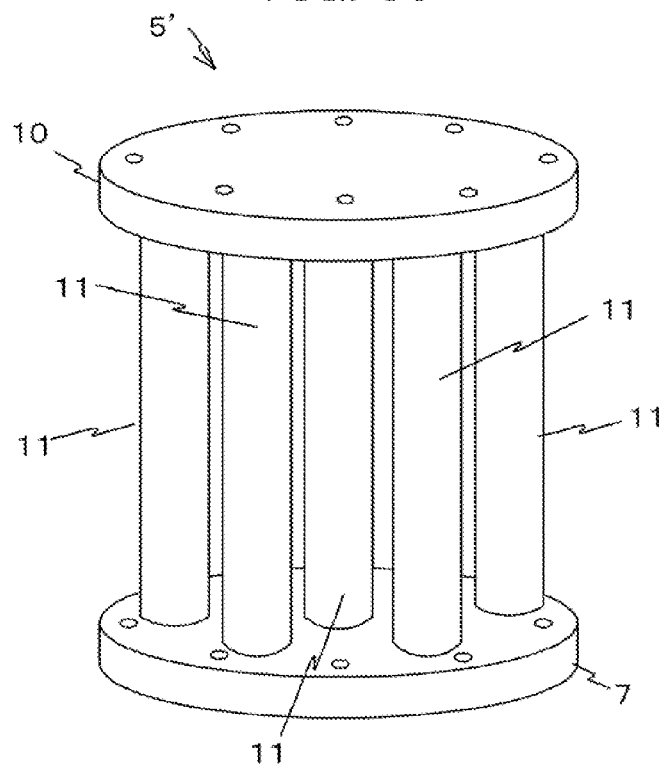
FIG. 50 is a diagram showing a power generating module with plural pressure-receiving cylinders.

For example, as shown in FIG. 50, a power generating module 5' can be used which has plural pressure-receiving cylinders 11 arranged in the vicinity of respective ones. When the power generating module 5' is installed in a fluid, a turbulence is generated at the downstream side of such a module. This kind of turbulence can periodically change the stress distribution around the pressure-receiving cylinder 11, so that a stress is produced at the piezoelectric ceramic structure 12 inside each pressure-receiving cylinder II, and thus power generation is enabled.

Figure 51:
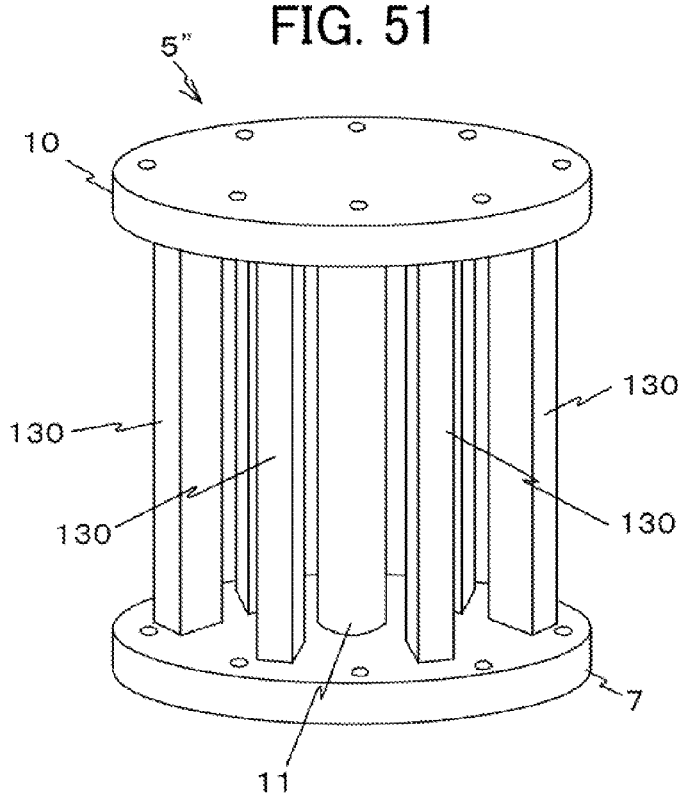
FIG. 51 is a diagram showing a power generating module with a turbulence generating body.

As explained above, according to the present invention, power generation is possible as long as a pressure difference of a fluid is generated around the pressure-receiving cylinder 11. For example, as shown in FIG. 51, a power generating module 5" may be used which has plural structural objects 130 arranged in the vicinity of the pressure-receiving cylinder 11 for producing a turbulence. When the power generating module 5" is installed in a fluid, a turbulence is produced in the vicinity of pressure-receiving cylinder 11, the piezoelectric ceramic structure 12 in the pressure-receiving cylinder 11 is caused to produce a stress, thereby obtaining power.

In the cases of FIGS. 50 and 51, the plurality of pressure-receiving cylinders 11 and structural objects 130 are arranged on the common attachment seat 7, the plurality of power generating modules 5 may be arranged close to each other so as to produce a turbulence, or a turbulence generating body which is a separate object from the power generating module 5 may be arranged in the vicinity of the power generating module 5.

Like the Karman vortex, regarding the lengthwise direction of the pressure-receiving cylinder 11, when a vortex having a uniform variation in the stress distribution is generated at the downstream side of the pressure-receiving cylinder 11, the longer the pressure-receiving cylinder 11 is, the more the stress is increased. However, like a turbulence, regarding the lengthwise direction of the pressure-receiving cylinder 11, when a flow having a non-uniform variation in the stress distribution is generated at the downstream side of the pressure-receiving cylinder 11, a stress to be produced is averaged because of the integral effect relating to the lengthwise direction of the pressure-receiving cylinder 11. Accordingly, the variation in the stress distribution decreases, resulting in reduction of the power generation efficiency.

In this case, the pressure-receiving cylinder 11 may be divided into plural pieces in the direction of the center axis O (the vertical direction), and plural pressure-receiving-cylinder pieces may be arranged. This configuration suppresses a reduction of the output voltage due to averaging of the stress.

As explained above, plural stress producing members like the pieces of pressure-receiving cylinder 11 may be provided, but plural suppressing members and adders may be provided so as to correspond to respective plural stress producing members. In this case, when voltages output by the plural adders are further added, a larger output voltage can be obtained.

In each of the above-explained embodiments, a piezoelectric ceramic is used as the piezoelectric element, but a piezoelectric single crystal or a polymer piezoelectric material can be used as the piezoelectric element.

In each of the above-explained embodiments, the sensor module that obtains marine environment information and the power generating module that generates power by utilizing the flow of a fluid are separated pieces, but those modules may be a single piece. For example, when it is attempted to obtain an acoustic signal or the like as marine environment information, a piezoelectric ceramic is used as a conversion element that converts a sound pressure into a voltage. In this case, the piezoelectric ceramic structure used by the sensor module and the power generating module may be shared.

In this case, it is typical that the frequency range of vibration originating from a stress by a Karman vortex, etc., is low and the frequency range of a measurement signal is high. Accordingly, by filtering a voltage signal output by the piezoelectric ceramic structure, an acoustic signal as marine measurement information and a power-source voltage signal can be extracted separately.

Figure 52:
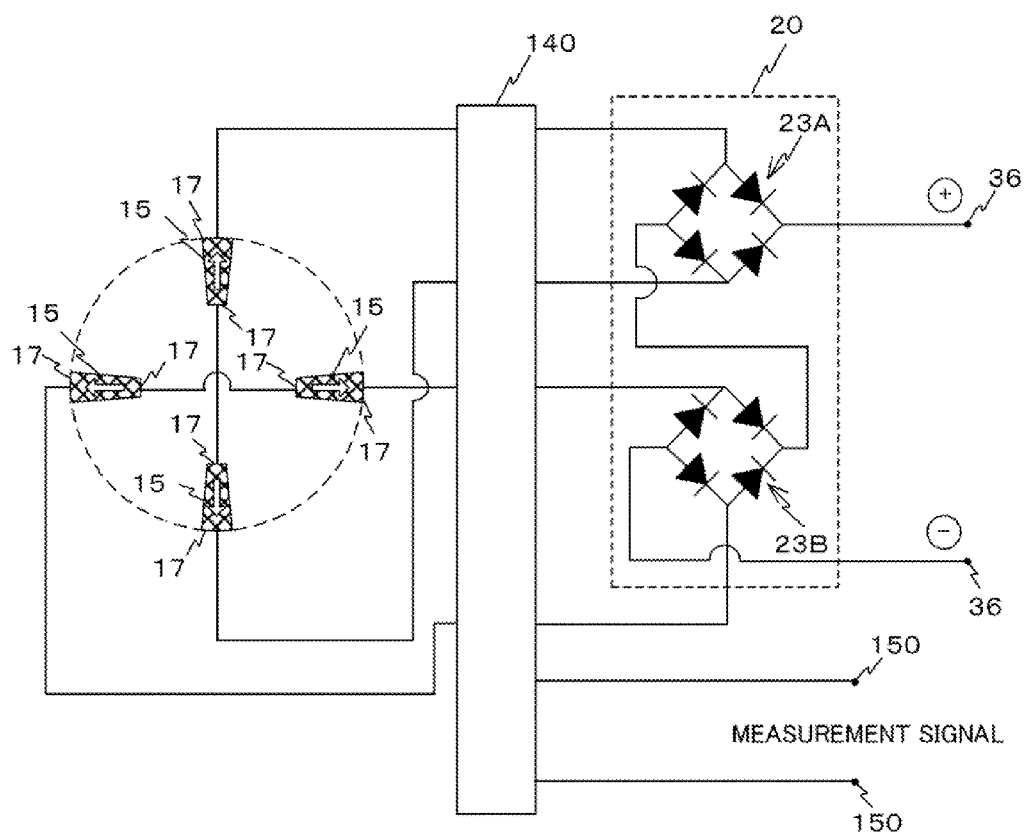
FIG. 52 is a circuit diagram of a power generating module that also functions as a sensor module.

FIG. 52 shows an illustrative circuit diagram of a power generating module integrated with a sensor module. According to this configuration, a filter 140 is provided at the forward stage of the power averaging unit 20. The filter 140 divides the voltage signal output by each piezoelectric ceramic module 15 into a component in a frequency range output to the power averaging unit 20 and used for power generation and a component in a frequency range used as a sensor output. The filter 140 outputs the component of the voltage signal used for power generation to the power averaging unit 20, and outputs the component of the voltage signal used as a sensor output across a measurement-signal output terminals 150.

Moreover, according to each of the above-explained embodiments, the sensor installed on an ocean bottom is explained. However, the present invention can be applied to a sensor floating in ocean or a moored sensor with a float which measures interlayer marine environments above an ocean bottom, i.e., a sensor installed in the ocean. Furthermore, as explained above, the present invention can also be applied to a sensor installed in the vicinity of a seacoast. It is needless to say that the present invention can be applied to lakes, etc.

The above-explained marine environment measuring sensor can be laid out and installed from a ship. Moreover, it is possible to lay out and install such a sensor by dropping it from an aircraft.

This application is the National Phase of PCT/JP2009/070429, filed Dec. 4, 2009, which is based on Japanese Patent Application No. 2008-310209 filed on Dec. 4, 2008. The whole specification, claims, and drawing of this application are herein incorporated by reference.

Industrial Applicability

The present invention can be applied to all fields, such as disaster prevention, disaster reduction, defensiveness, a fishery industry, marine development and a physical field. For example, data on a movement of an ocean bottom can be useful for disaster prevention, disaster reduction, and physics, and the like. Moreover, data on a water temperature distribution can be useful for a fishery industry, and the like. Furthermore, data on a sound speed distribution in water can be useful for defensiveness, a marine development, and the like.

DESCRIPTION OF REFERENCE NUMERALS 1, 1' Marine-environment-measuring-sensor net
2, 2' Marine environment measuring sensor
3 Signal transmitting cable
4, 4' Sensor module
5, 5', 5" Power generating module
6 Watertight container
7 Attachment seat
8 Container
9 Support pole
10 Container
11 Pressure-receiving cylinder
12 Piezoelectric ceramic structure
13 Waterproof cover
14 Hollow
15 Piezoelectric ceramic module
16 Piezoelectric ceramic
17 Electrode
20 Power averaging unit
23A, 23B Rectifier circuit
31, 32 Piezoelectric ceramic
33 Piezoelectric ceramic structure
34A Inner circumferential electrode
34B Outer circumferential electrode
35 Electrode divider
36 Load end
40 Power generating module
41 Support pole
42 Attachment seat 43 Pressure-receiving cylinder
44 Buffering member
45 Piezoelectric ceramic structure
46 Waterproof cover
47 Hollow
50 Power generating module
51 Support pole
52 Attachment seat
53 Piezoelectric ceramic structure
54 Buffering member
55 Waterproof cover
56 Hollow
60 Power generating module
61 Deadweight
62 Piezoelectric ceramic structure
63 Container
64 Hollow
65 Buffering member
66 Attachment seat
70 Power generating module
71 Pressure-receiving cylinder
72 Piezoelectric ceramic structure
73 Attachment seat
74 Piezoelectric element
75 Divided electrode
76 Electrode divider
77 Waterproof cover
78 Piezoelectric element
79 Insulator
80 Power generating module
81, 82 Cylinder
90 Marine-environment-measuring-sensor net
91, 92, 93, 94 Marine environment measuring sensor
95 Power feeding cable
100 Marine-environment-measuring-sensor net
101 Observation ship
110 Marine-environment-measuring-sensor net
140 Filter
150 Measurement-signal output terminal

The invention claimed is:

1. A power generator comprising:
a stress producing member formed in a columnar shape extending in a direction of a predetermined axis, having an outer circumferential side face that defines a contour of an orthogonal cross section to the predetermined axis rotationally symmetrical around the predetermined axis, and including a piezoelectric module structure comprising a plurality of piezoelectric modules arranged around the predetermined axis in a rotationally symmetrical manner, and producing a stress inside the stress producing member originating from a stress variation produced by a fluid around the stress producing member, the plurality of piezoelectric modules each including a pair of piezoelectric element and electrodes connected to both ends of the piezoelectric element in a polarization direction;
a suppressing member which is connected to one end of each of the plurality of piezoelectric modules in the polarization direction, and which suppresses a displacement of the stress producing member in order to cause the stress producing member to produce a stress; and
an adder that adds voltages output by the plurality of piezoelectric modules, respectively.

2. The power generator according to claim 1, wherein
the plurality of piezoelectric modules are arranged so as to face with each other around the predetermined axis, and respective polarization directions of the plurality of piezoelectric modules are directed in a radial direction with the predetermined axis being as a center.

3. The power generator according to claim 2, wherein
the suppressing member further includes a columnar body extending in the direction of the predetermined axis and having an outer circumferential side face that defines a contour of an orthogonal cross section to the predetermined axis rotationally symmetrical around the predetermined axis,
respective one ends of the plurality of piezoelectric modules in the polarization direction are connected to a part of the outer circumferential side face of the columnar body,
the stress producing member is connected to respective another ends of the plurality of piezoelectric modules in the polarization direction, and
the suppressing member restricts a displacement of the stress producing member inwardly of the radial direction.

4. The power generator according to claim 2, wherein
the suppressing member is a columnar body extending in the direction of the predetermined axis coaxially with the predetermined axis, and
respective one ends of the plurality of piezoelectric modules are connected to an outer circumferential side face of the suppressing member.

5. The power generator according to claim 4, wherein
the piezoelectric module structure is a cylindrical body extending in the direction of the predetermined axis coaxially with the predetermined axis and embedding the suppressing member in the piezoelectric module structure, and has an outer circumferential side face that defines a contour of an orthogonal cross section to the predetermined axis rotationally symmetrical around the predetermined axis, and
the outer circumferential side face of the piezoelectric module structure forms the outer circumferential side face of the stress producing member.

6. The power generator according to claim 4, wherein the stress producing member further includes a columnar body which is in a cylindrical shape extending in the direction of the predetermined axis coaxially with the predetermined axis and embedding the suppressing member and the piezoelectric module structure inside the columnar body, and has an outer circumferential side face and an inner circumferential side face which define a contour of an orthogonal cross section to the predetermined axis rotationally symmetrical around the predetermined axis, the inner circumferential side face being connected to respective another ends in the polarization direction of the plurality of piezoelectric modules.

7. The power generator according to claim 6, wherein, regarding the predetermined axis, a ratio of a length of the columnar body and a length of a portion where the columnar member and the piezoelectric module structure are connected together is equal to or larger than a predetermined ratio.

8. The power generator according to claim 2, wherein the suppressing member is a deadweight with a mass equal to or heavier than a predetermined value.

9. The power generator according to claim 2, wherein respective polarization directions of the plurality of piezoelectric modules are directed in either one direction inwardly of or outwardly of a radial direction with the predetermined axis being as a center.

10. The power generator according to claim 1, wherein
the plurality of piezoelectric modules are arranged so as to face with each other around the predetermined axis, respective polarization directions of the plurality of piezoelectric modules are in the direction of the predetermined axis, the stress producing member further includes a columnar body extending in the direction of the predetermined axis with a contour of an orthogonal cross section being rotationally symmetrical around the predetermined axis, and the columnar body and the fixed suppressing member are connected together in the direction of the predetermined axis via the piezoelectric module structure so that the columnar body and the piezoelectric module structure form a cantilever beam.

11. The power generator according to claim 10 being set so that a frequency of vibration produced by a stress variation originating from a Karman vortex generated by a fluid around the power generator matches a resonant frequency of the cantilever beam.

12. The power generator according to claim 10 wherein respective polarization directions of the plurality of piezoelectric modules are directed in one direction.

13. The power generator according to claim 1, wherein
a pair of piezoelectric modules arranged so as to face with each other around the predetermined axis are connected in a cascade connection manner by connecting electrodes at the same side in the polarization direction, the adder includes a plurality of rectifier circuits each of which performs full-wave rectification on a current generated by a voltage across both ends of the pair of piezoelectric modules connected in a cascade connection manner and each of which is provided for each pair of piezoelectric modules, the plurality of rectifier circuits are connected in a cascade connection manner, and a voltage across forward-rearward stages of the rectifier circuits connected in a cascade connection manner is output as an output voltage, thereby adding a voltage generated across both ends of the pair of piezoelectric modules.

14. The power generator according to claim 1, wherein the piezoelectric element is a trapezoidal or rectangular single piezoelectric element or a piezoelectric element stacked in the polarization direction.

15. A fluid sensor comprising:
the power generator according to claim 1; and
a sensor module that performs sensing in a fluid using power supplied from the power generator.

16. A fluid sensor net comprising the plurality of fluid sensors according to claim 15.

17. The fluid sensor net according to claim 16, wherein
each of the fluid sensors adds local measurement information to measurement information transmitted from another fluid sensor, and transmits the added information to the other fluid sensor, and transmission is carried out using power supplied from the power generator.

18. The fluid sensor net according to claim 17, wherein
one of the plurality of fluid sensors:
collects pieces of measurement information from the remaining fluid sensors;
has a pinger function that periodically emits an acoustic signal including the collected measurement information or a responder function that emits an acoustic signal including the collected measurement information in response to an external request, and the pinger function or the responder function is driven by power supplied from the power generator.

19. The fluid sensor net according to claim 16, wherein
each of the fluid sensors has a pinger function that periodically emits an acoustic signal including measurement information, a responder function that emits an acoustic signal including measurement information in response to an external request, or a relay function that relays measurement information emitted from another fluid sensor, and the pinger function, the responder function or the relay function is driven by power supplied from the power generator.

20. A fluid sensor net comprising:
the power generator according to claim 1; and
a plurality of fluid sensors that perform sensing in a fluid using power supplied from the power generator.

* * * * *